United States Patent
Kondo

(10) Patent No.: US 10,079,473 B2
(45) Date of Patent: Sep. 18, 2018

(54) LIGHT-EMITTING COMPONENT AND LIGHT-EMITTING DEVICE

(71) Applicant: FUJI XEROX Co., Ltd., Tokyo (JP)

(72) Inventor: Takashi Kondo, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 15/625,202

(22) Filed: Jun. 16, 2017

(65) Prior Publication Data

US 2018/0006432 A1 Jan. 4, 2018

(30) Foreign Application Priority Data

Jun. 30, 2016 (JP) .................. 2016-129755

(51) Int. Cl.
| | |
|---|---|
| H01S 5/00 | (2006.01) |
| H01S 5/068 | (2006.01) |
| H01S 5/042 | (2006.01) |
| H01S 5/30 | (2006.01) |
| H01S 5/40 | (2006.01) |
| H01S 5/183 | (2006.01) |
| H01S 5/42 | (2006.01) |
| H01S 5/32 | (2006.01) |
| H01S 5/323 | (2006.01) |

(52) U.S. Cl.
CPC .......... *H01S 5/06817* (2013.01); *H01S 5/042* (2013.01); *H01S 5/068* (2013.01); *H01S 5/06825* (2013.01); *H01S 5/183* (2013.01); *H01S 5/3013* (2013.01); *H01S 5/3095* (2013.01); *H01S 5/4025* (2013.01); *H01S 5/32* (2013.01); *H01S 5/323* (2013.01); *H01S 5/42* (2013.01)

(58) Field of Classification Search
CPC ...... H01S 5/042; H01S 5/3013; H01S 5/4025; H01S 5/183; H01S 5/06817; H01S 5/068; H01S 5/06825; H01S 5/42; H01S 5/3095; H01S 5/323; H01S 5/32
See application file for complete search history.

(56) References Cited

U.S. PATENT DOCUMENTS

| | | | | |
|---|---|---|---|---|
| 5,451,977 A | * | 9/1995 | Kusuda ...................... | B41J 2/45 257/21 |
| 2005/0008050 A1 | * | 1/2005 | Fischer .................. | H01S 5/042 372/38.1 |
| 2009/0297223 A1 | * | 12/2009 | Suzuki ................ | G03G 15/326 399/221 |

FOREIGN PATENT DOCUMENTS

| | | |
|---|---|---|
| JP | 01-238962 A | 9/1989 |
| JP | 2001-308385 A | 11/2001 |
| JP | 2009-286048 A | 12/2009 |

\* cited by examiner

*Primary Examiner* — Kinam Park
(74) *Attorney, Agent, or Firm* — Sughrue Mion, PLLC

(57) ABSTRACT

A light-emitting component includes laser elements and a setting unit. Each laser element is set to be in an on state with a logical value "m (m represents an integer of 1 or more)", an on state considered as having a logical value "0", or an off state. The setting unit sets the laser element to be in a state ready to transition to an on state and sets the laser element in the state ready to transition to the on state to be in the on state considered as having a logical value "0" before a timing of setting the laser element to the on state with a logical value "m".

15 Claims, 22 Drawing Sheets

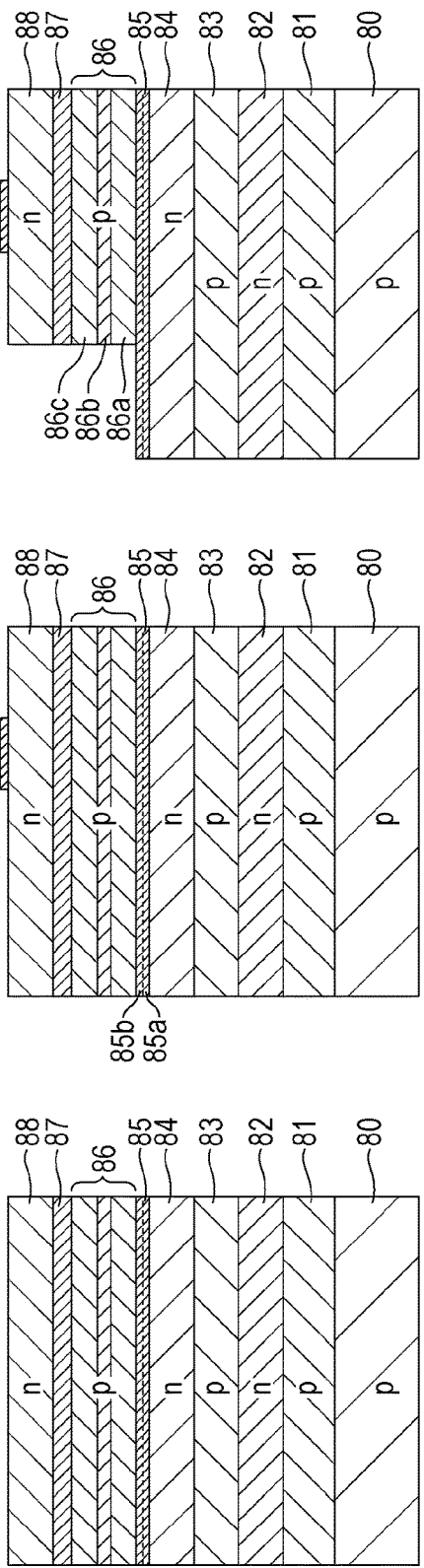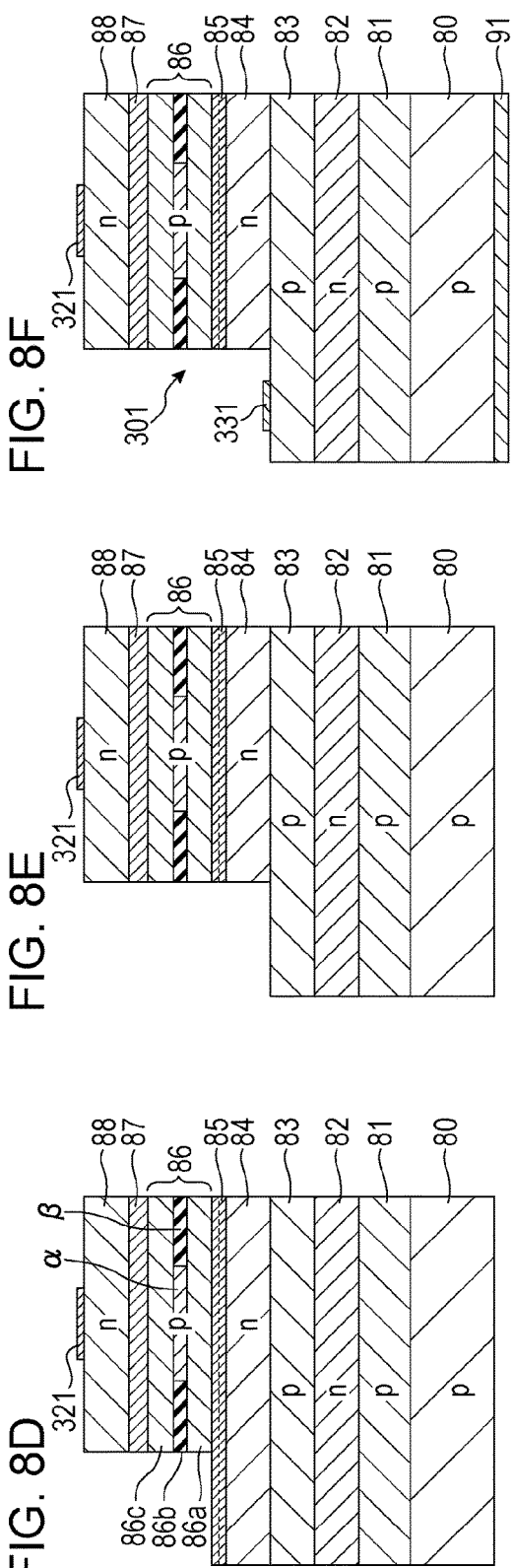

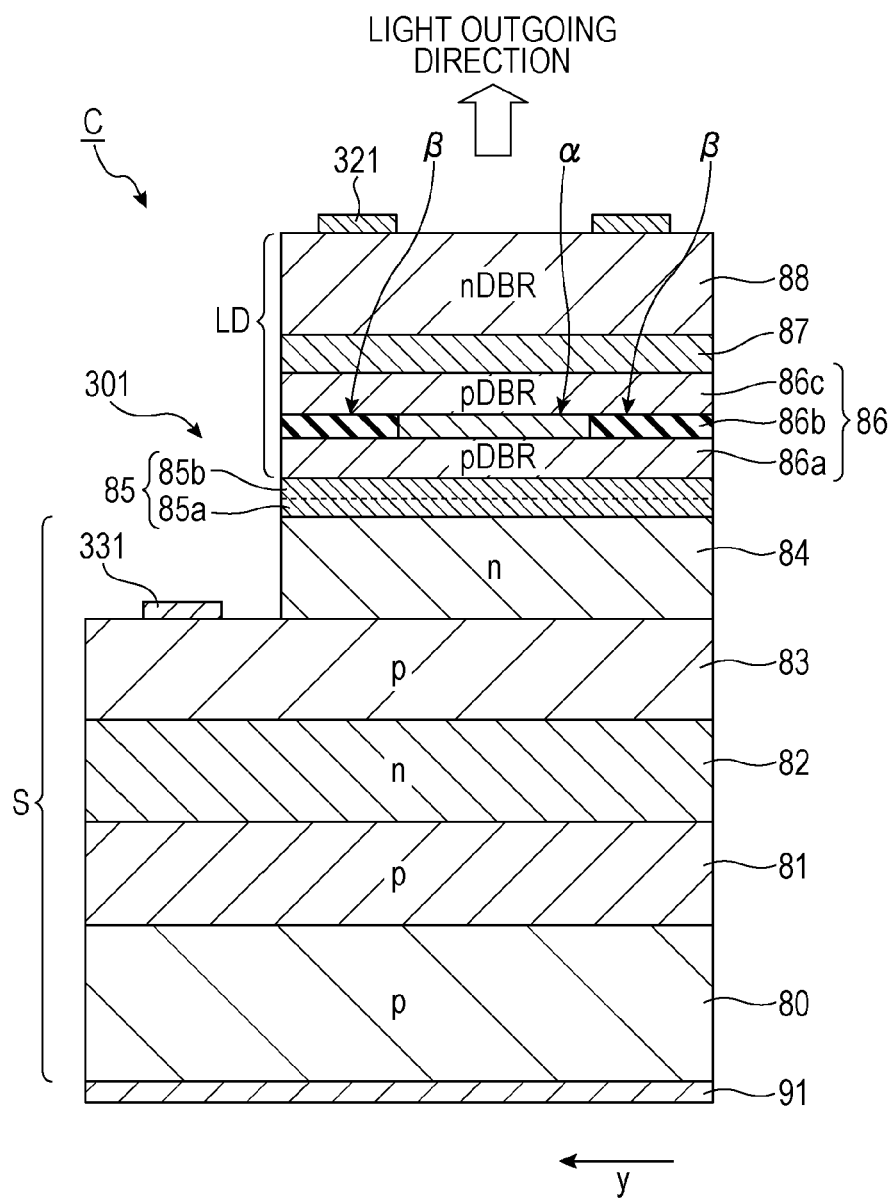

LIGHT-EMITTING COMPONENT AND LIGHT-EMITTING DEVICE

CROSS-REFERENCE TO RELATED APPLICATIONS

This application is based on and claims priority under 35 USC 119 from Japanese Patent Application No. 2016-129755 filed Jun. 30, 2016.

BACKGROUND

Technical Field

The present invention relates to a light-emitting component and a light-emitting device.

SUMMARY

According to an aspect of the invention, there is provided a light-emitting component that includes plural laser elements, each laser element being set to be in an on state with a logical value "m (m represents an integer of 1 or more)", an on state considered as having a logical value "0", or an off state; and a setting unit that sets the laser element to be in a state ready to transition to an on state and sets the laser element in the state ready to transition to the on state to be in the on state considered as having a logical value "0" before a timing of setting the laser element to the on state with a logical value "m".

BRIEF DESCRIPTION OF THE DRAWINGS

Exemplary embodiments of the present invention will be described in detail based on the following figures, wherein:

FIG. 4A is a schematic energy band diagram of the stacking structure that includes the control thyristor and the laser diode, FIG. 4B is an energy band diagram of a tunnel junction layer in a reverse bias state, and FIG. 4C illustrates a current-voltage characteristic of the tunnel junction layer;

FIGS. 8A to 8F illustrate a method for producing the light-emitting component, FIG. 8A illustrates a semiconductor stack forming step, FIG. 8B illustrates an n-ohmic electrode forming step, FIG. 8C illustrates an etching step for exposing the tunnel junction layer, FIG. 8D illustrates a step of forming a current block portion in a current confining layer, FIG. 8E illustrates an etching step for exposing a p-gate layer, and FIG. 8F illustrates a step of forming a p-ohmic electrode and a rear electrode;

FIG. 9A illustrates a bandgap of InNAs with respect to a InN composition ratio x, FIG. 9B illustrates a bandgap of InNSb with respect to the InN composition ratio x, and FIG. 9C illustrates lattice constants of group VI elements and group III-V compounds with respect to the bandgap;

FIG. 10 is an enlarged cross-sectional view of a laser diode and a control thyristor of another modification example of the light-emitting component according to the first exemplary embodiment;

DETAILED DESCRIPTION

Exemplary embodiments of the present invention will now be described in details with reference to the attached drawings. In the description below, atomic elements are referred to by element symbols, such as aluminum being referred to as Al.

First Exemplary Embodiment

Light-Emitting Device

Figure 1:
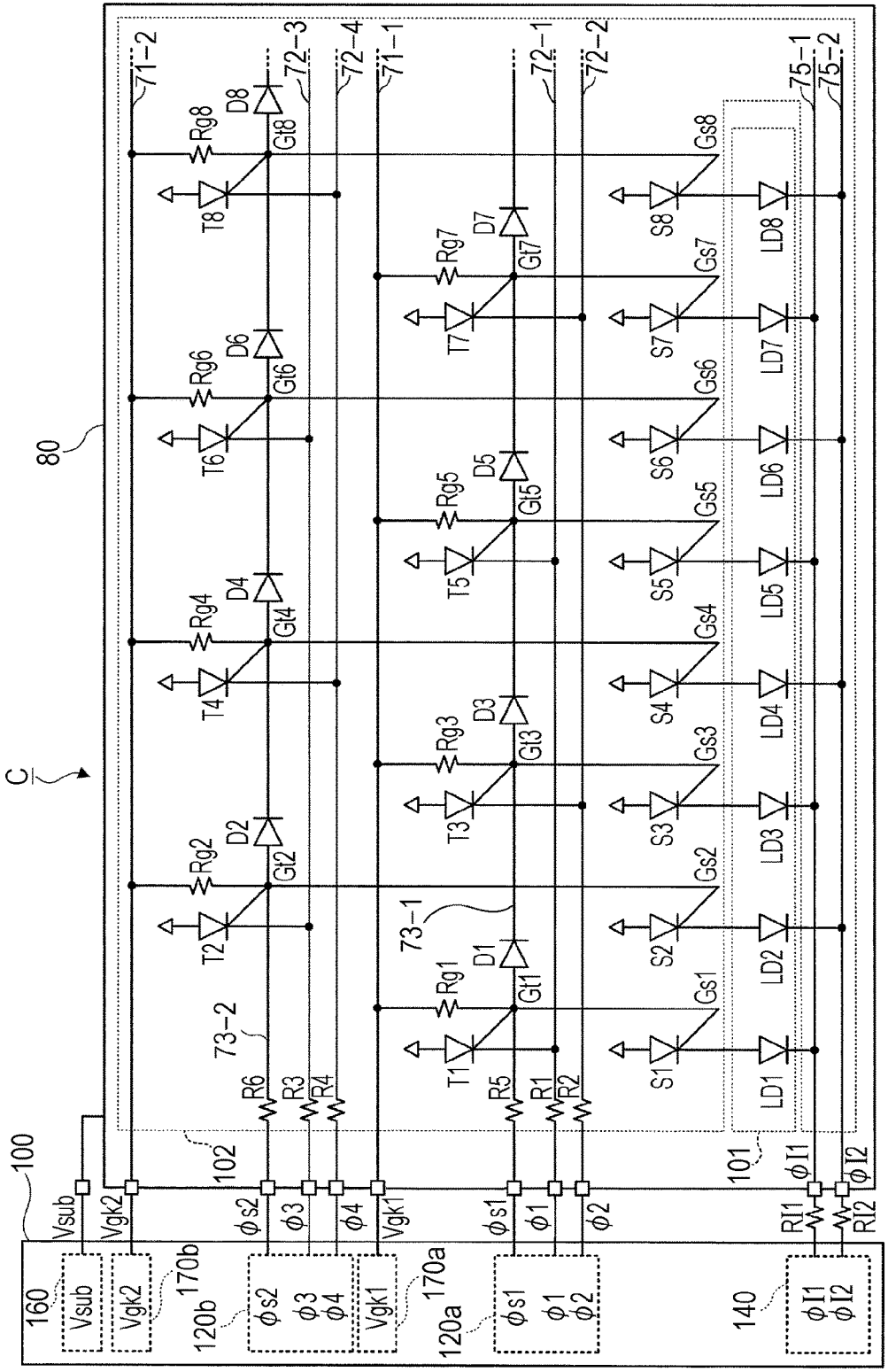
FIG. 1 is an equivalent circuit diagram illustrating a circuit configuration of a light-emitting device equipped with a self-scanning light-emitting element array (SLED) and a signal generation circuit according to a first exemplary embodiment.

FIG. 1 is an equivalent circuit diagram of a light-emitting device equipped with a self-scanning light-emitting element array (SLED) according to a first exemplary embodiment.

The light-emitting device includes a light-emitting component C and a signal generation circuit 100. The signal generation circuit 100 is one example of a drive unit that supplies signals for driving the light-emitting component C.

Light-Emitting Component C

The light-emitting component C is configured as an integrated circuit chip that includes a substrate 80 formed of GaAs or the like and compound semiconductor layers of GaAs, GaAlAs, AlAs, and the like monolithically (epitaxially) stacked on the substrate 80. In the drawing, a Vsub terminal, which is disposed on a rear side of the substrate 80 of the light-emitting component C, is illustrated as being outside the substrate 80.

The light-emitting component C will now be described in relation to the signal generation circuit 100.

The light-emitting component C includes a light-emitting element array that includes laser diodes LD1, LD2, LD3, . . . (when individual laser diodes are not distinguished, they are referred to as laser diodes LD), and control thyristors S1, S2, S3, . . . (when individual thyristors are not distinguished, they are referred to as control thyristors S).

The laser diodes LD1, LD2, LD3, . . . are respectively stacked on the control thyristors S1, S2, S3, . . . aligned in a row on the substrate 80 such that a control thyristor S and a laser diode LD thereon have the same number and are connected in series (refer to FIG. 2B and FIG. 3 described below). When there are 128 laser diodes LD, for example, there are an equal number, 128, of control thyristors S.

The laser diodes LD are one example of the laser element.

The light-emitting component C includes transfer thyristors T1, T2, T3, . . . (when individual thyristors are not distinguished, they are referred to as transfer thyristors T) aligned in a row as with the laser diodes LD1, LD2, LD3, . . . , and the control thyristors S1, S2, S3, . . . . One transfer thyristor T is provided for each laser diode LD, and thus there are as many transfer thyristors T as the laser diodes LD. For example, there are 128 transfer thyristors T.

Although the transfer thyristors T are used as one example of transfer elements in the description, any other circuit elements that can sequentially be turned to an on state may be used as the transfer elements. Examples thereof include a shift register and a circuit element formed of multiple transistors.

The light-emitting component C also includes coupling diodes D1, D2, D3, . . . (when individual coupling diodes are not distinguished, they are referred to as coupling diodes D). The odd-numbered coupling diodes D1, D3, D5, . . . , are each provided between a pair of the odd-numbered transfer thyristors T1, T3, T5, . . . , paired sequentially in numerical order. The even-numbered coupling diodes D2, D4, D6, . . . are each provided between a pair of the even-numbered transfer thyristors T2, T4, T6, . . . , paired sequentially in numerical order. For example, there are 126 coupling diodes D when there are 128 laser diodes LD.

The light-emitting component C also includes power supply wire resistors Rg1, Rg2, Rg3, . . . (when individual resistors are not distinguished, they are referred to as power supply wire resistors Rg). There are as many power supply wire resistors Rg as the laser diodes LD, for example, there are 128 power supply wire resistors Rg.

In order to prevent flow of excessive current in transfer signal wires 72-1 to 72-4 (when individual transfer signal wires are not distinguished, they are referred to as transfer signal wires 72) through which transfer signals $\phi1$ to $\phi4$ described below are transmitted, the light-emitting component C includes current-limiting resistors R1 to R4 respectively for the transfer signal wires 72-1 to 72-4. In order to prevent flow of excessive current in start signal wires 73-1 and 73-2 (when individual start signal wires are not distinguished, they are referred to as start signal wires 73) through which start signals $\phi s1$ and $\phi s2$ described below are transmitted, the light-emitting component C also includes current-limiting resistors R5 and R6 respectively for the start signal wires 73-1 and 73-2. The current-limiting resistors R1 to R6 may be referred to as current-limiting resistors R.

Here, the transfer thyristors T1, T2, T3, . . . , the control thyristors S1, S2, S3, . . . , the power supply wire resistors Rg1, Rg2, Rg3, . . . , the coupling diodes D1, D2, D3, . . . , the current-limiting resistors R1 to R6, the transfer signal wires 72-1 to 72-4, the start signal wires 73-1 and 73-2, lighting signal wires 75-1 and 75-2 described below, and other elements constitute a setting unit 102. The light-emitting element array that includes the laser diodes LD1, LD2, LD3, . . . constitutes a light-emitting unit 101.

The numbers of the laser diodes LD and other parts are not limited to one described above and may be any predetermined number. The number of the transfer thyristors T may be larger than the number of the laser diodes LD.

The laser diode LD is a two-terminal semiconductor element equipped with an anode terminal (anode) and a cathode terminal (cathode). The thyristor (control thyristor S or transfer thyristor T) is a three-terminal semiconductor element equipped with an anode terminal (anode), a gate terminal (gate), and a cathode terminal (cathode). The coupling diode D is a two-terminal semiconductor element equipped with an anode terminal (anode) and a cathode terminal (cathode).

As described below, the laser diodes LD, the thyristors (control thyristors S and transfer thyristors T), and the coupling diodes D are not necessarily equipped with the anode terminal, the gate terminal, and the cathode terminal configured as electrodes. Thus, in the description below, the word "terminal" may be omitted and put in parentheses.

The control thyristors S1, S2, S3, . . . are respectively equipped with gates Gs1, Gs2, Gs3, . . . (when individual gates are not distinguished, they are referred to as the gates Gs"). The transfer thyristors T1, T2, T3, . . . are respectively equipped with gates Gt1, Gt2, Gt3, . . . (when individual gates are not distinguished, they are referred to as the gates Gt).

Signal Generation Circuit 100

The signal generation circuit 100 will now be described. The signal generation circuit 100 includes transfer signal generation units 120a and 120b that generate a signal that sequentially sets the transfer thyristors T to an on state; a lighting signal generation unit 140 that generates a signal that turns the laser diodes LD to an on (lighted) state; a reference potential supplying unit 160 that supplies a reference potential (reference potential H (0 V) described below); and power supply potential supplying units 170a and 170b that supply power supply potentials (power supply potentials Vgk1 and Vgk2 described below) for driving.

The transfer signal generation unit 120a generates transfer signals $\phi1$ and $\phi2$ and a start signal $\phi s1$. The transfer signal generation unit 120b generates transfer signals φ3 and φ4 and a start signal φs2. In FIG. 1, in order to simplify the illustration, the transfer signal generation unit 120a and the transfer signal generation unit 120b are illustrated as separate units. When they are not individually distinguished, they may be referred to as the transfer signal generation units 120. When individual transfer signals φ1 to φ4 are not distinguished, they may be referred to as transfer signals φ.

The lighting signal generation unit 140 supplies lighting signals φI1 and φI2. When individual lighting signals φI1 and φI2 are not distinguished, they may be referred to as "φI".

The power supply potential supplying unit 170a supplies the power supply potential Vgk1. The power supply potential supplying unit 170b supplies the power supply potential Vgk2. In FIG. 1, in order to simplify the illustration, the power supply potential supplying units 170a and 170b are illustrated as separate units. When they are not individually distinguished, they may be referred to as the power supply potential supplying units 170. When individual power supply potentials Vgk1 and Vgk2 are not distinguished, they may be referred to as "Vgk".

Electrical Connections of Elements in Light-Emitting Component C

Next, electrical connections of elements in the light-emitting component C are described.

The anodes of the transfer thyristors T and the control thyristors S are connected to the substrate 80 of the light-emitting component C (anode common).

The reference potential Vsub is supplied from the reference potential supplying unit 160 to these anodes via a rear electrode 91 (refer to FIG. 2B described below), which serves as a Vsub terminal, disposed on the rear surface of the substrate 80.

This connection is a configuration when a p-type substrate 80 is used. When an n-type substrate is used, the polarity is reversed. When an intrinsic (i) substrate (semi-insulating or insulating substrate) to which no impurity is added is used, a terminal connected to the reference potential Vsub is disposed on the side in which the light-emitting unit 101 and the setting unit 102 are provided.

The anode of each laser diode LD is connected to the cathode of the control thyristor S of the same number.

The gate Gs of each control thyristor S is connected to the gate Gt of the transfer thyristor T of the same number.

Among the odd-numbered transfer thyristor T1, T3, T5, T7, . . . along a row of transfer thyristors T, the transfer thyristors T numbered 1+4×(n−1) (where n represents the number of the transfer thyristor T and is an integer of 1 or more; in FIG. 1, these are the transfer thyristors T1, T5, . . . ) have cathodes connected the transfer signal wire 72-1. The transfer signal wire 72-1 is connected to the φ1 terminal via the current-limiting resistor R1. The transfer signal φ1 is transmitted to the φ1 terminal from the transfer signal generation unit 120a.

Among the odd-numbered transfer thyristor T1, T3, T5, T7, . . . , the transfer thyristors T numbered 3+4×(n−1) (in FIG. 1, these are the transfer thyristors T3, T7, . . . ) have cathodes connected to the transfer signal wire 72-2. The transfer signal wire 72-2 is connected to the φ2 terminal via the current-limiting resistor R2. The transfer signal φ2 is transmitted to the φ2 terminal from the transfer signal generation unit 120a.

The gates Gt of the transfer thyristors T numbered 1+4×(n−1) (in FIG. 1, these are the transfer thyristors T1, T5, . . . ) are each connected to the anode of the coupling diode D of the same number. The cathodes of the coupling diodes D are connected to the gates Gt of the transfer thyristors T numbered 3+4×(n−1) (in FIG. 1, these are the transfer thyristors T3, T7, . . . ).

The anode of the gate Gt1 is connected to the φs1 terminal via the current-limiting resistor R5. The start signal φs1 is transmitted to the φs1 terminal from the transfer signal generation unit 120a.

Among the even-numbered transfer thyristors T2, T4, T6, T8, . . . along a row of transfer thyristors T, the transfer thyristors T numbered 2+4×(n−1) (where n represents the number of the transfer thyristor T and is an integer of 1 or more; in FIG. 1, these are the transfer thyristors T2, T6, . . . ) have cathodes connected to the transfer signal wire 72-3. The transfer signal wire 72-3 is connected to the φ3 terminal via the current-limiting resistor R3. The transfer signal φ3 is transmitted to the φ3 terminal from the transfer signal generation unit 120b.

Among the even-numbered transfer thyristors T2, T4, T6, T8, . . . , the transfer thyristors T numbered 4+4×(n−1) (in FIG. 1, these are the transfer thyristors T4, T8, . . . ) have cathodes connected to the transfer signal wire 72-4. The transfer signal wire 72-4 is connected to the φ4 terminal via the current-limiting resistor R4. The transfer signal φ4 is transmitted to the φ4 terminal from the transfer signal generation unit 120b.

The gates Gt of the transfer thyristors T numbered 2+4×(n−1) (in FIG. 1, these are the transfer thyristors T2, T6, . . . ) are each connected to the anode of the coupling diode D of the same number. The cathodes of the coupling diodes D are connected to the gates Gt of the transfer thyristors T numbered 4+4×(n−1) (in FIG. 1, these are the transfer thyristors T4, T8, . . . ).

The anode of the gate Gt2 is connected to the φs2 terminal via the current-limiting resistor R6. The start signal φs2 is transmitted to the φs2 terminal from the transfer signal generation unit 120b.

The gates Gt1, Gt3, Gt5, Gt7, . . . of the odd-numbered transfer thyristors T1, T3, T5, T7, . . . are each connected to the power supply wire 71-1 via the power supply wire resistor Rg of the same number. The power supply wire 71-1 is connected to the Vgk1 terminal. The power supply potential Vgk1 is transmitted to the Vgk1 terminal from the power supply potential supplying unit 170a.

The gates Gt2, Gt4, Gt6, Gt8, . . . of the even-numbered transfer thyristors T2, T4, T6, T8, . . . are each connected to the power supply wire 71-2 via the power supply wire resistor Rg of the same number. The power supply wire 71-2 is connected to the Vgk2 terminal. The power supply potential Vgk2 is transmitted to the Vgk2 terminal from the power supply potential supplying unit 170b.

The cathodes of the odd-numbered laser diodes LD1, LD3, LD5, LD7, . . . are connected to the φI1 terminal via the lighting signal wire 75-1. The lighting signal φI1 is supplied to the φI1 terminal from the lighting signal generation unit 140 via the current-limiting resistor RI1 disposed outside the light-emitting component C.

The cathodes of the even-numbered laser diodes LD2, LD4, LD6, LD8, . . . are connected to the φI2 terminal via the lighting signal wire 75-2. The lighting signal φI2 is supplied to the φI2 terminal from the lighting signal generation unit 140 via the current-limiting resistors R12 disposed outside the light-emitting component C.

When lighting signal wires 75-1 and 75-2 are not distinguished, they are referred to as the lighting signal wires 75.

The current-limiting resistors RI1 and RI2 may be disposed inside the light-emitting component C. The current-limiting resistors RI1 and RI2 may be referred to as current-limiting resistors RI.

As mentioned above, the light-emitting component C according to the first exemplary embodiment includes a group of odd-numbered laser diodes LD1, LD3, LD5, . . . (odd-numbered laser diode LD group) and a group of even-numbered laser diodes LD2, LD4, LD6, . . . (even-numbered laser diode LD group) that are independent from each other. The laser diodes LD are assembled in numerical order.

Planar Layout and Cross-Sectional Structure of Light-Emitting Component C

Figure 2A:
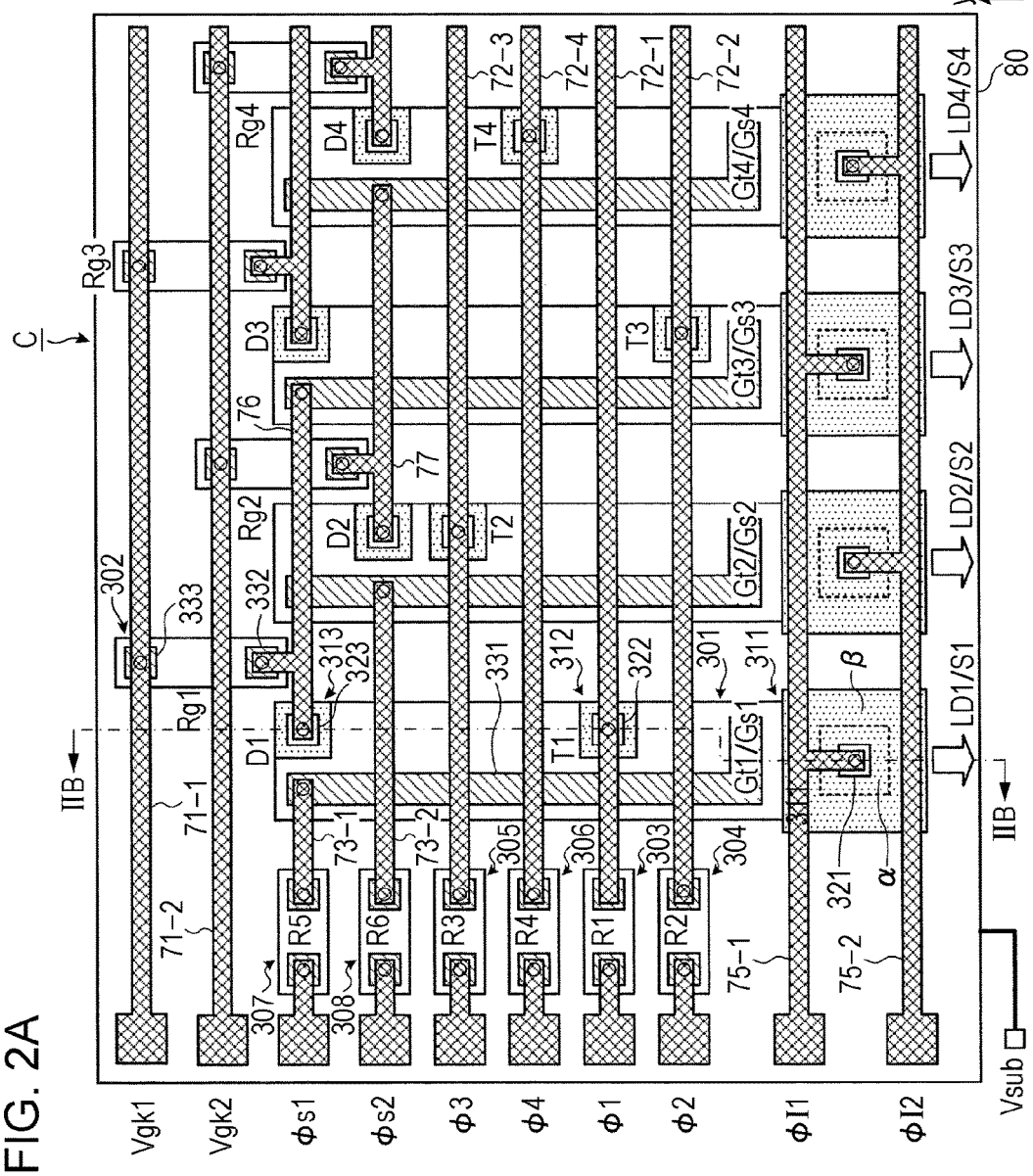
FIG. 2A is a planar layout diagram of a light-emitting component according to the first exemplary embodiment.
Figure 2B:
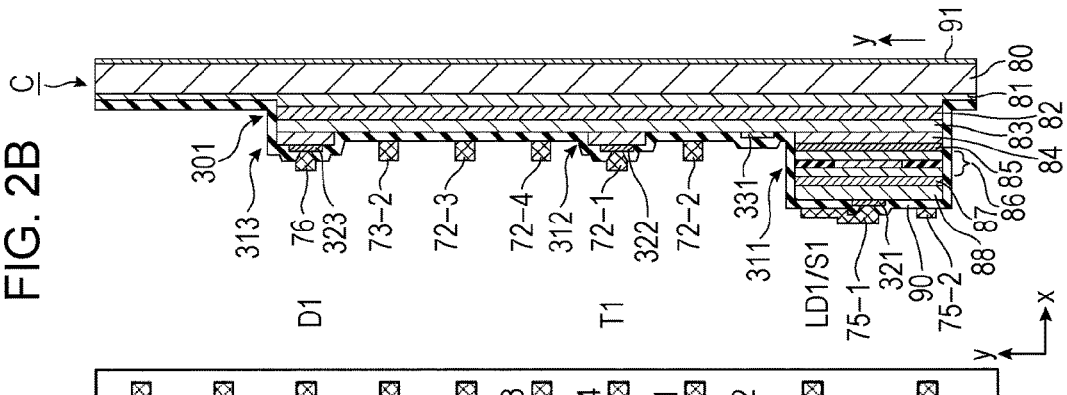
FIG. 2B is a cross-sectional view taken along line IIB-IIB in FIG. 2A.

FIGS. 2A and 2B are, respectively, examples of a planar layout and a cross-sectional view of the light-emitting component C according to the first exemplary embodiment. FIG. 2B is a cross-sectional view taken along IIB-IIB in FIG. 2A. The connection between the light-emitting component C and the signal generation circuit 100 is not illustrated in the drawings.

FIG. 2A illustrates a portion that includes the laser diodes LD1 to LD4, the control thyristors S1 to S4, and the transfer thyristors T1 to T4. The outgoing direction of light from the laser diodes LD is indicated by outlined arrows.

FIG. 2B, which is a cross-sectional view taken along line IIB-IIB in FIG. 2A, illustrates, in order from the lower portion of the drawing, the laser diode LD1/control thyristor S1, the transfer thyristor T1, and the coupling diode D1. The laser diode LD1 and the control thyristor S1 are stacked on top of each other.

Relevant elements and terminals are referred to by reference numerals and symbols in FIGS. 2A and 2B.

First, the cross-sectional structure of the light-emitting component C is described with reference to FIG. 2B.

A p-type anode layer 81 (p-anode layer 81) that functions as anodes of the control thyristors S and the transfer thyristors T, an n-type gate layer 82 (n-gate layer 82) that functions as a gate, a p-type gate layer 83 (p-gate layer 83) that functions as a gate, and an n-type cathode layer 84 (n-cathode layer 84) that functions as a cathode are sequentially stacked on a p-type substrate 80 (substrate 80). In the description below, the notations in parentheses are used. This also applies to other parts of the descriptions.

A tunnel junction (tunnel diode) layer 85 is disposed on the n-cathode layer 84.

A p-type anode layer 86 (p-(cladding) anode layer 86) that functions as a cladding layer of the laser diode LD, a light-emitting layer 87, and an n-type cathode layer 88 (n-(cladding) cathode layer 88) that also functions as a cladding layer are stacked on the tunnel junction layer 85.

As illustrated in FIG. 2B, the light-emitting component C includes a protection layer 90 composed of a light-transmitting insulating material. The protection layer 90 covers surfaces and side surfaces of islands (islands 301, 302, 303, . . . described below) that are isolated from one another. As illustrated in FIG. 2A, these islands are connected, via through holes formed in the protection layer 90 (in FIG. 2A, holes are indicated by circular marks), to the wires such as the power supply wires 71-1 and 71-2, the transfer signal wires 72-1, 72-2, 72-3, and 72-4, the start signal wires 73-1 and 73-2, and the lighting signal wires 75-1 and 75-2. In the description below, descriptions of the protection layer 90 and the through holes are omitted.

As illustrated in FIG. 2B, a rear electrode 91 that serves as a Vsub terminal is disposed on the rear surface of the substrate 80.

The p-anode layer 81, the n-gate layer 82, the p-gate layer 83, the n-cathode layer 84, the tunnel junction layer 85, the p-(cladding) anode layer 86, the light-emitting layer 87, and the n-(cladding) cathode layer 88 are each a semiconductor layer and are monolithically stacked by epitaxial growth. These semiconductor layers are etched (mesa etching) to form separate and isolated islands. The p-anode layer 81 may be isolated or not isolated. In FIG. 2B, the p-anode layer 81 is partly etched in the thickness direction.

The p-anode layer 81 may serve as the substrate 80.

The p-anode layer 81, the n-gate layer 82, the p-gate layer 83, and the n-cathode layer 84 constitute the control thyristors S, transfer thyristors T, coupling diodes D, power supply wire resistors Rg, and the like.

Here, the notations such as the p-anode layer 81, the n-gate layer 82, the p-gate layer 83, and the n-cathode layer 84 correspond to the functions (actions) that these layers have when constituting a control thyristor S or a transfer thyristor T. That is, in a control thyristor S or a transfer thyristor T, the p-anode layer 81 functions as an anode, the n-gate layer 82 and the p-gate layer 83 function as gates, and the n-cathode layer 84 functions as a cathode. In a coupling diode D or a power supply wire resistor Rg, these layers have different functions (actions) as described below.

The p-(cladding) anode layer 86, the light-emitting layer 87, and the n-(cladding) cathode layer 88 constitute a laser diode LD (in FIG. 2B, the laser diode LD1).

Similarly, the notations of the p-(cladding) anode layer 86 and the n-(cladding) cathode layer 88 correspond to the functions (actions) these layers have in a laser diode LD. In other words, the p-(cladding) anode layer 86 and the n-(cladding) cathode layer 88 function as claddings in a laser diode LD.

As described below, some of the islands may not include all of the p-anode layer 81, the n-gate layer 82, the p-gate layer 83, the n-cathode layer 84, the tunnel junction layer 85, the p-(cladding) anode layer 86, the light-emitting layer 87, and the n-(cladding) cathode layer 88. For example, the portion corresponding to the transfer thyristor T1 of the island 301 does not include the tunnel junction layer 85, the p-(cladding) anode layer 86, the light-emitting layer 87, or the n-(cladding) cathode layer 88.

Some of the islands may include only part of a layer. For example, the portion corresponding to the transfer thyristor T1 in the island 301 includes the n-cathode layer 84 but no n-cathode layer 84 is present near this portion.

Next, the planar layout of the light-emitting component C is described with reference to FIG. 2A.

The light-emitting component C includes an island 301 that includes the laser diode LD1, the control thyristor S1, the transfer thyristor T1, and the coupling diode D1; and an island 302 that includes the power supply wire resistor Rg1.

The light-emitting component C further includes multiple islands that are similar to the islands 301 and 302 and are aligned side-by-side. The islands similar to the island 301 respectively include the laser diodes LD2, LD3, LD4, . . . , the control thyristors S2, S3, S4, . . . , the transfer thyristors T2, T3, T4, . . . , and the coupling diodes D2, D3, D4, . . . The islands similar to the island 302 respectively include power supply wire resistors Rg2, Rg3, Rg4, . . .

The descriptions of these islands are omitted.

The light-emitting component C also includes islands 303 to 308 that respectively include the current-limiting resistors R1 to R6.

The islands 301 to 308 will now be described in detail with reference to FIGS. 2A and 2B.

As illustrated in FIGS. 2A and 2B, the control thyristor S1 in the island 301 includes the p-anode layer 81, the n-gate layer 82, the p-gate layer 83, and the n-cathode layer 84. A p-type ohmic electrode 331 (p-ohmic electrode 331) disposed on the p-gate layer 83 exposed by removing the n-cathode layer 88, the light-emitting layer 87, the p-anode layer 86, the tunnel junction layer 85, and the n-cathode layer 84 serves as a terminal (gate terminal Gs1) of the gate Gs1.

The laser diode LD1 includes the p-(cladding) anode layer 86, the light-emitting layer 87, and the n-(cladding) cathode layer 88. The laser diode LD1 is stacked on the tunnel junction layer 85 on the n-cathode layer 84 of the control thyristor S1. An n-type ohmic electrode 321 (n-ohmic electrode 321) disposed on the n-cathode layer 88 (region 311) serves as a cathode terminal.

The p-(cladding) anode layer 86 includes a current confining layer 86b (refer to FIG. 3 described below). The current confining layer 86b is formed to cause the current flowing in the laser diode LD to concentrate in the center portion of the laser diode LD. This is because the peripheral portion of the laser diode LD has many defects resulting from mesa-etching for forming islands, and thus non-radiative recombination easily occurs in this peripheral portion. Thus, the current confining layer 86b is formed to make the center portion a current pass portion (region) α in which the current smoothly flows and to make the peripheral portion a current block portion (region) β in which the electric current is inhibited from flowing. As illustrated in FIG. 2A, the inner side of the chain line in the laser diode LD1 is the current pass portion α, and the outer side of the chain line in the laser diode LD1 is the current block portion β.

The current confining layer 86b suppresses power consumed in the non-radiative recombination, and thus power consumption and light output efficiency are improved. The light output efficiency is the amount of light that can be output from the laser diode LD per unit power.

The current confining layer 86b is described in detail below.

As illustrated in FIGS. 2A and 2b, the transfer thyristor T1 of the island 301 includes the p-anode layer 81, the n-gate layer 82, the p-gate layer 83, and the n-cathode layer 84, as with the control thyristor S1. An n-ohmic electrode 322 disposed on the n-cathode layer 84 (region 312) exposed by removing the n-cathode layer 88, the light-emitting layer 87, the p-anode layer 86, and the tunnel junction layer 85 serves as a cathode terminal. The p-ohmic electrode 331 on the p-gate layer 83 exposed by removing the n-cathode layer 84 serves as a terminal (gate terminal Gt1) of the gate Gt1.

The coupling diode D1 of the island 301 includes the 83 and the n-cathode layer 84. An n-ohmic electrode 323 disposed on the n-cathode layer 84 (region 313) exposed by removing the n-cathode layer 88, the light-emitting layer 87, the p-anode layer 86, and the tunnel junction layer 85 serves as a cathode terminal. A p-ohmic electrode 331 disposed on the p-gate layer 83 exposed by removing the n-cathode layer 84 serves as an anode terminal. The anode terminal of the coupling diode D1 is the same as the gate Gt1 (gate terminal Gt1) of the transfer thyristor T1 and the gate Gs1 (gate terminal Gs1) of the control thyristor S1.

Thus, in the description below, the p-ohmic electrode 331 is referred to as the gate Gs1/Gt1 (gate terminal Gs1/Gt1).

The power supply wire resistor Rg1 of the island 302 includes the p-gate layer 83. The p-gate layer 83 between the two p-ohmic electrodes 332 and 333 on the p-gate layer 83 exposed by removing the n-(cladding) cathode layer 88, the light-emitting layer 87, the p-(cladding) anode layer 86, the tunnel junction layer 85, and the n-cathode layer 84 serves as a resistor.

The current-limiting resistors R1 to R6 disposed on the islands 303 to 308 each use the p-gate layer 83 between two p-ohmic electrodes (no reference numeral) as a resistor as with the power supply wire resistor Rg1 of the island 302.

FIG. 2A illustrates the connections between elements.

The lighting signal wire 75-1 is connected to the n-ohmic electrode 321, which serves as a cathode terminal of the laser diode LD1 of the island 301, and to the n-ohmic electrodes of the odd-numbered laser diodes of the islands similar to the island 301. The lighting signal wire 75-1 is connected to the φI1 terminal.

The lighting signal wire 75-2 is connected to the n-ohmic electrodes, which serve as cathode terminals of the even-numbered laser diodes of the islands similar to the island 301. The lighting signal wire 75-2 is connected to the φI2 terminal.

The transfer signal wire 72-1 is connected to the n-ohmic electrodes that serve as the cathode terminals of the transfer thyristors T numbered 1+4×(n−1) of the islands similar to the island 301, including the n-ohmic electrode 323 that serves as the cathode terminal of the transfer thyristor T1 of the island 301. The transfer signal wire 72-1 is connected to the φ1 terminal via the current-limiting resistor R1.

The transfer signal wire 72-2 is connected to the n-ohmic electrodes that serve as the cathode terminals of the transfer thyristors T numbered 3+4×(n−1) of the islands similar to the island 301. The transfer signal wire 72-2 is connected to the φ2 terminal via the current-limiting resistor R2.

The transfer signal wire 72-3 is connected to the n-ohmic electrodes that serve as the cathode terminals of the transfer thyristors T numbered 2+4×(n−1) of the islands similar to the island 301. The transfer signal wire 72-3 is connected to the φ3 terminal via the current-limiting resistor R3.

The transfer signal wire 72-4 is connected to the n-ohmic electrodes that serve as the cathode terminals of the transfer thyristors T numbered 4+4×(n−1) of the islands similar to the island 301. The transfer signal wire 72-4 is connected to the φ4 terminal via the current-limiting resistor R4.

The start signal wire 73-1 is connected to the gate Gs1/Gt1 (p-ohmic electrode 331) of the island 301. The start signal wire 73-1 is connected to the φs1 terminal via the current-limiting resistor R5.

The start signal wire 73-2 is connected to the gate Gs2/Gt2 in the island similar to the island 301. The start signal wire 73-2 is connected to the φs2 terminal via the current-limiting resistor R6.

A connecting wire 76 connects the cathode terminal (n-ohmic electrode 323) of the coupling diode D1, the p-ohmic electrode 332 of the power supply wire resistor Rg1, and the gate Gt3/Gs3 to one another.

A connecting wire 77 connects the cathode terminal (n-ohmic electrode) of the coupling diode D2, the p-ohmic electrode of the power supply wire resistor Rg2, and the gate Gt4/Gs4 to one another.

Although the connecting wires 76 and 77 are described as examples, the light-emitting component C includes other connecting wires that establish similar connection relationships as those created by the connecting wires 76 and 77.

The planar layout of the light-emitting component C described above is merely an example. Any other planar layout may be employed.

Stacking Structure that Includes Control Thyristor S and Laser Diode LD

Figure 3:
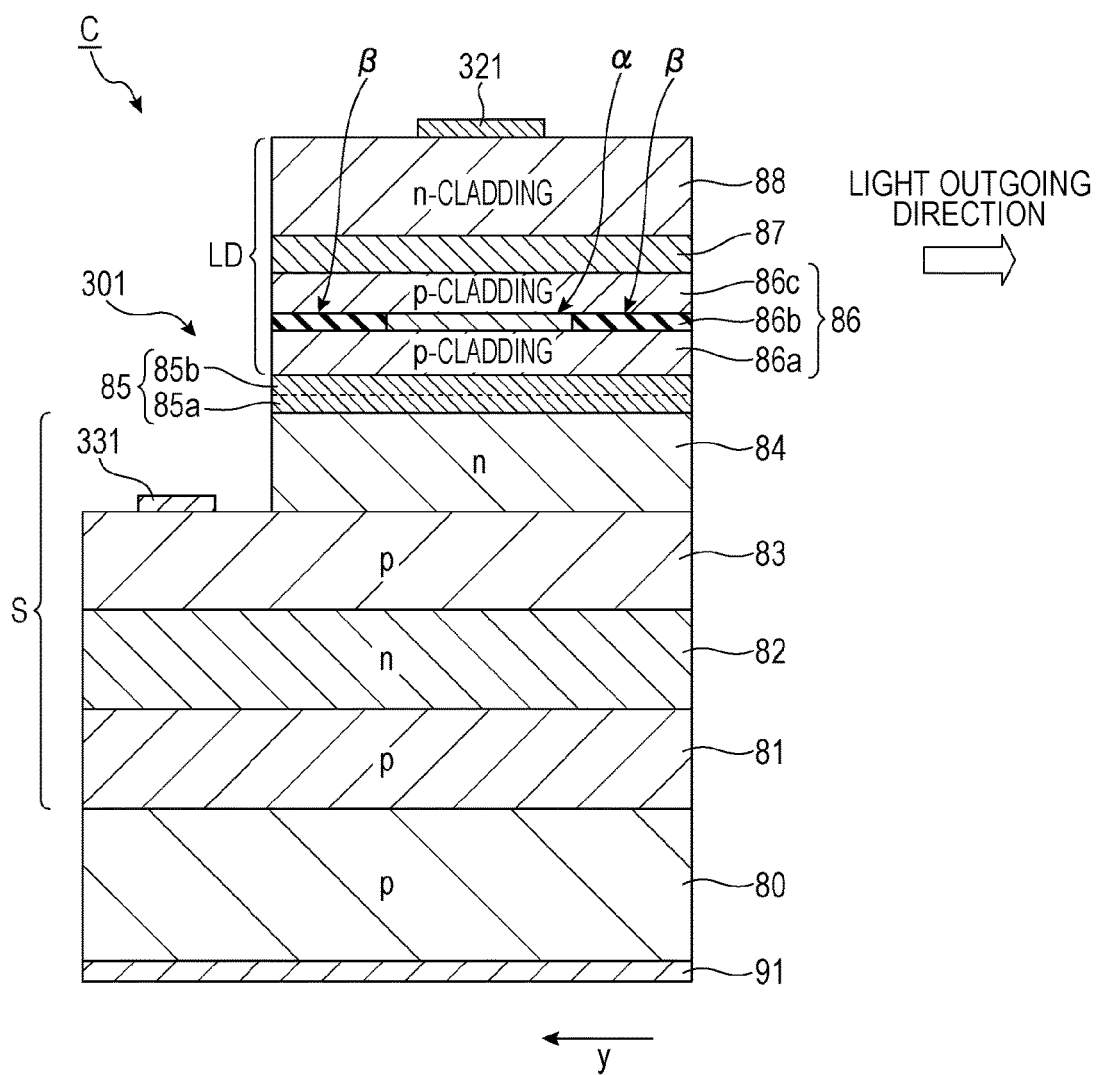
FIG. 3 is an enlarged cross-sectional view of a laser diode and a control thyristor.

FIG. 3 is an enlarged cross-sectional view of the laser diode LD and the control thyristor S. The enlarged cross-sectional view of FIG. 3 is taken along line IIB-IIB in FIG. 2A. A portion of the cross-sectional view of FIG. 2B corresponding to the laser diode LD and the control thyristor S is illustrated in FIG. 3. The protection layer 90 is omitted from the illustration. The same applies hereinafter.

As mentioned above, the laser diode LD is stacked on the tunnel junction layer 85 on the control thyristor S. The control thyristor S and the laser diode LD are connected in series.

The control thyristor S includes the p-anode layer 81, the n-gate layer 82, the p-gate layer 83, and the n-cathode layer 84. In other words, the control thyristor S has a pnpn four-layer structure.

The tunnel junction layer 85 includes an $n^{++}$-layer 85a highly doped with an n-type impurity (dopant) and a $p^{++}$-layer 85b highly doped with a p-type impurity.

The laser diode LD includes the p-(cladding) anode layer 86, the light-emitting layer 87, and the n-(cladding) cathode layer 88. The light-emitting layer 87 has a quantum well structure in which well layers and barrier layers are alternately stacked. The light-emitting layer 87 may be an intrinsic (i) layer not doped with any impurity.

In FIG. 3, the p-(cladding) anode layer is referred to as the p-cladding, and the n-(cladding) cathode layer is referred to as the n-cladding. The same applies hereinafter.

The p-(cladding) anode layer 86 includes a lower p-(cladding) anode layer 86a, the current confining layer 86b, and an upper p-(cladding) anode layer 86c stacked on top of each other. The current confining layer 86b includes the current pass portion α and the current block portion β. As illustrated in FIG. 2A, the current pass portion α lies in the center portion of the laser diode LD, and the current block portion β lies in the peripheral portion of the laser diode LD.

The p-(cladding) anode layer 86 and the n-(cladding) cathode layer 88 are layers that have a smaller refractive index than the light-emitting layer 87. The light emitted from the light-emitting layer 87 is reflected at the interfaces between the light-emitting layer 87 and the p-(cladding) anode layer 86 and between the light-emitting layer 87 and the n-(cladding) cathode layer 88 so as to confine the light within the light-emitting layer 87. The light is resonated in a resonator constituted by the portion that lies between the side surfaces of the light-emitting layer 87, resulting in lasing. Thus, the light goes out in a direction parallel to the light-emitting layer 87 (in FIG. 3, the -y direction). The light-emitting layer 87 may also be referred to as an active layer.

Tunnel Junction Layer 85

Figure 4A:
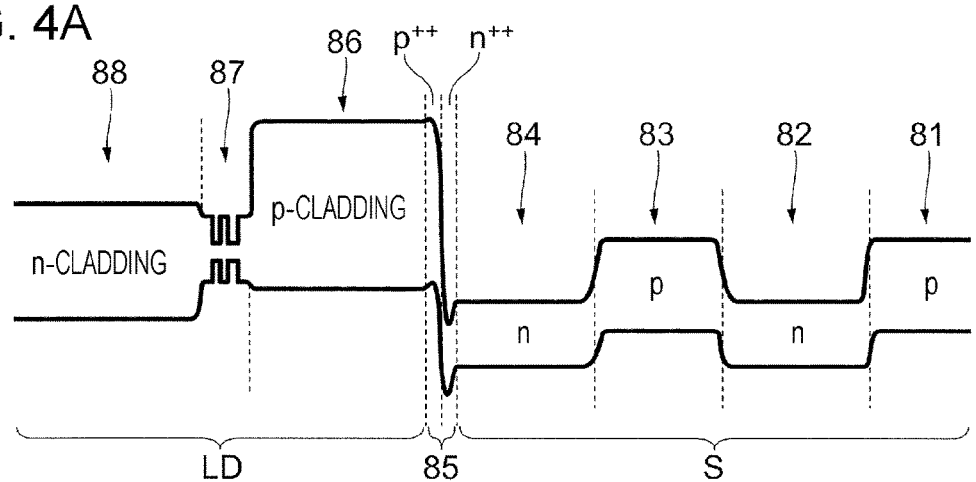
FIGS. 4A to 4C illustrate a stacking structure that includes a control thyristor and a laser diode.
Figure 4B:
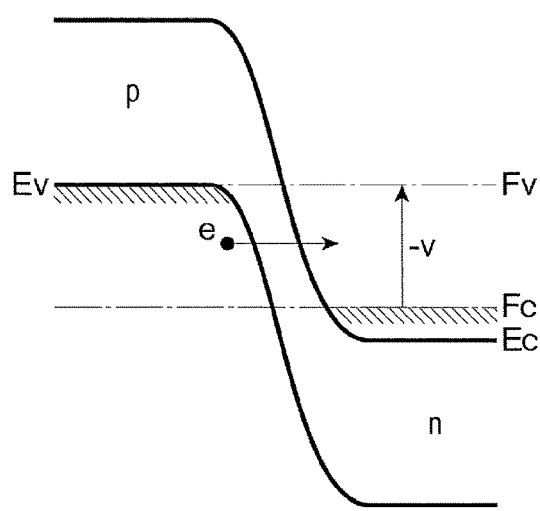
Figure 4C:
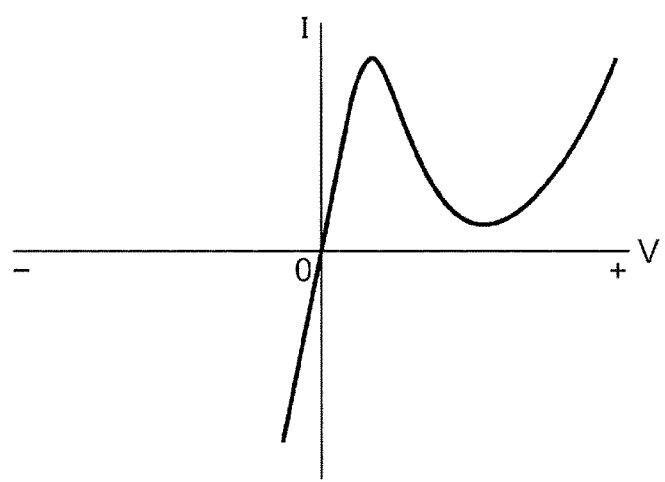

FIGS. 4A to 4C are diagrams that further describe the stacking structure that includes the control thyristor S and the laser diode LD. FIG. 4A is a schematic energy band diagram in the stacking structure that includes the control thyristor S and the laser diode LD; FIG. 4B is an energy band diagram of the tunnel junction layer 85 in a reversed bias state; and FIG. 4C illustrates a current-voltage characteristic of the tunnel junction layer 85.

As illustrated in the energy band diagram of FIG. 4A, when a voltage is applied between the n-ohmic electrode 321 and the rear electrode 91 illustrated in FIG. 3 so that the laser diode LD and the control thyristor S are forward-biased, the portion between the $n^{++}$-layer 85a and the $p^{++}$-layer 85b of the tunnel junction layer 85 is reverse-biased.

The tunnel junction layer 85 (tunnel junction) is a junction between the $n^{++}$-layer 85a highly doped with an n-type impurity and the $p^{++}$-layer 85b highly doped with a p-type impurity. Thus, the width of the depletion region is small, and when a forward bias (+V) is applied, electrons tunnel from the conduction band on the $n^{++}$-layer 85a side to the valence band on the $p^{++}$-layer 85b side. During this process, a negative resistance characteristic is displayed.

As illustrated in FIG. 4B, when a reverse bias (-V) is applied to the tunnel junction layer 85 (tunnel junction), the potential Ev of the valence band on the $p^{++}$-layer 85b side becomes higher than the potential Ec of the conduction band on the $n^{++}$-layer 85a side. As a result, electrons tunnel from the valence band of the $p^{++}$-layer 85b to the conduction band of the $n^{++}$-layer 85a side. As the reverse bias voltage (-V) increases, electrons tunnel more easily. In other words, as illustrated in FIG. 4C, electric current flows smoothly in the tunnel junction layer 85 (tunnel junction) under a reverse bias.

Thus, as illustrated in FIG. 4A, when the control thyristor S is turned on, electric current flows between the control thyristor S and the laser diode LD although the tunnel junction layer 85 is reverse-biased. As a result, the laser diode LD emits light (lighted).

As described below, when the transfer thyristor T connected to the control thyristor S is turned on to be in an on state, the control thyristor S turns to a state ready to transition to an on state (transition-ready state). Then when the lighting signal φI (lighting signal φI1 or lighting signal φI2) applied to the n-ohmic electrode 321 of the laser diode LD reaches a predetermined voltage, the control thyristor S is turned on to be in an on state and causes the laser diode LD to emit light. As such, the control thyristor S controls the laser diode LD, and thus named "control thyristor" in this specification.

Thyristor

Next, basic operations of the thyristors (transfer thyristors T and control thyristors S) are described. As described above, a thyristor is a three-terminal semiconductor element that includes an anode terminal (anode), a cathode terminal (cathode), and a gate terminal (gate). For example, a thyristor is formed by stacking p-type semiconductor layers (p-anode layer 81 and p-gate layer 83) and n-type semiconductor layers (n-gate layer 82 and n-cathode layer 84) of GaAs, GaAlAs, AlAs, or the like on the substrate 80. In other words, a thyristor has a pnpn structure. In the description below, the forward potential (diffusion potential) Vd of the pn junction formed between a p-type semiconductor layer and an n-type semiconductor layer is presumed to be 1.5 V as an example.

For example, the reference potential Vsub supplied to the rear electrode 91, which serves as the Vsub terminal (refer to FIGS. 2B and 3), is presumed to be a high-level potential (hereinafter, referred to as "H") and 0 V; and the power supply potential Vgk supplied to the Vgk1 and Vgk2 terminals is presumed to be a low-level potential (hereinafter referred to as "L") and -3.3 V.

The anode of the thyristor is at the reference potential Vsub ("H" (0 V)) supplied to the rear electrode 91.

Basic operations of the thyristors (transfer thyristor T and control thyristor S) will now be described with reference to FIG. 1.

A thyristor in an off state in which no current is flowing between the anode and the cathode transitions to an on state (is turned on) when a potential (a negative potential with a large absolute value) lower than the threshold voltage is applied to the cathode. The threshold voltage of the thyristor is the value obtained by subtracting the forward potential Vd (1.5 V) of the pn junction from the potential of the gate.

In the on state, the gates (gate Gs and gate Gt) of the thyristors are at potentials close to the potential of the anode. Since the anode is set at the reference potential Vsub ("H" (0 V)), the gate is presumed to be at 0 V ("H"). The cathode of the thyristor in the on state has a potential close to the potential obtained by subtracting the forward potential Vd (1.5 V) of the pn junction from the potential of the anode. Since the anode is set at the reference potential Vsub ("H" (0 V)), the cathode of the thyristor in the on state has a potential close to −1.5 V (a negative potential whose absolute value is larger than 1.5 V). The potential of the cathode is set in relation to the power supply that supplies the current to the thyristor in the on state.

The thyristor in the on state transitions to an off state (is turned off) when the potential of the cathode reaches a potential (a negative potential with a large absolute value, 0 V, or a positive potential) higher than the potential (potential close to −1.5 V described above) needed to maintain the on state.

When a potential (a negative potential with a large absolute value) lower than the potential needed to maintain the on state is continuously applied to the cathode of the thyristor in the on state and when current (maintaining current) capable of maintaining the on state is supplied, the thyristor maintains the on state.

The control thyristor S is stacked together with the laser diode LD and is connected to the laser diode LD in series. Thus, the voltage applied to the cathode (n-cathode layer 84) of the control thyristor S is the voltage obtained by dividing the potential of the lighting signal ϕI (lighting signal ϕI1 or lighting signal ϕI2) among the control thyristor S and the laser diode LD. Here, the voltage applied to the laser diode LD is presumed to be −1.5 V to −2.0 V for the purposes of description. It is also presumed that when the control thyristor S is in the off state, −3.3 V is applied to the control thyristor S. In other words, the lighting signal ϕI (lighting signal ϕI1 or lighting signal ϕI2) applied to light the laser diode LD is presumed to be −4.8 V to −5.3 V.

The quantity of light changes depending on the voltage applied to the laser diode LD.

For the sake of simplicity, the voltage applied to the control thyristor S is presumed to be −3.3 V in the description below. However, in actual cases, when the control thyristor S is turned on, most of the voltage is applied to the laser diode LD, current rapidly flows, and the intensity of the emission fluctuates greatly. Thus, the voltage of the lighting signal ϕI applied to the control thyristor S and the laser diode LD are to be optimized depending on the element configuration and system configuration.

Since the thyristor is formed of a semiconductor such as GaAs, emission may occur between the n-gate layer 82 and the p-gate layer 83 in the on state. The quantity of light (outgoing light) emitted from the thyristor is dependent on the area of the cathode and the current that flows between the cathode and the anode. Thus, when emission from the thyristor is not to be utilized, for example, the area of the cathode of the transfer thyristor T may be decreased or the light may be blocked by the electrode (for example, the n-ohmic electrode 323 of the transfer thyristor T1) to reduce outgoing light.

Laser Diode LD

Figure 5:
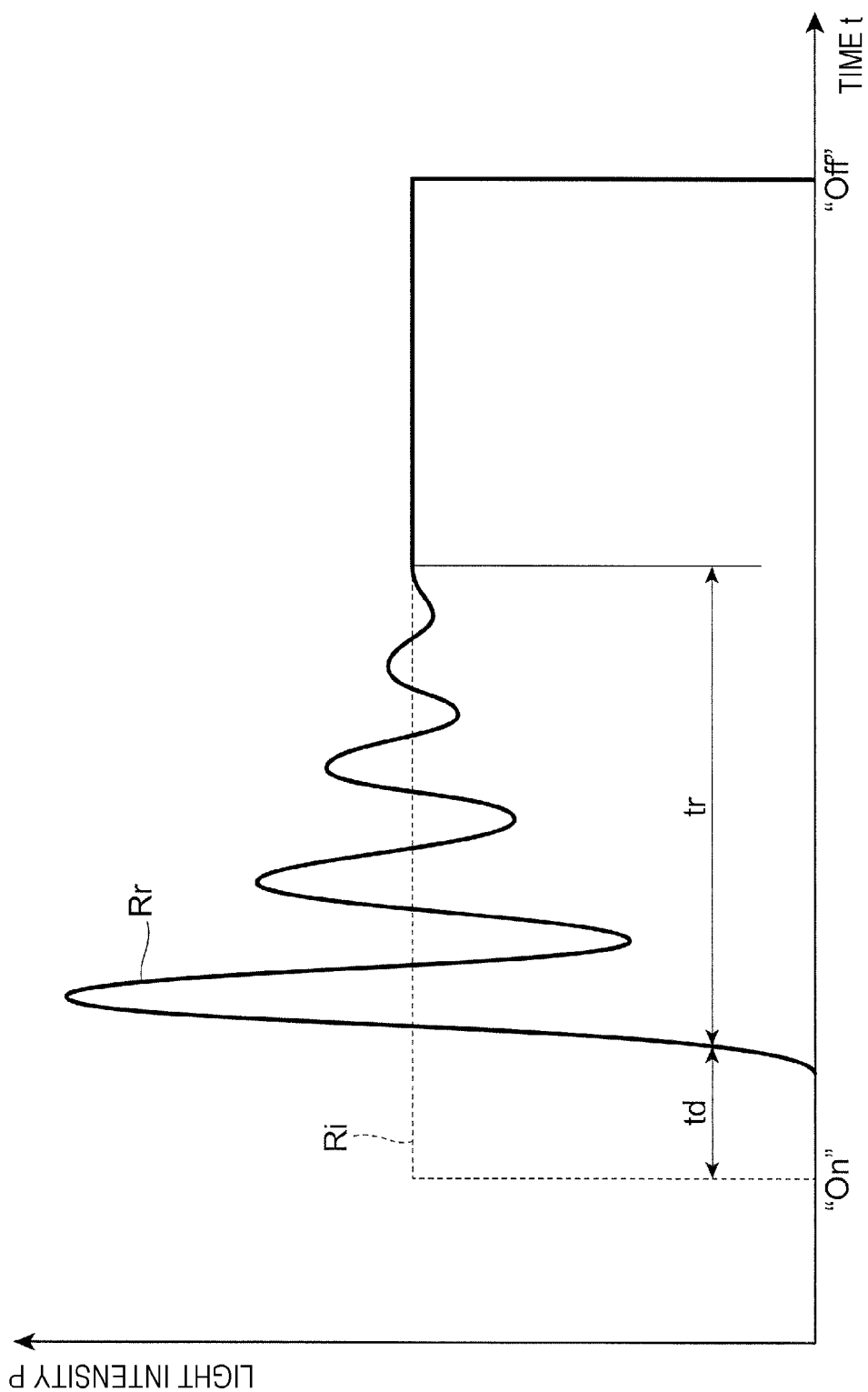
FIG. 5 is a graph illustrating changes in light intensity of the laser diode with respect to the time.

FIG. 5 is a graph illustrating changes in light intensity P of the laser diode LD with respect to the time. The vertical axis indicates the light intensity P and the horizontal axis indicates the time t. The light intensity is the radiant intensity.

Suppose that a voltage is applied to the laser diode LD at the "on" timing at the time t and that voltage application to the laser diode LD is stopped at the "off" timing. An ideal response waveform Ri during this period is one that maintains the predetermined light intensity P from the "on" timing to the "off" timing.

However, in actual cases, there is an oscillation delay time td after the "on" timing until the laser diode LD starts oscillation. Even after oscillation is started, relaxation oscillation occurs, during which the light intensity P fluctuates (refer to the relaxation oscillation waveform Rr). The relaxation oscillation continues for a relaxation oscillation duration time tr.

For example, the total time of the oscillation delay time td and the relaxation oscillation duration time tr is about 5 nsec. Thus, when the laser diodes LD to be lighted are sequentially turned from the off state to the on state, the laser diodes LD can rarely be switched at a speed of about 200 Mbps or faster. However, for high-speed switching, 1 Gbps is intended.

Thus, due to the oscillation delay and relaxation oscillation that occurs at the "on" timing, the light intensity P may fluctuate (vary), and the optical energy (radiation energy) obtained from the "on" timing to the "off" timing may fluctuate, for example.

Moreover, due to oscillation delay and relaxation oscillation, it is difficult to shorten the time period from the "on" timing to the "off" timing. In other words, high-speed optical switching is difficult to carry out.

However, after the relaxation oscillation duration time tr, the light intensity P shown by the relaxation oscillation waveform Rr no longer fluctuates. Then the light intensity P is set according to the current flowing in the laser diode LD.

In the first exemplary embodiment, the lighting signal ϕI (lighting signal ϕI1 or lighting signal ϕI2) is supplied in two stages. That is, assuming that the light intensity P is expressed by a logical value "0/1", a period in which the light intensity P is weak and is considered as (corresponds to) having a logical value "0" is provided before the light intensity P corresponding to the logical value "1" is reached. The logical value "0" corresponds to the off state of the laser diode LD.

Figure 6A:
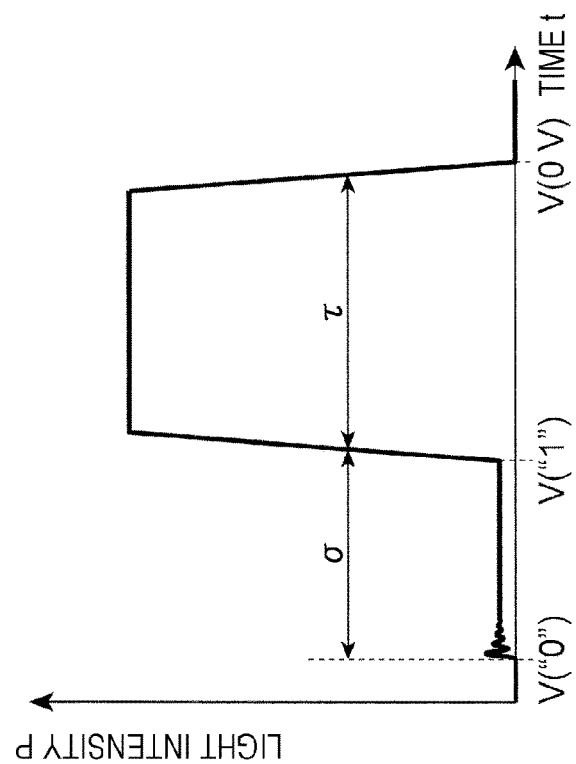
FIG. 6A is a graph illustrating the light intensity of the laser diode relative to current and FIG. 6B is a graph illustrating changes in light intensity relative to the time.
Figure 6B:
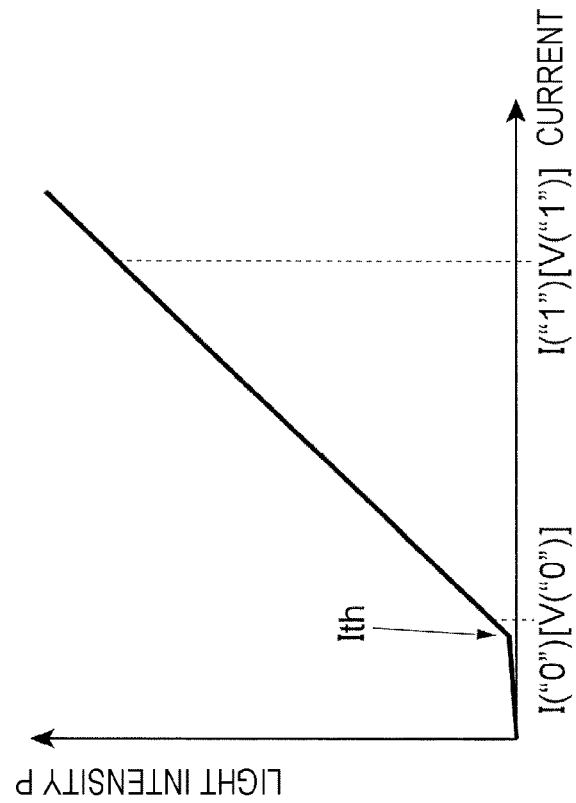

FIGS. 6A and 6B are graphs that illustrate the light intensity P of the laser diode LD. FIG. 6A illustrates the light intensity P relative to the current I; and FIG. 6B illustrates changes in light intensity P relative to the time t.

As illustrated in FIG. 6A, the laser diode LD starts oscillation when the current I exceeds the threshold current Ith. Thus it is presumed that, a current I("0"), which is larger than the threshold current Ith and at which the obtained light intensity P corresponds to a logical value "0", and a current I("1"), at which the light intensity P corresponds to a logical value "1", are to be supplied. Note that the voltage applied to the laser diode LD for the current I("0") is denoted as V("0"), and the voltage applied to the laser diode LD for the current I("1") is denoted as V("1"). For example, V("0") is 1.5 V and V("1") is 2.0 V.

Then as illustrated in FIG. 6B, the voltage applied to the laser diode LD is first set to V("0"), and oscillation is carried out (turned to an on state) in a logical value "0" state. Under this condition, oscillation delay and relaxation oscillation are allowed to occur. Then the voltage applied to the laser diode LD is changed to V("1") so as to create a logical value "1" state. Then the voltage applied to the laser diode LD is changed to 0 V ("H") so as to turn off the laser diode LD.

When a voltage V("1") is applied to the laser diode LD to which V("0") has been applied, a logical value "1" state is immediately created. Moreover, the period of the logical value "1" (the period τ in FIG. 6B) remains unaffected by oscillation delay and relaxation oscillation. Oscillation delay and relaxation oscillation are dealt with during the period σ, in which the logical value is "0", that precedes the period τ.

Operation of Light-Emitting Component C

Next, operation of the light-emitting component C is described.

Figure 7:
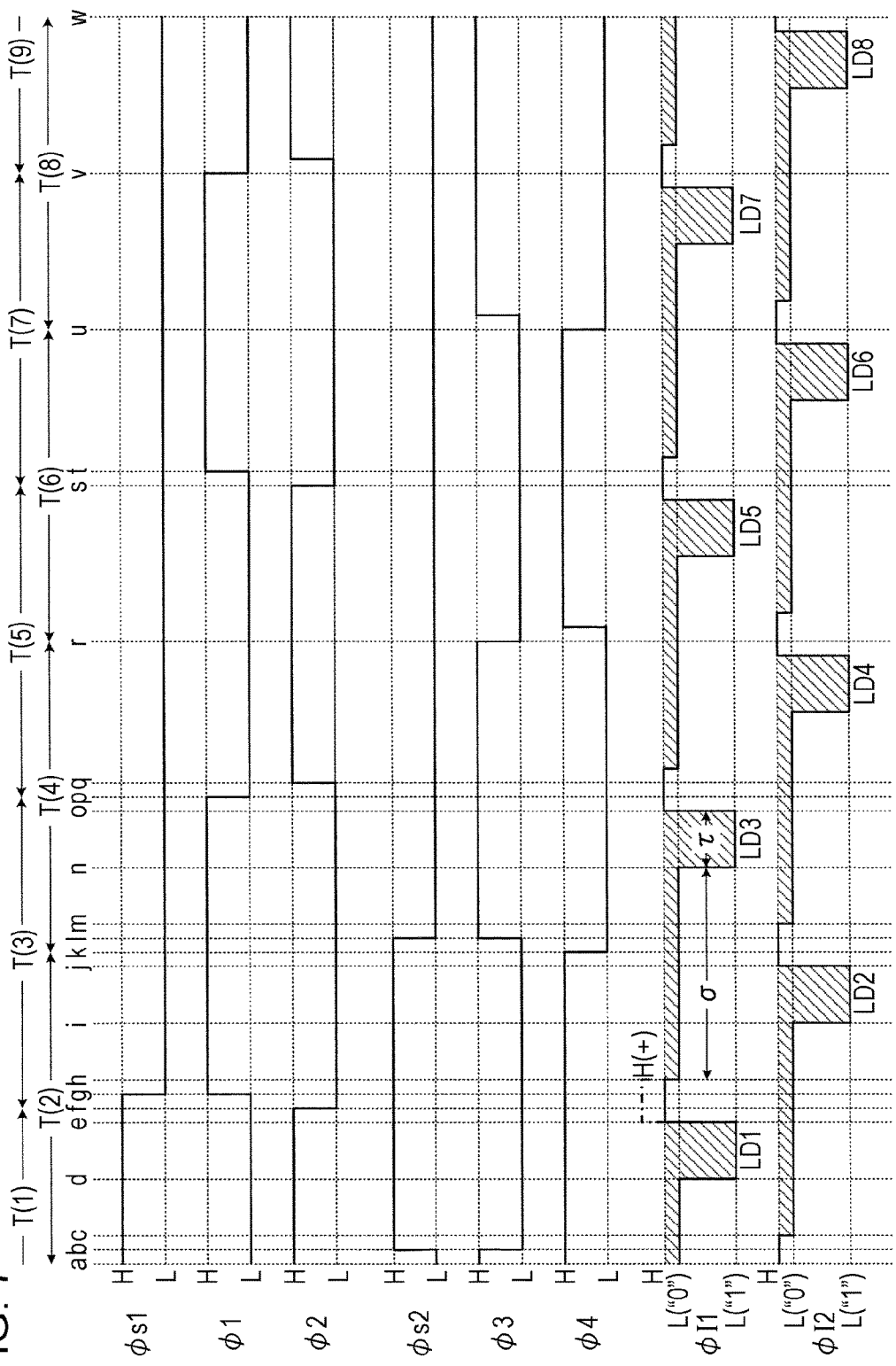
FIG. 7 is a timing chart illustrating operation of the light-emitting component according to the first exemplary embodiment.

FIG. 7 is a timing chart illustrating operation of a light-emitting component C according to the first exemplary embodiment.

The timing chart in FIG. 7 illustrates a portion where eight laser diodes LD1 to LD8 of the light-emitting component C are controlled to emit light and stop emitting light (refer to as lighting control).

In FIG. 7, the time passes in the alphabetical order from the time a to time t. The laser diode LD1 is subject to lighting control during the period T(1) (from the time a to the time f); the laser diode LD2 is subject to lighting control during the period T(2) (from the time a to the time k); and the laser diode LD3 is subject to lighting control during the period T(3) (from the time f to the time p). Subsequently, lighting control of the laser diodes LD numbered 4 or higher is conducted in the same manner. The period T(1) is a start-up period for the light-emitting component C and is different from other periods. The periods T(2), T(3), T(4), . . . all have the same length of time and are referred to as periods T if no distinction is needed.

For example, the period from the time e to the time k in the second half of the period T(2) in which the laser diode LD2 is subject to lighting control overlaps the first half of the period T(3) in which the laser diode LD3 is subject to lighting control. In other words, the periods T for lighting control of a group of odd-numbered laser diodes LD are shifted from the periods T for lighting control of a group of even-numbered laser diodes LD by ½ of a period T.

The transfer signals φ1 to φ4 transmitted to the φ1 terminal to the φ4 terminal and the start signals φs1 and φs2 transmitted to the φs1 and φs2 terminals are signals having two potentials, namely, "H" (0 V) and "L" (−3.3 V). In the description below, "H" (0 V) and "L" (−3.3 V) are referred to as "H" and "L" in some places.

The start signal φs1 causes to start propagation of the on state in the odd-numbered transfer thyristors T. The start signal φs2 causes to start propagation of the on state in the even-numbered transfer thyristors T.

The start signal φs1 is "H" at the time a, transitions from "H" to "L" at the time g, and then maintains "L" after that.

The start signal φs2 is "L" at the time a and transitions from "L" to "H" at the time b. It then transitions from "H" to "L" at the time l and maintains "L" after that.

The transfer signals φ1 to φ4 each repeat a waveform for a unit of two continuous periods T (for example, the periods T(3) and T(5) or the periods T(2) and T(4)).

The transfer signal φ1 is "L" at the time a and transitions from "L" to "H" at the time g. Then it transitions from "H" to "L" at the time p and transitions from "L" to "H" at the time t. This pattern is repeated thereafter. That is to say, the repeating unit includes the period T(3) that starts at the time f and the period T(5) that ends at the time s.

The transfer signal φ2 is "H" at the time a and transitions from "H" to "L" at the time f. Then it transitions from "L" to "H" at the time q and transitions from "H" to "L" at the time s. This pattern is repeated thereafter. That is to say, the repeating unit includes the period T(3) that starts at the time f and the period T(5) that ends at the time s.

The transfer signal φ2 has a waveform identical to the repeating waveform of the transfer signal φ1 but shifted by a period T.

The transfer signal φ3 has a waveform shifted from that of the transfer signal φ1 by ½ of the period T. The transfer signal φ4 has a waveform shifted from that of the transfer signal φ2 by ½ of the period T.

The lighting signals φI1 and φI2 are signals that have at least three potentials, namely, "H" (0 V), "L("0")", and "L("1")". For example, "L("0")" is 4.8 V, which is the sum of −1.5 V, which is V("0") that turns the laser diode LD to an on state with a logical value "0", and −3.3 V applied to the control thyristor S. Furthermore, "L("1")" is −5.3 V, which is the sum of −2.0 V, which is V("1") that turns the laser diode LD to an on state with a logical value "1", and −3.3 V applied to the control thyristor S.

This is described by using the period T(3) as an example. The lighting signal φI1 is "H" at the time f. It transitions from "H" to "L("0")" at the time h, then from L ("0")" to "L("1")" at the time n, and then from "L("1")" to "H" at the time o. It maintains "H" at the time p. This pattern is repeated every period T. The period from the time h to the time n is the period σ during which an on state with a logical value "0" is created, and the period from the time n to the time o is the period τ during which an on state with a logical value "1" is created.

The lighting signal φI2 has a waveform identical to that of the lighting signal φI1 but shifted by ½ of the period T.

As described below, the period of "H" (0 V) may be replaced by the period of a positive (+) potential, "H(+)".

Next, the lighting control of the laser diode LD is described through FIG. 7 with reference to FIG. 1. In FIG. 7, the on states (the on state with a logical value "0" and the on state with a logical value "1") of the laser diode LD are indicated by diagonal lines.

First, lighting control of the group of odd-numbered laser diodes LD is described.

Time a

At the time a, when the start signal φs1 is "H", the gate Gt1 of the transfer thyristor T1 is "H" (0 V). As mentioned above, since the threshold voltage of a thyristor is a value obtained by subtracting the forward potential Vd (1.5 V) of the pn junction from the potential of the gate, the threshold voltage of the transfer thyristor T1 is −1.5 V.

The gate Gt3 of the transfer thyristor T3 is at −1.5 V via the coupling diode D1. Thus, the threshold voltage of the transfer thyristor T3 is −3.0 V. The gate Gt5 of the transfer thyristor T5 is at −3 V via the coupling diode D3. Thus, the threshold voltage of the transfer thyristor T5 is −4.5 V. The transfer thyristors T numbered 7 or higher each has a threshold voltage of −4.8 V since the gate Gt is at a power supply voltage Vgk1, namely, "L (−3.3 V)", via the power supply wire resistors Rg.

At this stage, the transfer signal φ1 is "L" (−3.3 V) and has an absolute value larger than the threshold voltage (−1.5 V) of the transfer thyristor T1. Thus, the transfer thyristor T1 is turned on, and the gate GT1 is maintained at "H" (0 V). Since the threshold voltage (−4.5 V) of the transfer thyristor T5 and the like to which the transfer signal φ1 is transmitted is larger than the absolute value of the "L" (−3.3 V) of the transfer signal φ1, the transfer thyristor T5 and the like are not turned on.

In contrast, the transfer signal φ2 is at "H" (0 V); thus, the transfer thyristors T3, T7, . . . are not turned on since the cathode and the anode (substrate 80) are also at "H" (0 V).

The gate Gs1 of the control thyristor S is connected to the gate Gt1; thus, when the gate Gt1 is at "H" (0 V), the gate Gs1 is at "H" (0 V). As a result, the threshold voltage of the control thyristor S changes to −1.5 V, and a state ready to transition to the on state is created.

At this stage, the lighting signal φI1 is at "L("0")" (−4.8 V), which causes the laser diode LD1 to light in an on state with a logical value "0". Thus, the laser diode LD1 assumes the on state with a logical value "0". During this period of the on state with a logical value "0", the laser diode LD1 is allowed to undergo oscillation delay and relaxation oscillation to create a stable state.

Time d

The time b and the time c are irrelevant to the odd-numbered laser diodes LD.

At the time d, when the lighting signal φI1 changes to "L("1")" (−5.3 V) that causes the laser diode LD1 to light in an on state with a logical value "1", the laser diode LD1 turns to the on state with a logical value "1". At this stage, fluctuation of the light intensity P and variation in optical energy are suppressed since oscillation delay is already resolved and relaxation oscillation is already attenuated during the period in which the laser diode LD1 is in the on state with a logical value "0".

Time e

At the time e, when the lighting signal φI1 changes from "L("1")" to "H" (0 V), the cathode of the laser diode LD1 and the anode (substrate 80) of the control thyristor S1 both assume "H" (0 V). As a result, the control thyristor S1 is turned off, and the laser diode LD1 turns to the off state and stops emission.

At this stage, the lighting signal φI1 may be set to a potential on the + side of "H" (0 V) (for a lighting signal φI1 in FIG. 7, "H(+)" indicated by chain lines). When the signal is set to the + side potential, charges (carriers) are withdrawn from the gate layers 82 and 83 of the control thyristor S, and thus the laser diode LD1 stops emission more quickly.

Time f

At the time f, when the transfer signal φ2 changes from "H" (0 V) to "L" (−3.3 V), the transfer thyristor T3 whose threshold voltage is −3.0 V is turned on. The gate Gt2 is set to 0 V. As a result, the gate Gs3 of the control thyristor S3 is at 0 V. Then, the threshold voltage of the control thyristor S3 changes to −1.5 V, and a state ready to transition to an on state is created.

The gate Gt5 of the transfer thyristor T5 is now at −1.5 V via the coupling diode D3; thus, the threshold voltage of the transfer thyristor T5 changes to −3 V.

At this stage, since the lighting signal φI1 is "H", the control thyristor S3 is not turned on, and the laser diode LD3 does not light.

Here, the transfer thyristors T1 and T3 are both in an on state.

Time g

At the time g, the start signal φs1 changes from "H" to "L"; and the transfer signal φ1 changes from "L" to "H".

As a result, the cathode and the anode of the transfer thyristor T1 both assume "H", and the transfer thyristor T1 is turned off. Since the gate Gt1 is at "L" (−3.3 V), the threshold voltage of the transfer thyristor T1 changes to −4.8 V.

In other words, since the transfer thyristor T1 is turned to an off state, the on state propagates from the transfer thyristor T1 to the transfer thyristor T3.

Time h

At the time h, the lighting signal φI1 changes from "H" to "L("0")"; as a result, the control thyristor S3 is turned on, and the laser diode LD3 assumes an on state with a logical value "0".

Time n

The time i to the time m are irrelevant to the odd-numbered laser diodes LD.

At the time n, when the lighting signal φI1 changes from "L("0")" to "L("1")", the laser diode LD3 assumes an on state with a logical value "1" (lighted state).

Time o

At the time o, when the lighting signal φI1 changes from "L("1")" to "H" (0 V), the cathode of the laser diode LD3 and the anode (substrate 80) of the control thyristor S3 both assume "H" (0 V) as with at the time e. Thus, the control thyristor S3 is turned off, and the laser diode LD3 assumes the off state and stops emission.

Time p

At the time p, when the transfer signal φ1 changes from "H" to "L", the transfer thyristor T5 whose threshold voltage is −3 V is turned on. The gate Gt5 and the gate Gs5 assume 0 V, and the control thyristor S5 assumes a state ready to transition to an on state.

Time q

At the time q, the transfer signal φ2 changes from "L" to "H". As a result, the cathode and the anode of the transfer thyristor T3 both assume "H", and the transfer thyristor T3 is turned off. The gate Gt3 assumes "L" (−3.3 V), and the threshold voltage of the transfer thyristor T3 changes to −4.8 V.

That is, since the transfer thyristor T3 turns to the off state, the on state propagates from the transfer thyristor T3 to the transfer thyristor T5.

Subsequently, similar operations are repeated according to the transfer signals φ1 and φ2 and the lighting signal φI1 so as to perform lighting control on the odd-numbered laser diodes LD.

Next, the lighting control of the even-numbered laser diodes LD is described.

Time a

At the time a, the start signal φs2 is "L", the transfer signal φ3 is "H", and transfer signal φ4 is "H". As understood from FIG. 1, since the gate Gt2 of the transfer thyristor T2 is at "L" (−3.3 V), the threshold voltage of the transfer thyristor T2 is −4.8 V. Likewise, the gate Gt2 of the control thyristor S2 is at "L" (−3.3 V), and the threshold voltage of the control thyristor S2 is −4.8 V.

In order for the transfer signal φ3 to be "H", the cathode and the anode (substrate 80) of the transfer thyristors T3 to which the transfer signal φ3 is supplied are both at "H" (0 V). Thus, the transfer thyristors T3 is in an off state.

Since the lighting signal φI2 is "H" (0 V), the control thyristor S3 and the laser diode LD3 are in an off state.

The descriptions for other thyristors (transfer thyristors T and control thyristors S) not related to the laser diodes LD described here, and other laser diodes LD are the same as those for the odd-numbered laser diodes LD. Thus, descriptions are omitted.

Time b

When the start signal φs2 changes from "L" to "H", the gate Gt2 of the transfer thyristor T2 and the gate Gs2 of the control thyristor S2 both assume "H" (0 V), and the threshold voltages of the transfer thyristor T2 and the control thyristor S2 change to −1.5 V.

Since the transfer signal φ3 supplied to the cathode of the transfer thyristor T2 changes from "H" to "L" (−3.3 V), the transfer thyristor T2 is turned on.

Since the lighting signal φI2 maintains "H", the control thyristor S2 does not turn on, and the laser diode LD2 is in an off state.

Time c

At the time c, when the lighting signal φI2 changes from "H" to "L("0")", the control thyristor S2 is turned on, and the laser diode LD2 assumes an on state with a logical value "0".

Time i

The time d to the time h are irrelevant to the lighting control of the even-numbered laser diodes LD.

At the time i, when the lighting signal φI2 changes from "L("0")" to "L("1")", the laser diode LD2 assumes an on state with a logical value "1" (lighted state).

Time j

At the time j, when the lighting signal φI2 changes from "L("1")" to "H", the cathode of the laser diode LD2 and the anode (substrate 80) of the control thyristor S2 both assume "H" (0 V). Thus, the control thyristor S2 is turned off, and the laser diode LD2 assumes an off state (unlighted state).

The lighting period (from the time i to the time j) of the laser diode LD2 with a logical value "1" is ½ of the period T behind the lighting period (from the time d to the time e) of the laser diode LD1 with a logical value "1". Moreover, the lighting period (from the time i to the time j) of the laser diode LD2 with a logical value "1" is ½ of the period T ahead of the lighting period (from the time n to the time o) of the laser diode LD3 with a logical value "1".

The lighting control of the even-numbered laser diodes LD after this is the same as the lighting control of the odd-numbered laser diodes LD described above. Thus, the descriptions therefor are omitted.

In order cause a laser diode LD to assume an extinguished state (unlighted state), the lighting signal φI1 or the lighting signal φI2 may be held at "H" (0 V). In this manner, even when the threshold value of the control thyristor S is changed to −1.5 V, the control thyristor S is not turned on and the laser diode LD assumes an extinguished state (unlighted state).

As described above, the gate terminals Gt of the transfer thyristors T are connected to one another with the coupling diodes D. Thus, when the potential of a gate Gt changes, the potential of another gate Gt connected to that gate Gt, whose potential has changed, via a forward-biased coupling diode D also changes. Then the threshold voltage of the transfer thyristor T that includes the gate whose potential has been changed changes. When the threshold voltage of the transfer thyristor T is higher (a negative value with a smaller absolute value) than the power supply potentials Vgk1 and Vgk2 ("L" (−3.3 V)), the transfer thyristor T is turned on at the timing when the transfer signal φ(transfer signals φ1 to φ4) transitions from "H" (0 V) to "L" (−3.3 V).

The control thyristor S whose gate Gs is connected to the gate Gt of the transfer thyristor T in the on state has a threshold voltage of −1.5 V. Thus, when the lighting signal φI (lighting signal φI1 or φI2) transitions from "H" (0 V) to "L("0")", the control thyristor S turns on to assume an on state with a logical value "0". When the lighting signal φI (lighting signal φI1 or φI2) transitions from "L("0")" to "L("1")", the laser diode LD assumes an on state with a logical value "1" (lighted state).

In other words, causing a transfer thyristor T to assume an on state designates which of the laser diodes LD is the subject of the lighting control. The lighting signal φI (lighting signal φI1 or φI2) of "L("0")" turns on the control thyristor S connected in series to the laser diode LD subject to the lighting control, and at the same time, causes the laser diode LD to transition to an on state with a logical value "0". The lighting signal φI (lighting signal φI1 or φI2) of "L("1")" causes the laser diode LD to assume an on state with a logical value "1".

The transfer thyristors T that belong to the group of odd-numbered laser diodes LD are driven by using the start signal φs1 and the transfer signals φ1 and φ2 to perform lighting control on the group of odd-numbered laser diodes LD. The even-numbered transfer thyristors T of the group of even-numbered laser diodes LD are driven by using the start signal φs2 and the transfer signals φ3 and φ4 to perform lighting control on the group of even-numbered laser diodes LD. The lighting periods with a logical value "1" for the group of odd-numbered laser diodes LD and the lighting periods with a logical value "1" for the group of even-numbered laser diodes LD are provided alternately on the time axis. In other words, as exemplified by a transfer pathway for transferring the group of odd-numbered laser diodes LD and a transfer pathway for transferring the group of even-numbered laser diodes LD, plural transfer pathways are provided for respective groups. During the lighting period with a logical value "1" of the one of the groups of the even-numbered and odd-numbered laser diodes LD, the lighting period with a logical value "0" of the other group of the even-numbered and odd-numbered laser diodes LD is provided so that the lighting of the laser diodes LD at a logical value "1" propagates at short intervals. In other words, the laser diodes LD to be lighted (oscillated) are switched (forced to respond) at high speeds. For example, switching is conducted at a cycle corresponding to the period from the time e to the time j. When only the group of odd-numbered laser diodes LD is used, for example, the switching cycle is the period from the time e to the time o.

The period σ of a logical value "0" may be set according to the state of oscillation delay and relaxation oscillation.

In this example, two (two-stage) transfer pathways respectively for the group of odd-numbered laser diodes LD and the group of even-numbered laser diodes LD are provided. For higher response speeds, three (three stages) or more transfer pathways may be provided.

When laser diodes LD from which light is output (oscillated) are not to be switched (are not caused to respond) at high speeds, one of the group of even-numbered laser diodes LD and the group of odd-numbered laser diodes LD in FIG. 1 may be selected to constitute the light-emitting component C.

According to this arrangement, when the lighting signal φI1 changes from "H" to "L("1")" at the time h to achieve high-speed switching (response), as illustrated in FIG. 5, oscillation delay and relaxation oscillation occur in the on state with a logical value "1", and fluctuation of light intensity and variation in light energy result.

Although in the description above the logical value is "1/0", the logical value may be a combination of a logical value "m (m is an integer of 1 or more)" and a logical value "0".

Method for Producing Light-Emitting Component C

A method for producing the light-emitting component C will now be described with reference to a cross-sectional view of a part of the island 301 in which the control thyristor S and the laser diode LD are stacked as illustrated in FIG. 3.

FIGS. 8A to 8F are diagrams illustrating the method for producing the light-emitting component C. FIG. 8A illustrates a semiconductor stack forming step, FIG. 8B illustrates an n-ohmic electrode 321-forming step, FIG. 8C illustrates an etching step for exposing the tunnel junction layer 85, FIG. 8D illustrates a step of forming a current block portion β in the current confining layer 86b, FIG. 8E illustrates an etching step for exposing the p-gate layer 83, and FIG. 8F illustrates a step of forming the p-ohmic electrode 331 and the rear electrode 91.

In FIGS. 8A to 8F, two or more steps may be illustrated in one drawing.

The method will now be described.

In the semiconductor stack forming step illustrated in FIG. 8A, a p-anode layer 81, an n-gate layer 82, a p-gate layer 83, an n-cathode layer 84, a tunnel junction layer 85, a p-(cladding) anode layer 86, a light-emitting layer 87, and an n-(cladding) cathode layer 88 are sequentially epitaxially grown on a p-type substrate 80 so as to form a semiconductor stack. In FIGS. 8A to 8F, only the conductivity type, p or n, is illustrated.

A p-type GaAs substrate is used as an example of the substrate 80. Alternatively, an n-type GaAs substrate or an intrinsic (i) GaAs substrate free of an impurity may be used. A semiconductor substrate formed of InP, GaN, InAs, or other group III-V or II-VI material, a sapphire substrate, a Si or Ge substrate may also be used. When the substrate is changed, the materials to be monolithically deposited on the substrate are chosen to substantially match (including the strain structure, the strain relaxing layer, and metamorphic growth) the lattice constant of the substrate. For example, InAs, InAsSb, GaInAsSb, and the like are used on an InAs substrate; InP, InGaAsP, and the like are used on an InP substrate; GaN, AlGaN, InGaN, and the like are used on a GaN substrate or a sapphire substrate; and Si, SiGe, GaP, and the like are used on a Si substrate. However, when the stack is to be bonded to a different supporting substrate after crystal growth, the lattice constants of the semiconductor materials do not have to substantially match with that of the supporting substrate. The materials are not limited to semiconductor materials, and organic materials that have a p-type or n-type conductivity as with semiconductor materials may be used in the light-emitting component.

The p-anode layer 81 is formed of, for example, p-type $Al_{0.9}GaAs$ with an impurity concentration of $1\times10^{18}/cm^3$. The Al content may be changed within the range of 0 to 1. Alternatively, GaInP or the like may be used.

The n-gate layer 82 is formed of, for example, n-type $A_{0.9}GaAs$ having an impurity concentration of $1\times10^{17}/cm^3$. The Al content may be changed within the range of 0 to 1. Alternatively, GaInP or the like may be used.

The p-gate layer 83 is formed of, for example, p-type $A_{0.9}GaAs$ with an impurity concentration of $1\times10^{17}/cm^3$. The Al content may be changed within the range of 0 to 1. GaInP or the like may be used.

The n-cathode layer 84 is formed of, for example, n-type $A_{0.9}GaAs$ having an impurity concentration of $1\times10^{18}/cm^3$. The Al content may be changed within the range of 0 to 1. Alternatively, GaInP or the like may be used.

The tunnel junction layer 85 is constituted by a junction formed between the $n^{++}$-layer 85a with a high n-type impurity concentration and the $p^{++}$-layer 85b with a high p-type impurity concentration (refer to FIG. 8B). The $n^{++}$-layer 85a and the $p^{++}$-layer 85b each have an impurity concentration as high as $1\times10^{20}/cm^3$, for example. The impurity concentration of a typical junction is on the order of $10^{17}/cm^3$ to $10^{18}/cm^3$. Examples of the combination of the $n^{++}$-layer 85a and the $p^{++}$-layer 85b include (the combination is noted as $n^{++}$-layer 85a/$p^{++}$-layer 85b below) $n^{++}GaInP/p^{++}GaAs$, $n^{++}GaInP/p^{++}AlGaAs$, $n^{++}GaAs/p^{++}GaAs$, $n^{++}AlGaAs/p^{++}AlGaAs$, $n^{++}InGaAs/p^{++}InGaAs$, $n^{++}GaInAsP/p^{++}GaInAsP$, and $n^{++}GaAsSb/p^{++}GaAsSb$. The combination may be shuffled.

The p-(cladding) anode layer 86 is obtained by stacking the lower p-(cladding) anode layer 86a, the current confining layer 86b, and the upper p-(cladding) anode layer 86c in that order (refer to FIG. 8C).

The lower p-(cladding) anode layer 86a and the upper p-(cladding) anode layer 86c are formed of, for example, a p-type $A_{0.9}GaAs$ with an impurity concentration of $1\times10^{18}/cm^3$. The Al content may be changed within the range of 0 to 1. Alternatively, GaInP or the like may be used.

The current confining layer 86b is, for example, formed of p-type AlGaAs in which the concentration of the impurity, AlAs or Al, is high. The current confining layer 86b may be formed of any material whose electrical resistance is increased by oxidation of Al and formation of $Al_2O_3$ that narrows the current path.

The light-emitting layer 87 has a quantum well structure in which well layers and barrier layers are alternately stacked. The well layers are, for example, formed of GaAs, AlGaAs, InGaAs, GaAsP, AlGaInP, GaInAsP, GaInP, or the like. The barrier layers are, for example, formed of AlGaAs, GaAs, GaInP, GaInAsP, or the like. The light-emitting layer 87 may be a quantum beam (quantum wire) or a quantum box (quantum dot).

The n-(cladding) cathode layer 88 is formed of n-type $A_{0.9}GaAs$ with an impurity concentration of $1\times10^{18}/cm^3$, for example. The Al content may be changed within the range of 0 to 1. Alternatively, GaInP may be used.

These semiconductor layers are, for example, deposited by metal organic chemical vapor deposition (MOCVD), molecular beam epitaxy (MBE), or the like, and a semiconductor stack is formed as a result.

In the n-ohmic electrode 321 forming step illustrated in FIG. 8B, the n-ohmic electrode 321 is first formed on the n-(cladding) cathode layer 88.

The n-ohmic electrode 321 is formed of, for example, Au containing Ge that facilitates formation of ohmic contact with an n-type semiconductor layer, such as the n-cathode layer 88, (AuGe), or the like.

The n-ohmic electrode 321 is formed by, for example, a lift-off method.

In the etching step of exposing the tunnel junction layer 85 illustrated in FIG. 8C, the n-cathode layer 88, the light-emitting layer 87, and the p-anode layer 86 stacked on the tunnel junction layer 85 and around the laser diode LD are removed by etching.

Wet etching using a sulfuric acid etching solution (the sulfuric acid/hydrogen peroxide solution/water weight ratio=1:10:300) or the like may be employed for this etching step. For example, anisotropic dry etching (reactive ion etching, RIE) using boron chloride may be performed.

In the step of forming current block portion β in the current confining layer 86b illustrated in FIG. 8D, the current confining layer 86b whose side surface has been exposed by the etching step of exposing the tunnel junction layer 85 is oxidized from the side surface to form the current block portion β that blocks the current. The portion left unoxidized serves as the current pass portion α.

Oxidation from the side surface of the current confining layer 86b may involve, for example, oxidizing Al of the current confining layer 86b, which is formed of AlAs, AlGaAs, or the like, with water vapor at 300° C. to 400° C. The oxidation proceeds from the exposed side surface; thus, the current block portion β formed of $Al_2O_3$, which is an oxide of Al, is formed around the laser diode LD.

The current block portion β may be formed by hydrogen ($H_2$) implantation instead of oxidation of AlAs. That is, the p-(cladding) anode layer 86 is formed by continuously depositing the lower p-(cladding) anode layer 86a and the upper p-(cladding) anode layer 86c without distinguishing them, and then implanting hydrogen ($H_2$) ions into the part that forms the current block portion β. As a result, $A_{0.9}GaAs$ exhibits an insulating property and functions as the current block portion β.

In the etching step of exposing the p-gate layer 83 illustrated in FIG. 8E, the tunnel junction layer 85 and the n-cathode layer 84 are etched to expose the p-gate layer 83.

Wet etching with a sulfuric acid etching solution (the sulfuric acid/hydrogen peroxide solution/water weight ratio=1:10:300) may be employed for this etching step. For example, anisotropic dry etching using boron chloride may be performed.

In the etching step of exposing the tunnel junction layer 85 illustrated in FIG. 8C, if the p-gate layer 83 is exposed instead of the tunnel junction layer 85, Al contained in the p-gate layer 83 may become oxidized in the step of forming the current block portion β illustrated in FIG. 8D. When Al contained in the p-gate layer 83 is oxidized, the surface may be roughened and the bonding property of the p-ohmic electrode 331 may be degraded. Thus, the current block portion β forming step is performed while having the tunnel junction layer 85 exposed.

In the step of forming the p-ohmic electrode 331 and the rear electrode 91 illustrated in FIG. 8F, the p-ohmic electrode 331 is first formed on the p-gate layer 83.

The p-ohmic electrode 331 is, for example, formed of Au containing Zn that facilitates formation of ohmic contact with a p-type semiconductor layer such as the p-gate layer 83 (AuZn).

The p-ohmic electrode 331 is formed by, for example, a lift-off method. During this process, other p-ohmic electrodes may be formed simultaneously.

Next, the rear electrode 91 is formed on the rear surface of the substrate 80.

As with the p-ohmic electrode 331, the rear electrode 91 is formed of, for example, AuZn.

In addition to these steps, the method includes a step of forming the protection layer 90, a step of forming through holes in the protection layer 90, a step of forming the wires 76 and 77, etc.

In the description above, the method for producing the light-emitting component C is described by using a part of the island 301 in which the control thyristor S and the laser diode LD are stacked.

Other portions of the island 301 that include the transfer thyristor T and the coupling diode D, and other islands, such as islands 302 to 308 that include power supply wire resistor Rg1 and the current-limiting resistors R1 to R6 may be formed by adding a step of exposing the surface of the n-cathode layer 84 and a step of forming the n-ohmic electrode 322 or 323, or the like on the exposed n-cathode layer 84 to the steps described above.

In the description above, the p-ohmic electrode 331 is formed on the p-gate layer 83 so as to form a gate terminal Gs of the control thyristor S. Alternatively, the gate terminal Gs of the control thyristor S may be formed on the n-gate layer 82. The same applies to the transfer thyristor T.

As described above, the light-emitting component C according to the first exemplary embodiment includes a control thyristors S and a laser diode LD stacked on top of each other. Because of the transfer thyristor T and the control thyristor S, the light-emitting component C is a self-scanning type device in which the laser diodes LD can be lighted sequentially. According to this structure, the number of terminals of the light-emitting component C is decreased, and the size of the light-emitting component C is reduced.

In the first exemplary embodiment, the laser diode LD and the control thyristor S are stacked with the tunnel junction layer 85 therebetween. In this manner, the laser diode LD is reverse-biased in the tunnel junction layer 85. However, the tunnel junction allows the current to flow in the reverse bias state.

When no tunnel junction layer 85 is formed, the junction between the laser diode LD and the control thyristor S is reverse-biased. Thus, in order to supply a current across the laser diode LD and the control thyristor S, a voltage at which the reverse-biased junction will yield is applied. This means that the drive voltage is increased.

In other words, by stacking the laser diode LD and the control thyristor S with the tunnel junction layer 85 therebetween, the drive voltage can be decreased compared to when no tunnel junction layer 85 is provided.

The current confining layer 86b may be formed in the p-anode layer 81 instead of the p-(cladding) anode layer 86.

As mentioned above, the tunnel junction layer 85 allows current to flow in the reverse bias state. However, the junction between the n-cathode layer 84 and the p-(cladding) anode layer 86 is not a tunnel junction, and thus the current does not smoothly flow in the reverse bias state in which no yield occurs. Thus, the tunnel junction layer 85 may be formed in the portion that corresponds to the current pass portion α so as not to form the tunnel junction layer 85 in the current block portion β. In this case, after depositing the tunnel junction layer 85, a portion of the tunnel junction layer 85 is etched, and the p-(cladding) anode layer 86 is epitaxially grown so as to fill around the remaining tunnel junction layer 85. Then the p-(cladding) anode layer 86 is deposited so as to fill around the remaining tunnel junction layer 85. Alternatively, the n-cathode layer 84 instead of the p-(cladding) anode layer 86 may be used to fill around the remaining tunnel junction layer 85. This structure may be employed when a semiconductor material not suitable for water vapor oxidation is used.

In the description bellow modification examples of the light-emitting component C according to the first exemplary embodiment are described. In the modification examples described below, a group III-V compound layer that has a metallic conductivity and is epitaxially grown on a group III-V compound semiconductor layer is used instead of the tunnel junction layer 85. In this case, the "tunnel junction layer 85" in the description of the first exemplary embodiment may be substituted with "metallic conducting group III-V compound layer 85".

Figure 9A:
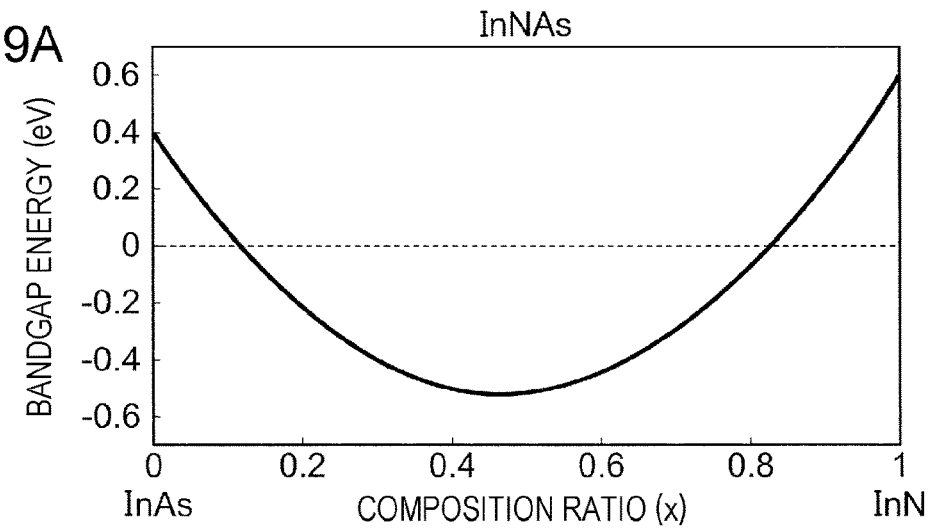
FIGS. 9A to 9C are diagrams illustrating materials that constitute a metallic conducting group III-V compound layer.
Figure 9B:
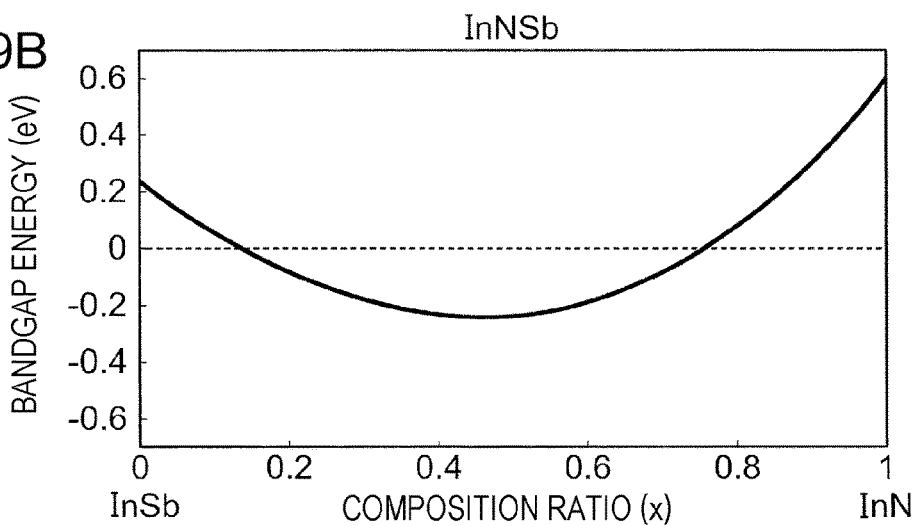
Figure 9C:
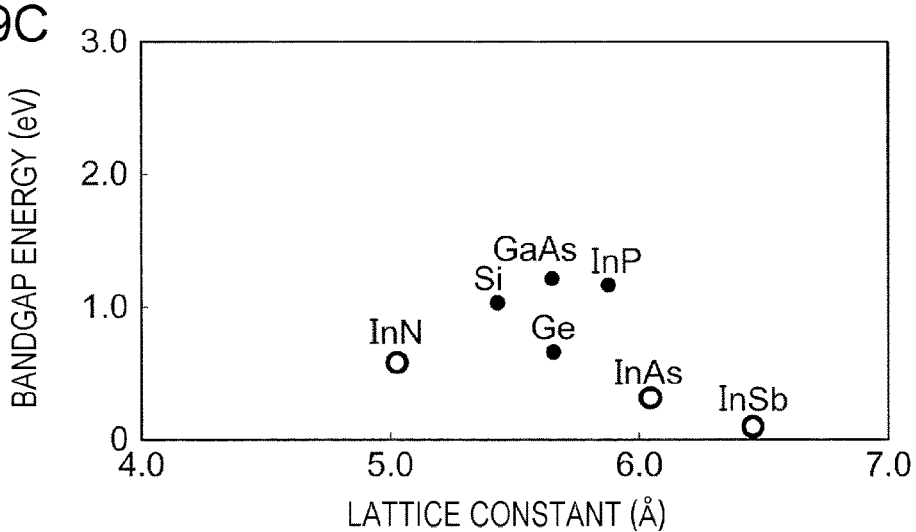

FIGS. 9A to 9C are graphs that describe materials constituting the metallic conducting group III-V compound layer. FIG. 9A illustrates a bandgap of InNAs with respect to the InN composition ratio x; FIG. 9B illustrates a bandgap of InNSb with respect to the InN composition ratio x; and FIG. 9C illustrates lattice constants of group VI elements and group III-V compounds with respect to the bandgap.

FIG. 9A illustrates the bandgap energy (eV) of InNAs, which is a compound between InN with a composition ratio x (x=0 to 1) and InAs with a composition ratio (1−x).

FIG. 9B illustrates the bandgap energy (eV) of InNSb, which is a compound between InN with a composition ratio x (x=0 to 1) and InSb with a composition ratio (1−x).

InNAs and InNSb, which are described here as examples of the material for the metallic conducting group III-V compound layer, are known to have a negative bandgap energy in a particular composition ratio x range, as illustrated in FIGS. 9A and 9B. A negative bandgap energy means that the material has no bandgap. Thus, conducting properties (conductive properties) similar to those of metal are exhibited. Metallic conducting properties (conductivity) means that the current will flow as long as there is a slope in potential as in metal.

As illustrated in FIG. 9A, InNAs exhibits a negative bandgap energy when the InN composition ratio x is within the range of about 0.1 to about 0.8.

As illustrated in FIG. 9B, InNSb exhibits a negative bandgap energy when the InN composition ratio x is within the range of about 0.2 to about 0.75.

That is to say, InNAs and InNSb exhibit metallic conductive properties (conductivity) within these ranges.

In regions, other than these ranges, where the bandgap energy is small, electrons obtain energy due to thermal energy and can transition through a slight bandgap. As with the case when the bandgap energy is negative or with the case of metal, the current smoothly flows when there is a slope in the potential.

Even when InNAs and InNSb contain Al, Ga, Ag, P, or the like, the bandgap energy can be maintained close to zero or can be maintained at a negative value by adjusting the composition. If there is a slope in the potential, the current will flow.

As illustrated in FIG. 9C, the lattice constants of the group III-V compounds (semiconductors) such as GaAs and InP are within the range of 5.6 Å to 5.9 Å. The lattice constants are close to that of Si, which is about 5.43 Å and that of Ge, which is about 5.66 Å.

In contrast, the lattice constant of the InN, which is also a group III-V compound, is about 5.0 Å for a zinc blende structure, and the lattice constant of InAs is about 6.06 Å. The lattice constant of InNAs, which is a compound between InN and InAs, can take a value close to 5.6 Å to 5.9 A, which is a lattice constant of GaAs and the like.

The lattice constant of InSb, which is a group III-V compound, is about 6.48 Å. Since the lattice constant of InN is about 5.0 Å, the lattice constant of InNSb, which is a compound between InSb and InN, can be a value close to 5.6 Å to 5.9 Å, which is a lattice constant of GaAs or the like.

This is to say that InNAs and InNSb can be monolithically epitaxially grown on a layer of a group III-V compound (semiconductor), such as GaAs. Furthermore, a layer of a group III-V compound (semiconductor) such as GaAs can be monolithically epitaxially grown on the InNAs or InNSb layer.

Thus, when the laser diode LD and the control thyristor S are stacked with a metallic conducting group III-V compound layer therebetween instead of the tunnel junction layer 85 such that the laser diode LD and the control thyristor S are connected in series, the p-(cladding) anode layer 86 of the laser diode LD and the n-cathode layer 84 of the control thyristor S are suppressed from becoming reverse biased.

Current easily flows in the metallic conducting group III-V compound layer. However, the junction between the n-cathode layer 84 and the p-(cladding) anode layer 86 inhibits flow of the current in a reverse bias state where no yield occurs. Thus, a metallic conducting group III-V compound layer may be formed in a portion corresponding to the current pass portion α, without forming the metallic conducting group III-V compound layer in the current block portion β.

Next, other modification examples of the light-emitting component C according to the first exemplary embodiment are described.

FIG. 10 is an enlarged cross-sectional view of a laser diode LD and a control thyristor S according to another modification example of the light-emitting component C according to the first exemplary embodiment.

The laser diode LD of the light-emitting component C of this modification example has a light-emitting layer 87 sandwiched between two DBR layers (p-(DBR) anode layer 86 and n-(DBR) cathode layer 88). In FIG. 10, the p-(DBR) anode layer is denoted as pDBR, and the n-(DBR) cathode layer is denoted as nDBR. The same applies hereinafter.

The two DBR layers (p-(DBR) anode layer 86 and n-(DBR) cathode layer 88) cause light to resonate and achieve laser oscillation. When the reflectance of the two DBR layers (p-(DBR) anode layer 86 and n-(DBR) cathode layer 88) reaches, for example, 99% or higher, laser oscillation occurs. Then light goes out in a direction perpendicular to the light-emitting layer 87. Thus, this laser diode LD is called a vertical cavity surface emitting laser (VCSEL).

The p-(DBR) anode layer 86 includes the current confining layer 86*b*. In other words, the p-(DBR) anode layer 86 includes a lower p-(DBR) anode layer 86*a*, a current confining layer 86*b*, and an upper p-(DBR) anode layer 86*c* stacked in that order. The lower p-(DBR) anode layer 86*a* and the upper p-(DBR) anode layer 86*c* are configured as the DBR layers.

A DBR layer is, for example, formed of a combination of a low refractive index layer with a high Al content, such as $A_{0.9}Ga_{0.1}As$, and a high refractive index layer with a low Al content, such as $A_{0.2}Ga_{0.8}As$. The low refractive index layer and the high refractive index layer each have a thickness (optical path length) set to 0.25 (¼) times the center wavelength, for example. The Al content of the low refractive index layer and the high refractive index layer may be changed within the range of 0 to 1.

The thickness (optical path length) of the current confining layer 86*b* in the p-(DBR) anode layer 86 is determined based on the employed structure. When the output efficiency and process reproducibility are focused, the thickness may be set to a whole-number multiple of the thickness (optical path length) of the low refractive index layer and the high refractive index layer constituting the DBR layer. For example, the thickness is set to a value 0.75 (¾) times the center wavelength. When the thickness is an odd-number multiple, the current confining layer 86*b* may be sandwiched between a high refractive index layer and a high refractive index layer. When the thickness is an even-number multiple, the current confining layer 86*b* may be sandwiched between a high refractive index layer and a low refractive index layer. In other words, the current confining layer 86*b* may be designed to suppress disturbance of the cycle of the refractive index by the DBR layers. Conversely, in order to reduce the influence (refractive index and strain) of the oxidized portion, the thickness of the current confining layer 86*b* may be several ten nanometers and the current confining layer 86*b* may be inserted at a node of a standing wave in the DBR layer.

The current confining layer 86*b* in the p-(DBR) anode layer 86 may instead be formed in the n-(DBR) cathode layer 88, or the p-anode layer 81 or the n-cathode layer 84 of the control thyristor S. In such a case, a particular amount of light passes through the tunnel junction layer 85. In order to reduce light absorption in the tunnel junction layer 85, the tunnel junction layer 85 may be formed of a material having a bandgap larger than the oscillation wavelength, may be made thinner, or may be positioned at the node of the standing wave, for example.

Although the p-(cladding) anode layer 86 is configured as a DBR layer, the p-anode layer 81 or the n-cathode layer 84 may be configured as a DBR layer instead.

The tunnel junction layer 85 may be configured as a metallic conducting group III-V compound layer. Instead of the current confining layer 86b, the tunnel junction layer 85 or a metallic conducting group III-V compound layer may be formed in the current pass portion α.

Second Exemplary Embodiment

According to the self-scanning light-emitting element array mounted in the light-emitting component C of the first exemplary embodiment, the laser diodes LD are subject to lighting control in numerical order. In contrast, according to the second exemplary embodiment, during the lighting control, the order of the laser diode LD to be subject to lighting control next can be switched between numerical order and reversed numerical order.

Figure 11:
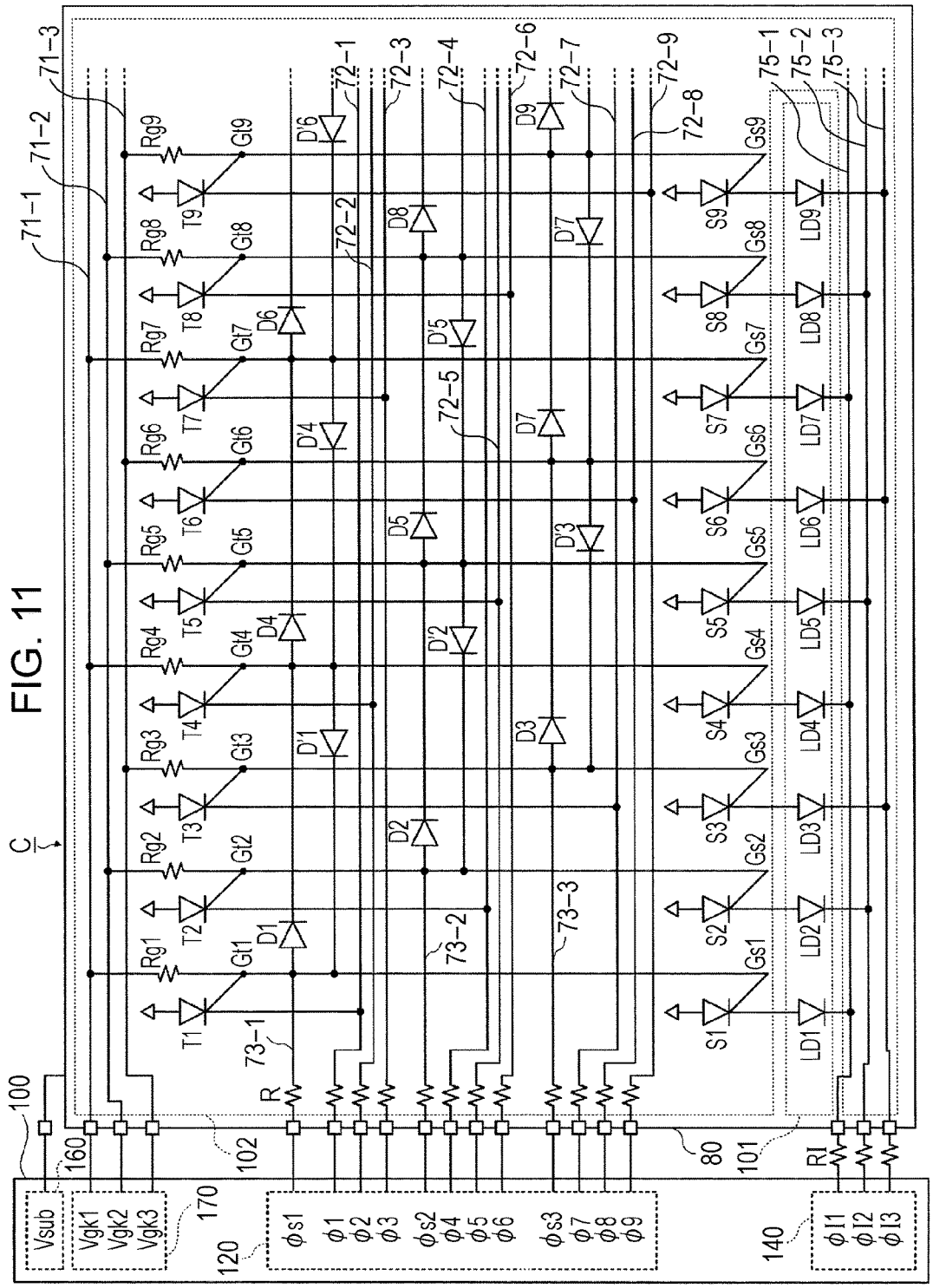
FIG. 11 is an equivalent circuit diagram illustrating the circuit configuration of a light-emitting component in which a self-scanning light-emitting element array (SLED) is mounted, and a signal generation circuit according to a second exemplary embodiment.

FIG. 11 is an equivalent circuit diagram illustrating the circuit configuration of the light-emitting component C in which a self-scanning light-emitting element array (SLED) is mounted, and a signal generation circuit 100 according to the second exemplary embodiment.

The light-emitting component C according to the second exemplary embodiment is identical to the first exemplary embodiment except for the parts described below. Thus, the different parts are described, and the identical parts are referred to by the same reference symbols and are not described.

FIG. 11 illustrates a portion that corresponds to the laser diode LD1 to LD9, the control thyristors S1 to S9, and the transfer thyristors T1 to T9. The same structure is repeated onward.

Unlike the first exemplary embodiment, the laser diodes LD, the control thyristors S, and the transfer thyristors T are grouped into three groups in numerical order. That is, there are a first group that includes parts numbered 1+3×(n−1) (n is an integer of 1 or more, the same applies hereinafter), such as laser diodes LD1, LD4, LD7, . . . ; a second group that includes parts numbered 2+3×(n−1), such as laser diodes LD2, LD5, LD8, . . . ; and a third group that includes parts numbered 3+3×(n−1), such as laser diodes LD3, LD6, LD9, . . . .

The gates Gt of the transfer thyristors T of the first group are connected to a power supply wire 71-1 via the power supply wire resistor Rg. A power supply potential Vgk1 is supplied to the power supply wire 71-1.

The gates Gt of the transfer thyristors T of the second group are connected to a power supply wire 71-2 via the power supply wire resistor Rg. A power supply potential Vgk2 is supplied to the power supply wire 71-2.

The gates Gt of the transfer thyristors T of the third group are connected to a power supply wire 71-3 via the power supply wire resistor Rg. A power supply potential Vgk3 is supplied to the power supply wire 71-3.

The cathodes (correspond to the n-ohmic electrode 321 illustrated in FIGS. 2A and 2B) of the laser diodes LD of the first group are connected to a lighting signal wire 75-1. A lighting signal φI1 is supplied to the lighting signal wire 75-1.

The cathodes of the laser diodes LD of the second group are connected to a lighting signal wire 75-2. A lighting signal φI2 is supplied to the lighting signal wire 75-2.

The cathodes of the laser diodes LD of the third group are connected to a lighting signal wire 75-3. A lighting signal φI3 is supplied to the lighting signal wire 75-3.

In each of the groups, the gates Gt of the transfer thyristors T are connected to each other with a coupling diode D and a coupling diode D' connected in parallel in opposite directions. For example, in the first group, the gate Gt1 of the transfer thyristor T1 and the gate Gt4 of the transfer thyristor T4 are connected to each other with the coupling diode D1 and the coupling diode D'1; and the gate Gt4 of the transfer thyristor T4 and the gate Gt7 of the transfer thyristors T7 are connected to each other with the coupling diode D4 and the coupling diode D'4.

The cathodes of the transfer thyristors T in the first group are connected to the transfer signals φ1, φ2, and φ3 so that they circulate in numerical order of the transfer thyristors T1, T4, T7, . . . . The anode of the coupling diode D1 connected to the gate Gt1 of the transfer thyristor T1 and the cathode of the coupling diode D'1 are connected to the start signal φs1.

The cathodes of the transfer thyristors T of the second group are connected to the transfer signals φ4, φ5, and φ6 so that they circulate in numerical order of the transfer thyristors T2, T5, T8, . . . . The anode of the coupling diode D2 connected to the gate Gt2 of the transfer thyristor T2 and the cathode of the coupling diode D'2 are connected to the start signal φs2.

Similarly, the cathodes of the transfer thyristors T of the third group are connected to the transfer signals φ7, φ8, and φ9 so that they circulate in numerical order of the transfer thyristors T3, T6, T9, . . . . The anode of the coupling diode D3 connected to the gate Gt3 of the transfer thyristor T3 and the cathode of the coupling diode D'3 are connected to the start signal φs3.

In FIG. 11, the reference symbols for the terminals are omitted since the reference symbols of the signals (φ1 in the transfer signal φ1, etc.) are the same as those (φ1 in the terminal φ1, etc.) for the terminals to which the signals are supplied.

The notations "current-limiting resistors R and RI" are used.

The laser diode LD may emit light in a horizontal direction illustrated in FIG. 3 or in a perpendicular direction illustrated in FIG. 10.

Operation of Light-Emitting Component C

Figure 12:
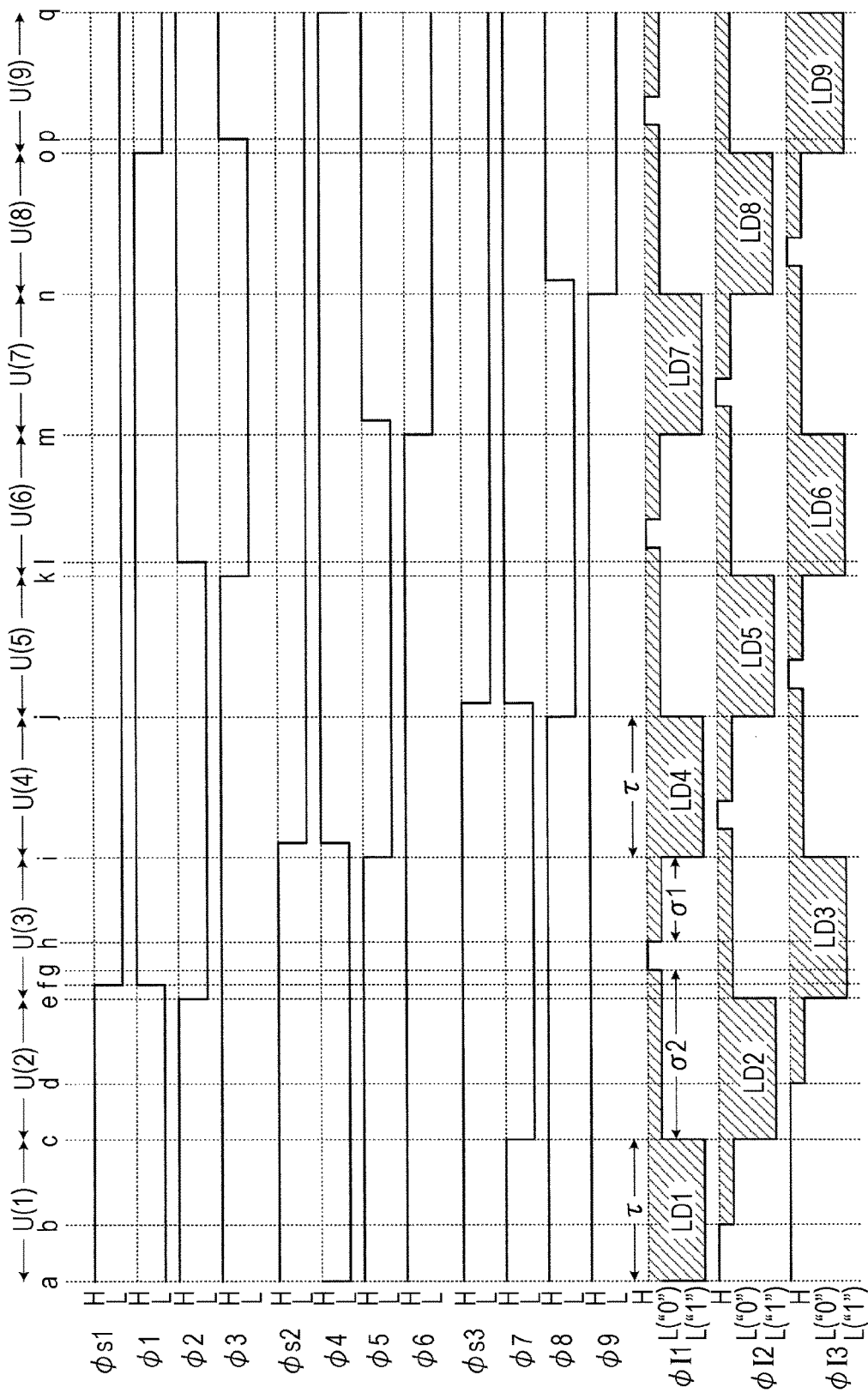
FIG. 12 is a timing chart describing operation of the light-emitting component according to the second exemplary embodiment.

FIG. 12 is a timing chart describing operation of the light-emitting component C according to the second exemplary embodiment.

The timing chart in FIG. 12 indicates the portion where nine laser diodes LD1 to LD9 of the light-emitting component C are subject to lighting control.

In FIG. 12, the time passes in the alphabetical order from the time a to time q (note that the time a to the time o are different from the time a to the time w illustrated in FIG. 7). The laser diode LD1 assumes an on state (lighted state) with a logical value "1" during the period U(1) (from the time a to the time c); the laser diode LD2 assumes an on state (lighted state) with a logical value "1" during the period U(2) (from the time c to the time e); the laser diode LD3 assumes an on state (lighted state) with a logical value "1" during the period U(3) (from the time e to the time i). Similarly, the laser diodes LD numbered 4 or higher are subject to lighting control thereafter. The periods U(1), U(2), U(3), . . . have the same length of time and when these periods are not distinguished, they are referred to as the periods U.

The transfer signals φ1 to φ3 transmitted to the φ1 terminal to the φ3 terminal in the first group and the start signal φs1 transmitted to the φs1 terminal are signals that have two potentials, namely, "H" (0 V) and "L" (−3.3 V). Hereinafter, "H" (0 V) and "L" (−3.3 V) may be referred to as "H" and "L" respectively.

The transfer signal φ1 is "L" at the time a, transitions from "L" to "H" at the time f, and transitions from "H" to "L" at the time o.

The transfer signal φ2 is "H" at the time a, transitions from "H" to "L" at the time e, and transitions from "L" to "H" at the time l.

The transfer signal φ3 is "H" at the time a, transitions from "H" to "L" at the time k, and transitions from "L" to "H" at the time p.

The transfer signals φ1 to φ3 repeat the cycle from the time a to the time q.

In contrast, the start signal φs1 is "H" at the time a, transitions from "H" to "L" at the time f when the transfer signal φ1 transitions from "L" to "H", and then maintains "L".

The transfer signals φ4, φ5, and φ6 of the second groups are a period U behind the transfer signals φ1, φ2, and φ3 of the first group on the time axis.

The transfer signals φ7, φ8, and φ9 of the third group are a period U behind the transfer signals φ4, φ5, and φ6 of the second group on the time axis.

For the transfer signals φ1 to φ9, the period of "L" has a length of a period corresponding to "3×period U+time k to time l", and the period "H" has a length of a period corresponding to "6×period U−time k to time l". The transfer signal φ1 and the transfer signal φ2 have overlapping "L" periods (for example, the period from the time g to the time h). The same applies to the transfer signal φ2 and the transfer signal φ3, and other transfer signals φ.

The lighting signal φI1 is "L("1")" at the time a, transitions from "L("1")" to "L("0")" at the time c, and transitions from "L("0")" to "H" at the time g. It transitions from "H" to "L("0")" at the time h, and transitions from "L("0")" to "L("1")" at the time i. The cycle from the time a to the time i is then repeated.

In other words, the lighting signal φI1 causes the laser diode LD to assume an on state with a logical value "0" before (the period σ1 corresponding to the period from the time h to the time i) the period U (the "L("1")" period τ) in which the laser diode LD assumes an on state (lighted state) with a logical value "1", and causes the laser diode LD to assume the on state with a logical value "0" after (period σ2 corresponding to the period from the time c to the time g) the period U. There is a period of "H" between the period σ2 and the period σ1.

The lighting signal φI1 repeats its cycle of 3×period U.

The lighting signal φI2 is a period U behind the lighting signal φI1 on the time axis. Similarly, the lighting signal φI3 is a period U behind the lighting signal φI2 on the time axis.

The operation of the light-emitting component C is described below in the chronological order. The operation of the thyristors (transfer thyristors T and control thyristors S) has been described in detail in the first exemplary embodiment; thus, differences are described.

Time a

At the time a, since the start signal φs1 is "H" (0 V), the threshold voltage of the transfer thyristor T1 is −1.5 V. At this stage, since the transfer signal φ1 is "L" (−3.3 V), the transfer thyristor T1 is turned on. The control thyristor S1 also has a threshold voltage of −1.5 V. Since the lighting signal φI1 is "L("1")", the laser diode LD1 assumes an on (lighted) state with a logical value "1".

At this stage, the transfer thyristor T4 connected with a forward coupling diode D1 has a threshold voltage of −3.0 V.

Similarly, the transfer thyristor T2 is also turned on.

Since the start signal φs3 is "H", the transfer thyristor T3 has a threshold voltage of −1.5 V. However, since the transfer signal φ7 is "H", the transfer thyristor T3 is in an off state.

Time b

At the time b, when the lighting signal φI2 transitions from "H" to "L("0")", the laser diode LD2 assumes an on state with a logical value "0".

Time c

At the time c, since the transfer signal φ7 changes from "H" to "L", the transfer thyristors T3 is turned on.

At this time, when the lighting signal φI1 transitions from "L("1")" to "L("0")", the laser diode LD1 assumes an on state with a logical value "0".

When the lighting signal φI2 transitions from "L("0")" to "L("1")", the laser diode LD1 assumes an on (lighted) state with a logical value "1".

Time d

At the time d, when the lighting signal φI3 transitions from "H" to "L("0")", the laser diode LD3 assumes an on state with a logical value "0".

Time e

At the time e, the transfer signal φ2 changes from "H" to "L" (−3.3 V). Then the transfer thyristor T4 whose threshold voltage is −3.0 V turns on. The threshold voltage of the transfer thyristor T7 changes to −3.0 V via the coupling diode D4.

Also, the lighting signal φI2 changes from "L("1")" to "L("0")", and the laser diode LD2 shifts from an off state to an on state with a logical value "0".

Furthermore, when the lighting signal φI3 changes from "L("0")" to "L("1")", the laser diode LD3 shifts from the on state with a logical value "0" to an on state (lighted state) with a logical value "1".

Time f

At the time f, when the transfer signal φ1 changes from "L" to "H", the cathode of the transfer thyristor T1 assumes "H". Thus, the transfer thyristor T1 is turned off. At this stage, the start signal φs1 changes from "H" to "L".

The gate Gt1 of the transfer thyristor T1 is connected to the gate Gt4 of the transfer thyristor T4 with the coupling diode D′1. The coupling diode D1 is in a reverse direction, but the coupling diode D′1 is in a forward direction and the gate Gt1 is at −1.5 V. Thus, the transfer thyristor T1 has a threshold voltage of −3.0 V. In other words, when the transfer thyristor T4 is in an on state, the threshold voltages of the transfer thyristors T1 and T7 change to −3.0 V due to the coupling diodes D1 and Dv′ connected in parallel in opposite directions.

Although the gate Gs1 of the control thyristor S1 also changes to −1.5 V, the on state continues because the lighting signal φI1 is "L("0")".

Time g

At the time g, when the lighting signal φI1 changes from "L("0")" to "H", the laser diode LD1 changes from the on state with a logical value "0" to an off state. As a result, the control thyristor S1 changes from the on state to the off state. The control thyristor S1 then exhibits a threshold voltage of −3.0 V.

Time h

At the time h, when the lighting signal φI1 changes from "H" to "L("0")", the control thyristor S4 whose threshold voltage is −1.5 V is turned on. The laser diode LD4 changes from the off state to an on state with a logical value "0".

Time i

At the time i, when the transfer signal φ5 changes from "H" to "L", the transfer thyristor T5 is turned on.

When the lighting signal φI1 changes from "L("0")" to "L("1")", the laser diode LD4 changes from the on state with a logical value "0" to an on (lighted) state with a logical value "1".

Then at the time k, when the transfer signal φ3 transitions from "H" to "L", the transfer thyristor T7 is turned on.

As such, the on state (lighted state) with a logical value "1" propagates in numerical order of the laser diodes LD.

In other words, transition from "H" to "L" is performed in cycles in the order of transfer signals φ1, φ2, and φ3 so that the on state propagates in numerical order in the transfer thyristors T (transfer thyristors T1, T4, T7, . . . ) of the first group. The same applies to other groups also.

The transition from "H" to "L" is performed in cycles in the order of transfer signals φ1, φ4, φ7, φ2, φ5, φ8, φ3, φ6, φ9 so that the on state propagates in numerical order in the transfer thyristors T.

Depending on the potential ("L("0")" or "L("1")") of the lighting signal φI in a state in which the absolute value of the threshold voltage of the control thyristor S corresponding to the transfer thyristor T in the on state is decreased, the laser diode LD assumes an on state with a logical value "0" or an on (lighted) state with a logical value "1".

According to the structure described above, the laser diodes LD sequentially assume the on (lighted) state in numerical order. Since there is a period σ1 of the on state with a logical value "0" before the on state (lighted state) with a logical value "1", oscillation delay and relaxation oscillation do not affect the laser diodes LD.

When the off state is to be maintained, the potential of the lighting signal φI may be maintained at "H".

In some cases, it is desirable that the laser diodes LD assume the on state (lighted state) in reversed numerical order in the middle of having the laser diodes LD assuming the on state (lighted state) in numerical order. For example, in FIG. 12, the on state (lighted state) propagates sequentially in the laser diodes LD1, LD2, LD3, LD4, and LD5, and then in a reverse order, namely, the laser diodes LD4, LD3, LD2, and LD1.

In such a case, at the time k, φI1 changes from "L("0")" to "L("1")"; but φI3 maintains "L("0")" and does not change from "L("0")" to "L("1")". In this manner, the laser diode LD4 again changes from the on state with a logical value "0" to the on state with a logical value "1". At the time k, since φI1 is "L("0")", there is no influence of oscillation delay or relaxation oscillation.

For example, the transfer signals φ are adjusted so that the timing that the signal changes from "H" to "L" circulates in the order of transfer signals φ7, φ4, φ1, φ9, φ6, φ3, φ8, φ5, and φ2, which means that the transfer signal φ7 changes from "H" to "L" at the time k, the transfer signal φ4 changes from "H" to "L" at the time m, and the transfer signal φ1 changes from "H" to "L" at the time n. As a result, the on state of the transfer thyristors T propagates in reversed numerical order. At the same time, the on state (lighted state) propagates in reversed numerical order in the laser diodes LD.

As described above, according to the light-emitting component C of the second exemplary embodiment, the laser diodes LD are grouped into at least three groups, and a transfer pathway is provided for each group. As a result, the on state with a logical value "0" is provided before and after the on state (lighted state) with a logical value "1". Each group is driven by using a transfer signal φ having at least three phases so as to switch the direction of transfer. Thus, even when the on state (lighted state) with a logical value "1" propagates in the direction of alignment (numerical order) or in the reversed direction (reversed numerical order), the laser diodes LD are not affected by oscillation delay or relaxation oscillation.

In the description above, the on state (lighted state) with a logical value "1" propagates in numerical order, and then in the middle of this process, the order of the propagation is reversed. Alternatively, control may be performed so that propagation in the alignment direction (numerical order) and propagation in the reversed direction (reversed numerical order) are alternately repeated. When emission from a particular laser diode LD is continued and wavelength thereof varied due to a change in temperature or the like, that laser diode LD can be switched to another laser diode LD. In other words, compared to the case in which a laser diode LD to be lighted is selected by performing transfer from the first number after transfer is conducted all the way to the last number, the laser diode LD to be lighted can be selected quickly.

The light-emitting component C according to the second exemplary embodiment can be produced as with the light-emitting component C of the first exemplary embodiment. Thus, the description therefor is omitted.

Third Exemplary Embodiment

According to the light-emitting component C of the first exemplary embodiment and the light-emitting component C of the second exemplary embodiment, an on state with a logical value "0" is provided before the laser diode LD assumes the on state (lighted state) with a logical value "1". As a result, the laser diodes LD are not affected by oscillation delay or relaxation oscillation.

In a light-emitting component C of a third exemplary embodiment, the laser diodes LD are maintained in an on state with a logical value "0" at all times so that the laser diodes are not affected by oscillation delay or relaxation oscillation when they transition to the on state with a logical value "1".

Light-Emitting Component C

Figure 13:
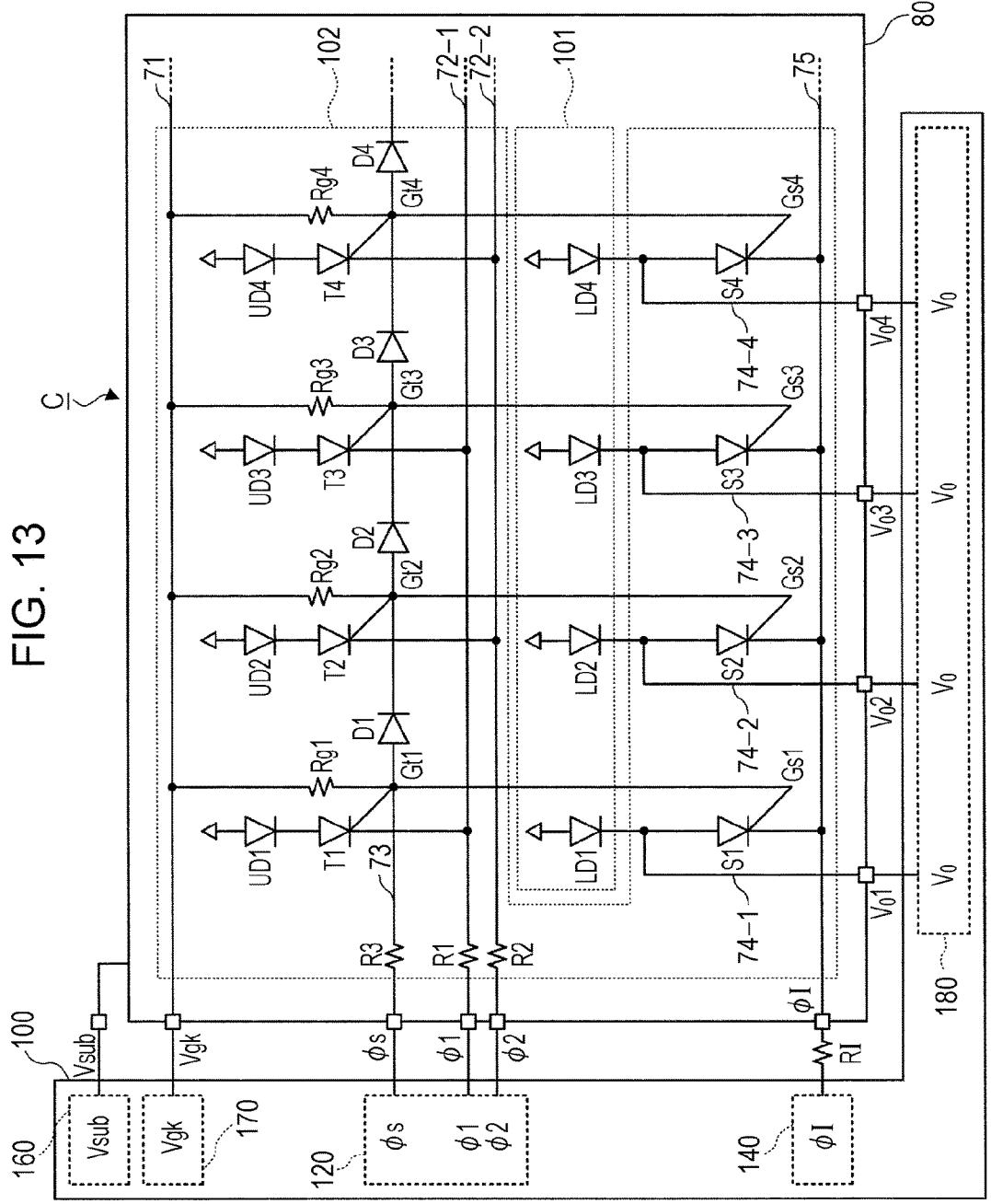
FIG. 13 is an equivalent circuit diagram illustrating a circuit configuration of a light-emitting component in which a self-scanning light-emitting element array (SLED) is mounted, and a signal generation circuit according to a third exemplary embodiment.

FIG. 13 is an equivalent circuit diagram illustrating a circuit configuration of the light-emitting component C in which a self-scanning light-emitting element array (SLED) is mounted, and a signal generation circuit 100 according to the third exemplary embodiment.

As with the light-emitting components C of the first and second exemplary embodiments, the light-emitting component C is configured as an integrated circuit chip that includes a substrate 80 formed of GaAs or the like and compound semiconductor layers of GaAs, GaAlAs, AlAs, and the like monolithically (epitaxially) stacked on the substrate 80.

In the first exemplary embodiment, the laser diodes LD are grouped into a group of odd-numbered laser diodes LD and a group of even-numbered laser diodes LD, and driven alternately so as to create an on state with a logical value "0" before an on state (lighted state) with a logical value "1". However, in the third exemplary embodiment, the laser diodes LD are maintained in the on state with a logical value "0" at all times; therefore, there is no need to divide the laser diodes LD into a group of odd-numbered laser diodes LD and a group of even-numbered laser diodes LD as in the first exemplary embedment. In other words, the light-emitting component C of the third exemplary embodiment may be any one of the group of odd-numbered laser diodes LD and the group of even-numbered laser diodes LD in the first exemplary embodiment. Thus, the structure of the light-emitting component C is simple compared to the first exemplary embodiment.

The circuit configuration of the light-emitting component C illustrated in FIG. 13 corresponds to the group of odd-numbered laser diodes LD in the circuit configuration of the light-emitting component C of the first exemplary embodiment illustrated in FIG. 1. The laser diodes LD, control thyristors S, transfer thyristors T, and other parts are renumbered. The detailed descriptions therefor are thus omitted.

Figure 14:
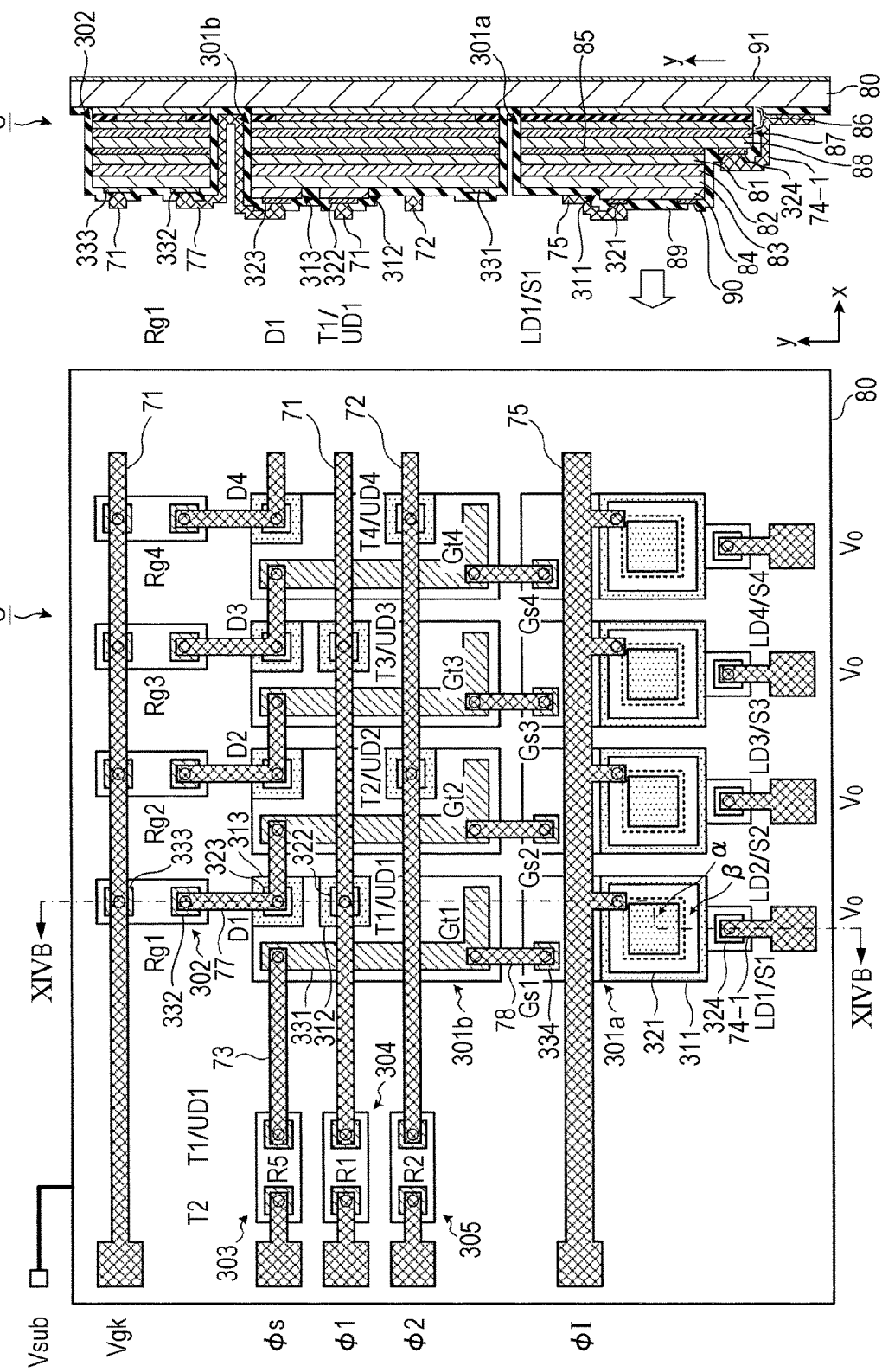
FIGS. 14A and 14B are, respectively, a planar layout diagram of the light-emitting component according to the third exemplary embodiment and a cross-sectional view taken along line XIVB-XIVB in FIG. 14A.
Figure 15:
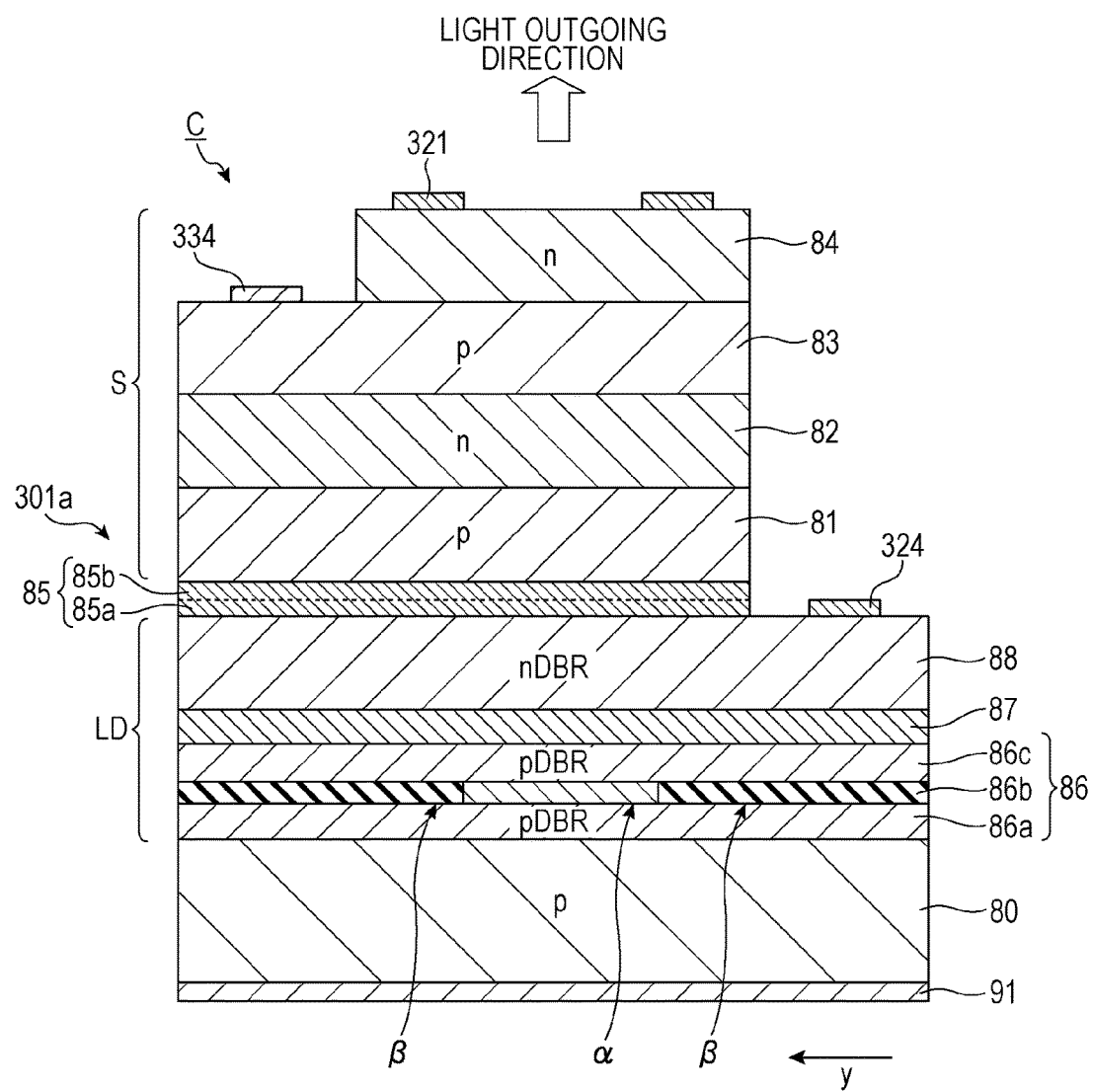
FIG. 15 is an enlarged cross-sectional view of an island of the light-emitting component according to the third exemplary embodiment, in which a control thyristor S and a laser diode LD are stacked.

As illustrated in FIGS. 14B and 15 described below, unlike the light-emitting component C of the first exemplary embodiment, a control thyristor S is stacked on a laser diode LD. Lower diodes UD1, UD2, UD3, . . . (when individual lower diodes are not distinguished, they are referred to as lower diodes UD) are respectively disposed under the transfer thyristors T1, T2, T3 . . . . In other words, a lower diode UD and a transfer thyristor T are electrically connected in series.

A light-emitting element array that includes the laser diodes LD1, LD2, LD3, . . . constitutes the light-emitting unit 101. The control thyristors S1, S2, S3, . . . , the transfer thyristors T1, T2, T3, . . . , the lower diodes UD1, UD2, UD3, . . . , the power supply wire resistors Rg1, Rg2, Rg3, . . . , the coupling diodes D1, D2, D3, . . . , the current-limiting resistors R1 to R3, the transfer signal wires 72-1 and 72-2, the start signal wire 73, the lighting signal wire 75, etc., constitute the setting unit 102.

Signal Generation Circuit 100

The signal generation circuit 100 is described next.

The signal generation circuit 100 corresponds to an odd-numbered laser diode LD portion of the signal generation circuit 100 of the light-emitting component C of the first exemplary embodiment illustrated in FIG. 1. Thus the detailed description therefor is omitted.

However, the signal generation circuit 100 includes a bias voltage supplying unit 180 that supplies a bias voltage signal $V_0$.

Electrical Connections of Elements in Light-Emitting Component C

Next, electrical connections of the elements in the light-emitting component C are described.

The anode of the laser diode LD and the anode of the lower diode UD are each connected to the substrate 80 of the light-emitting component C (anode common).

The reference potential Vsub is applied from the reference potential supplying unit 160 to these anodes via a rear electrode 91 (refer to FIG. 14B), which serves as a Vsub terminal disposed on the rear surface of the substrate 80.

This connection is a configuration when a p-type substrate 80 is used. The corresponding description in the first exemplary embodiment applies to the cases where other substrates are used.

The cathode of the laser diode LD is connected to the anode of the control thyristor S of the same number.

The gate Gs of the control thyristor S is connected to the gate Gt of the transfer thyristor T of the same number.

The cathode of the lower diode UD is connected to the anode of the transfer thyristor T of the same number.

Along the row of the transfer thyristors T, the cathodes of the odd-numbered transfer thyristors T1, T3, . . . are connected to the transfer signal wire 72-1. The transfer signal wires 72-1 is connected to the ϕ1 terminal via the current-limiting resistor R1. The transfer signal ϕ1 is transmitted to the ϕ1 terminal from a transfer signal generation unit 120. The cathodes of the even-numbered transfer thyristors T2, T4, . . . are connected to the transfer signal wire 72-2. The transfer signal wire 72-2 is connected to the ϕ2 terminal via the current-limiting resistor R2. The transfer signal ϕ2 is transmitted to the ϕ2 terminal from the transfer signal generation unit 120.

The gate Gt of the transfer thyristor T is connected to the anode of the coupling diode D of the same number. The cathode of the coupling diode D is connected to the gate Gt of the transfer thyristor T of the next number.

The gate Gt1 is connected to the ϕs terminal via the current-limiting resistor R3. The start signal ϕs is transmitted to the ϕs terminal from the transfer signal generation unit 120.

The gate Gt of the transfer thyristor T is connected to a power supply wire 71 via the power supply wire resistor Rg of the same number. The power supply wire 71 is connected to the Vgk terminal. The power supply potential Vgk is supplied to the Vgk terminal from a power supply potential supplying unit 170.

The cathode of the control thyristor S is connected to the ϕI terminal via the lighting signal wire 75. The lighting signal ϕI is supplied to the ϕI terminal from the lighting signal generation unit 140 via the current-limiting resistor RI disposed outside the light-emitting component C.

Alternatively, the current-limiting resistor RI may be disposed inside the light-emitting component C.

The connecting point of the cathode of the laser diode LD and the anode of the control thyristor S is connected to a $V_O$ terminal ($V_O$1 terminal, $V_O$2 terminal, $V_O$3 terminal, . . . ) via a bias voltage wire 74 (bias voltage wire 74-1, 74-2, 74-3, . . . ). A bias voltage signal $V_O$ is supplied to the $V_O$ terminal from the bias voltage supplying unit 180.

Planar Layout and Cross-Sectional Structure of Light-Emitting Component C

FIGS. 14A and 14B are, respectively, a planar layout and a cross-sectional view of the light-emitting component C according to the third exemplary embodiment. FIG. 14B is a cross-sectional view taken along line XIVB-XIVB in FIG. 14A.

The light-emitting component C of the third exemplary embodiment includes, as described above, the group of odd-numbered laser diodes LD of the light-emitting component C of the first exemplary embodiment. Thus, parts that are identical to those of the light-emitting component C of the first exemplary embodiment illustrated in FIGS. 2A and 2B are represented by the same reference symbols, and the descriptions therefor are omitted.

In the third exemplary embodiment, a control thyristor S is stacked on a laser diode LD. Thus, as illustrated in FIG. 14B, the p-anode layer 86, the light-emitting layer 87, the n-cathode layer 88, the tunnel junction layer 85, the p-anode layer 81, the n-gate layer 82, the p-gate layer 83, and the n-cathode layer 84 are stacked in that order on the substrate 80. The transfer thyristor T on the lower diode UD is also stacked in the same manner.

The p-anode layer 86 and the n-cathode layer 88 are, as illustrated in FIG. 15 described below, DBR layers. Thus, the p-anode layer 86 and the n-cathode layer 88 may be referred to as the p-(DBR) anode layer 86 and the n-(DBR) cathode layer 88.

As illustrated in FIG. 15 described below, the p-(DBR) anode layer 86 includes the current confining layer 86b. In other words, the p-(DBR) anode layer 86 includes a lower p-(DBR) anode layer 86a, the current confining layer 86b, and an upper p-(DBR) anode layer 86c stacked in that order. The lower p-(DBR) anode layer 86a and the upper p-(DBR) anode layer 86c are configured to be DBR layers.

In other words, the laser diode LD of the light-emitting component C of the third exemplary embodiment is a vertical cavity surface emitting laser (VCSEL) similar to that illustrated in FIG. 10.

In FIG. 14B, a light-emitting window protection layer 89 is disposed on the surface from which light goes out.

The p-(DBR) anode layer 86, the light-emitting layer 87, and the n-(DBR) cathode layer 88 constitute the laser diode LD. The p-anode layer 81, the n-gate layer 82, the p-gate layer 83, and the n-cathode layer 84 constitute the control thyristor S, the transfer thyristor T, the power supply wire resistor Rg, and the current-limiting resistors R1 to R3.

In the third exemplary embodiment, the island 301 in the first exemplary embodiment is divided into two islands, 301a and 301b. According to this structure, the current confining layer 86b that extends also from the island 301b-side side surface is formed in the island 301a so that the current confining layer 86b surrounds the center portion of the laser diode LD.

In the island 301a, an n-ohmic electrode 324 formed on the n-(DBR) cathode layer 88 exposed by removing the n-cathode layer 84, the p-gate layer 83, the n-gate layer 82, the p-anode layer 81, and the tunnel junction layer 85 is connected to the bias voltage wire 74. The same applies to other islands similar to the island 301a.

In the island 301a, a p-ohmic electrode 334 disposed on the p-gate layer 83 exposed by removing the n-cathode layer 84 is connected to the p-ohmic electrode 331 in the island 301b via a connecting wire 78.

FIG. 15 is an enlarged cross-sectional view of the island 301a of the light-emitting component C of the third exemplary embodiment, in which the control thyristor S and the laser diode LD are stacked. Unlike in FIG. 14B, the p-ohmic electrode 334 is illustrated on the left side and the n-ohmic electrode 324 is illustrated on the right side in FIG. 15.

As described above, the laser diode LD is a vertical cavity surface emitting laser (VCSEL), and light goes out in a direction perpendicular to the light-emitting layer 87. Thus, the semiconductor materials that constitute the p-anode layer 81, the n-gate layer 82, the p-gate layer 83, the n-cathode layer 84, and the tunnel junction layer 85 of the control thyristor S are to have small absorption (transparency) for light emitted from the laser diode LD.

Light emitted from the lower diode UD having the same structure is not utilized. Thus, the area of the cathode (region 312 or the like) of the transfer thyristor T may be decreased or the cathode may be covered with an n-ohmic electrode (for example, n-ohmic electrode 322).

Operation of Light-Emitting Component C

Figure 16:
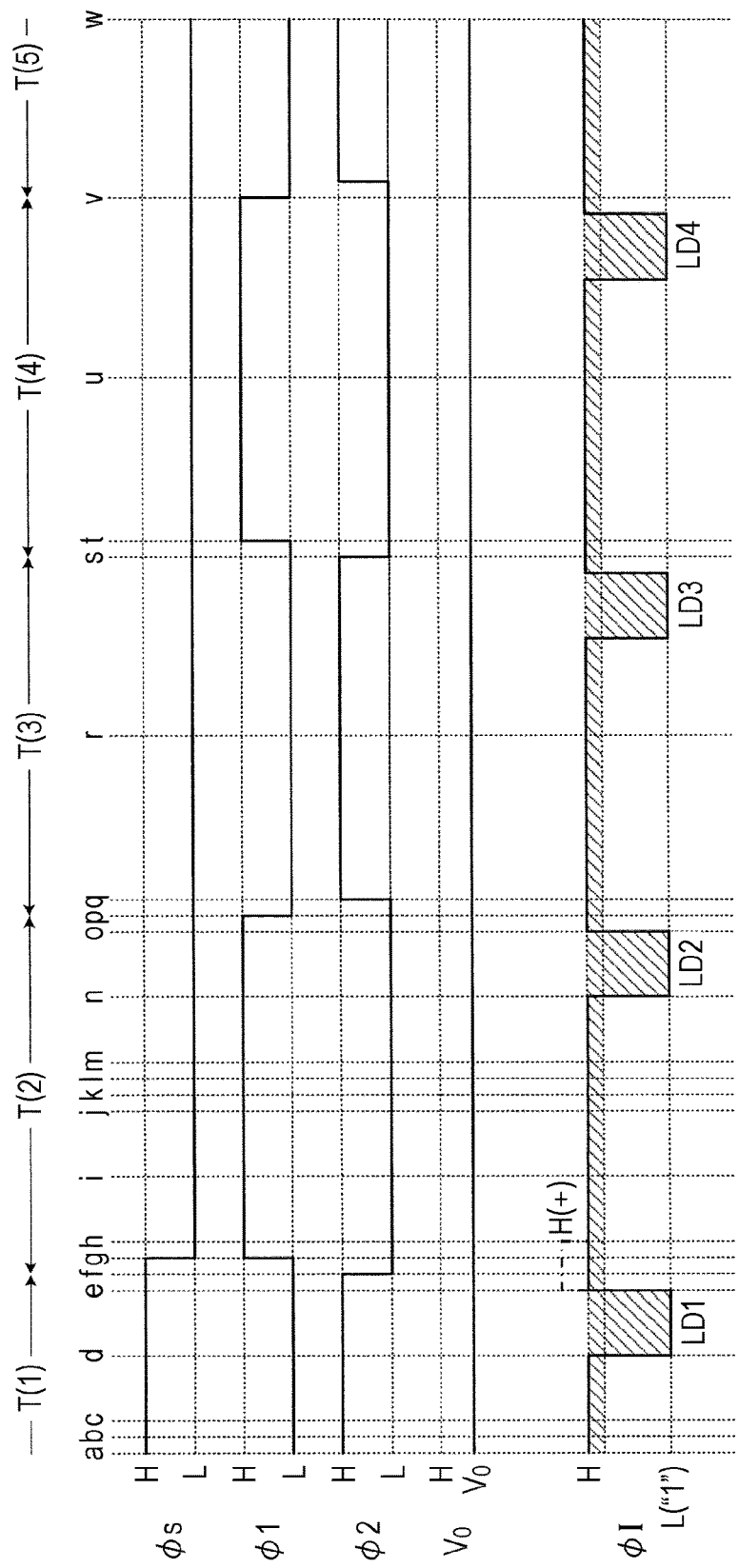
FIG. 16 is a timing chart illustrating operation of the light-emitting component according to the third exemplary embodiment.

FIG. 16 is a timing chart illustrating operation of the light-emitting component C according to the third exemplary embodiment. FIG. 16 illustrates a portion of the timing chart illustrated in FIG. 7, that relates to the odd-numbered laser diodes LD. In other words, the portion related to the even-numbered laser diodes LD is deleted from the timing chart of FIG. 7, and the remaining laser diodes LD are renumbered. Thus, the time a to the time w are the same as those of FIG. 7.

The lighting signal φI is a signal that has a potential of "H" and "L("1")". In other words, the lighting signal φI does not have to have "L("0")".

In FIG. 16 also, the on states (on state with a logical value "0" and on state with a logical value "1") are indicated by diagonal lines. The on state with a logical value "0" is created in all laser diodes LD at all times.

The bias voltage signal $V_0$ is constantly maintained at the potential of $V_0$ (potential $V_0$). The potential $V_0$ is a potential that maintains the laser diode LD in an on state with a logical value "0". It is, for example, 1.5 V.

Thus, when the bias voltage signal $V_0$ is the potential $V_0$, all of the laser diodes LD are in an on state with a logical value "0".

As described in the first exemplary embodiment, the transfer thyristors T sequentially assume the on state by the start signal φs and the transfer signals φ1 and φ2, and the control thyristors S having the gates Gs connected to the gates Gt of the transfer thyristors T assume a state ready to transition to an on state.

At that timing, (for example, the time d), when the lighting signal φI changes to a potential that causes the laser diode LD to assume an on state with a logical value "1", namely, "L("1")", the laser diode LD (in this case, the laser diode LD1) transitions to the on state (lighted state) with a logical value "1".

In the third exemplary embodiment, all of the laser diodes LD maintain the on state with a logical value "0". Thus, even when the laser diodes LD transition to the on state (lighted state) with a logical value "1", occurrence of oscillation delay and relaxation oscillation is suppressed.

The lighting signal φI assumes "H" (0 V) and "L("1")". Alternatively, in order to rapidly withdraw charges in the gate layers 82 and 83 of the control thyristor S and to assuredly and quickly cause the control thyristor S to assume the off state, a + side potential ("H(+)") may be used instead of "H" (0 V).

For example, the laser diode LD2 may be in the on state (lighted state) with a logical value "1" for a period from the time g to the time p. The laser diode LD3 may be in the on state (lighted state) with a logical value "1" for a period from the time q to the time s. The switching period of the laser diode LD2 and the laser diode LD3 is the period between the time p to the time q.

Although not described in detail here, "L" of the transfer signals φ1 and φ2 and the start signal φs, the power supply potential Vga, etc., is set so that the voltage divided among the transfer thyristors T is enough to enable operation of the transfer thyristors T since the transfer thyristors T are stacked with and connected in series with the lower diodes UD.

In other words, because the laser diodes LD maintain the on state with a logical value "0", oscillation delay and relaxation oscillation rarely occur, and the switching period for the laser diodes LD is shortened.

As described in the second exemplary embodiment, control may be performed so that operation in the direction of alignment (numerical order) and operation in the reversed direction (reversed numerical order) are repeated alternately.

Fourth Exemplary Embodiment

According to the light-emitting component C of the third exemplary embodiment, a bias voltage that causes the laser diode LD to assume the on state with a logical value "0" is supplied to the connecting point of the laser diode LD and the control thyristor S.

In the light-emitting component C according to the fourth exemplary embodiment, the laser diode LD is caused to be in an on state with a logical value "0" and at the same time the laser diode LD is suppressed from being reverse biased.

Figure 17:
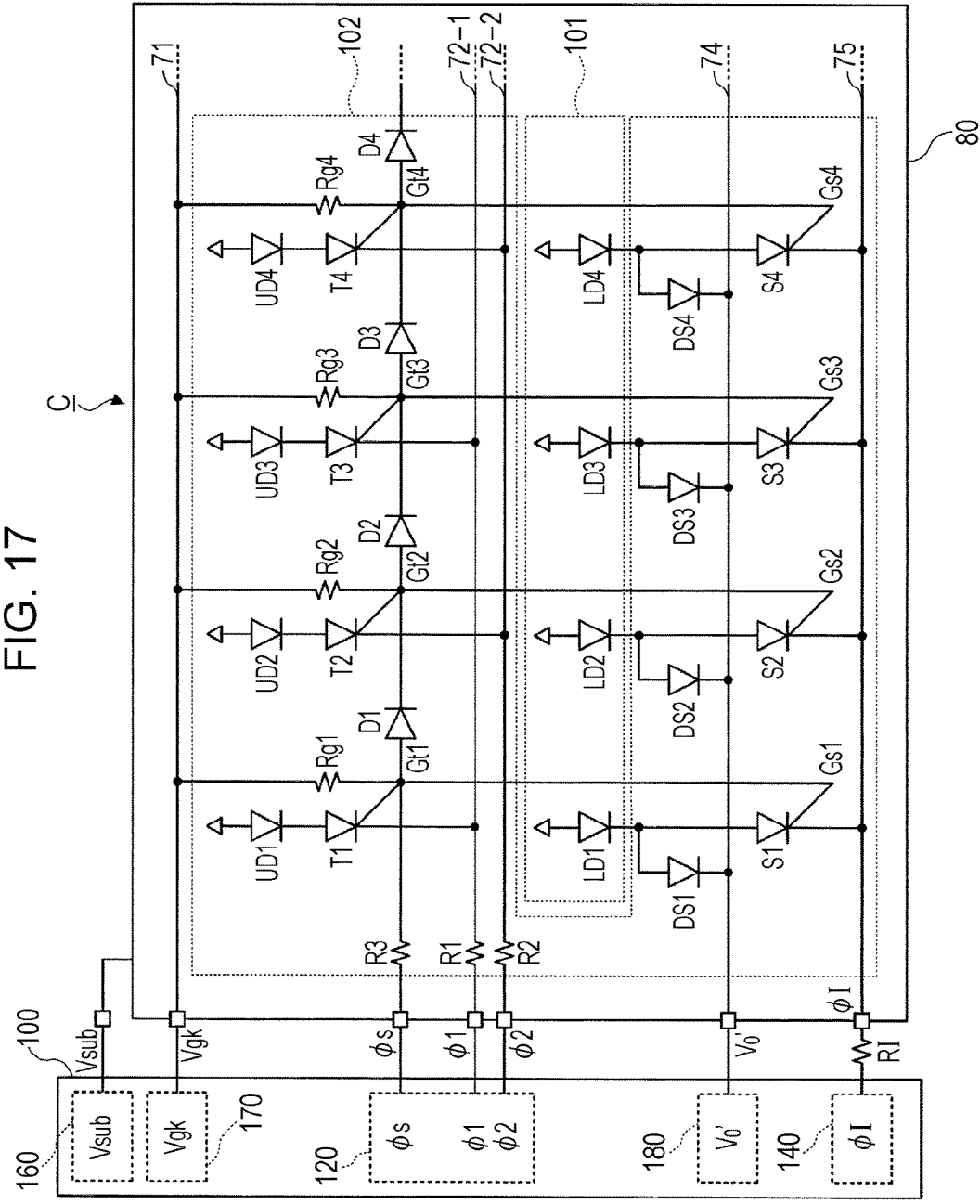
FIG. 17 is an equivalent circuit diagram illustrating a circuit configuration of a light-emitting component in which a self-scanning light-emitting element array (SLED) is mounted, and a signal generation circuit according to a fourth exemplary embodiment.

FIG. 17 is an equivalent circuit diagram illustrating a circuit configuration of a light-emitting component C in which a self-scanning light-emitting element array (SLED) is mounted, and a signal generation circuit 100 according to the fourth exemplary embodiment.

To the circuit configuration of the light-emitting component C of the third exemplary embodiment illustrated in FIG. 13, reverse flow preventing diodes DS1, DS2, DS3, . . . (when these diodes are not individually distinguished, they are referred to as the reverse flow preventing diodes DS), which are examples of the reverse flow preventing element, are added. The direction in which the reverse flow preventing diodes DS are connected is the direction in which the current flows in the laser diodes LD with respect to the connections between the reverse flow preventing diodes DS and the laser diodes LD.

The series connections between the laser diodes LD and the reverse flow preventing diodes DS are connected to the $V_0'$ terminal via the bias voltage wire 74. A bias voltage signal $V_0'$ having the potential of $V_0'$ (potential $V_0'$) is constantly supplied to the $V_0'$ terminal from the bias voltage supplying unit 180. The potential $V_0'$ is a potential that forward-biases the laser diodes LDs and the reverse flow preventing diodes DS and that maintains the laser diodes LD to be in the on state with a logical value "0". The potential $V_0'$ is, for example, 3 V.

In FIG. 13, a separate power supply is provided for each laser diode LD to provide a bias voltage $V_0$ and to cause a current to flow in each laser diode LD. However, in the light-emitting component C of the fourth exemplary embodiment illustrated in FIG. 17, the reverse flow preventing diodes DS are provided and thus laser diodes LD do not affect each other even when the laser diodes LD are in the on state with a logical value "1".

Thus, because of the reverse flow preventing diodes DS, the laser diodes LD are suppressed from being disturbed by external factors, etc.

Here also, the laser diodes LD maintain the on state with a logical value "0". Thus, oscillation delay and relaxation oscillation rarely occur and the laser diodes LD switching period is shortened.

The light-emitting element array that includes the laser diodes LD1, LD2, LD3, . . . , and the control thyristors S1, S2, S3, . . . and the like constitute the light-emitting unit 101. The transfer thyristors T1, T2, T3, . . . , the power supply wire resistors Rg1, Rg2, Rg3, . . . , the coupling diodes D1, D2, D3, . . . , the reverse flow preventing diodes DS1, DS2, DS3, . . . , the current-limiting resistors R1 to R3, the transfer signal wires 72-1 and 72-2, the bias voltage wire 74, the lighting signal wire 75, etc., constitute a setting unit 102.

Figure 18:
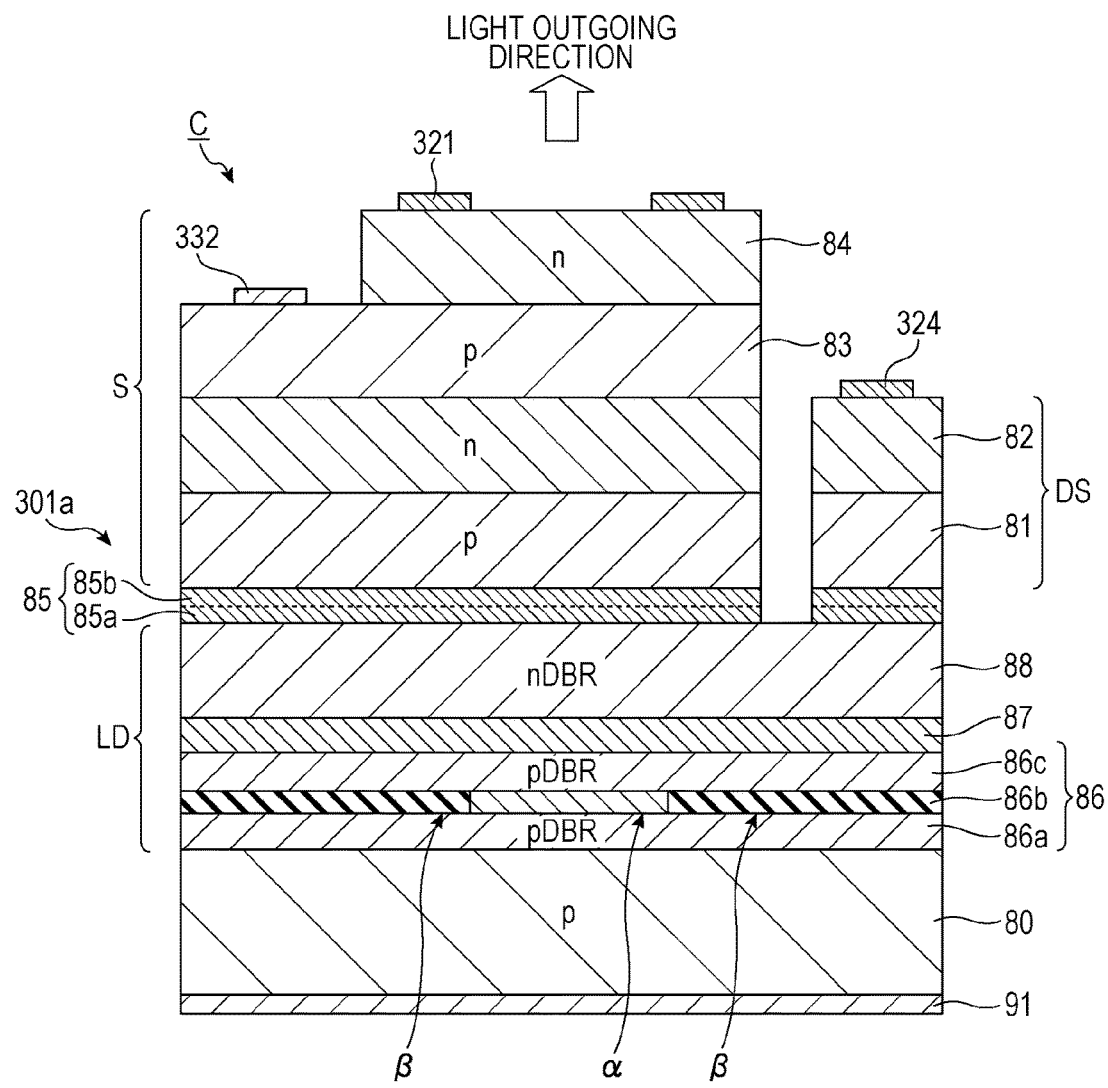
FIG. 18 is an enlarged cross-sectional view of an island of the light-emitting component according to the fourth exemplary embodiment, in which a control thyristor S and a laser diode LD are stacked.

FIG. 18 is an enlarged cross-sectional view of the island 301a in which the control thyristor S and the laser diode LD are stacked in the light-emitting component C according to the fourth exemplary embodiment. The reverse flow preventing diode DS is formed of a junction between the p-anode layer 81 and the n-gate layer 82 of the control thyristor S on the tunnel junction layer 85.

Thus, the light-emitting component C of the fourth exemplary embodiment is produced and operates as with the light-emitting component C of the third exemplary embodiment.

As described in the second exemplary embodiment, control may be performed to alternately repeat the operation in the alignment direction (numerical order) and the operation in the reversed direction (reversed numerical order).

Fifth Exemplary Embodiment

In the first to fourth exemplary embodiments, the lighting signal ϕI is connected to and shared by multiple laser diodes LD. According to this structure, a load is imposed on the lighting signal ϕI when the laser diodes LD are in an on state/off state. Thus, the laser diodes LD may not be switched at high speeds even if the lighting signal ϕI is switched at high speeds.

Thus, in the fifth exemplary embodiment, the lighting signals $ϕI_1$, $ϕI_2$, $ϕI_3$, . . . (when lighting signals are not individually distinguished, they are referred to as lighting signals ϕI) are provided for the respective laser diodes LD.

Figure 19:
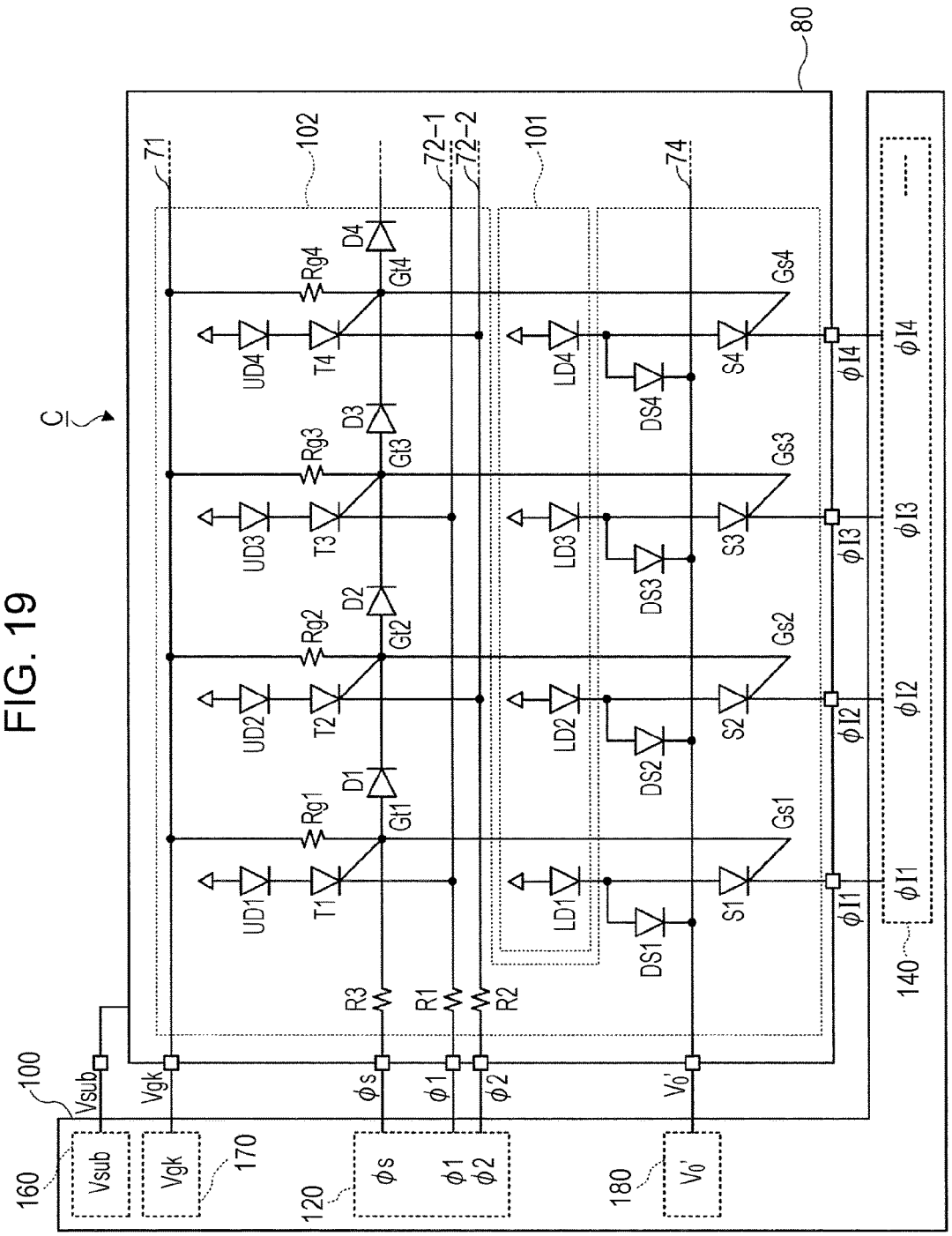
FIG. 19 is an equivalent circuit diagram illustrating a circuit configuration of a light-emitting component in which a self-scanning light-emitting element array (SLED) is mounted, and a signal generation circuit according to a fifth exemplary embodiment.

FIG. 19 is an equivalent circuit diagram illustrating the circuit configuration of the light-emitting component C in which a self-scanning light-emitting element array (SLED) is mounted, and a signal generation circuit 100 according to the fifth exemplary embodiment.

The lighting signal generation unit 140 supplies a lighting signal ϕI for each laser diode LD.

As in the fourth exemplary embodiment, the reverse flow preventing diodes DS are provided but are optional.

Figure 20:
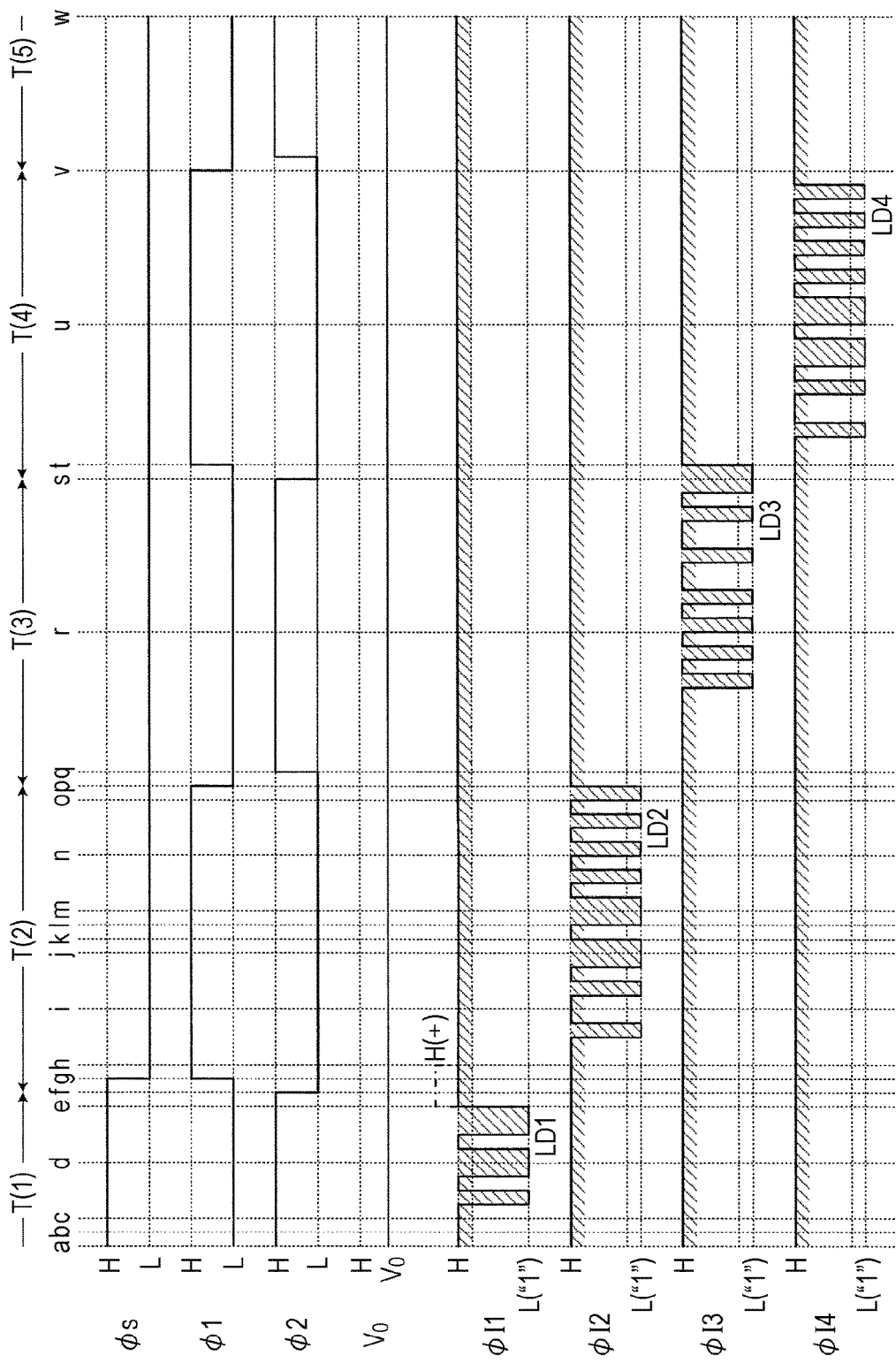
FIG. 20 is a timing chart illustrating operation of the light-emitting component according to the fifth exemplary embodiment.

FIG. 20 is a timing chart illustrating operation of the light-emitting component C of the fifth exemplary embodiment. FIG. 20 is obtained by dividing the lighting signal ϕI in the timing chart in FIG. 16 for each of the laser diodes LD. The on states (the on state with a logical value "0" and the on state with a logical value "1") of the laser diodes LD are indicated by diagonal lines. The on state with a logical value "0" is created at all times in all of the laser diodes LD.

Since the lighting signal ϕI is divided for each of the laser diodes LD, the load on the lighting signal ϕI is reduced and high-speed operation is enabled. For each of the laser diodes LD, on/off can be switched during the period in which light emission is possible (for example, a period from the time g to the time p for the laser diode LD2).

According to the timing chart, on/off is conducted between "H" (0 V) and "L("1")". Alternatively, "H" (0 V) may be changed to a voltage L ("thyristor hold") that does not turn the thyristor off, and the voltage shift may be repeated between the voltage L ("thyristor hold") and "L("1")". In such a case, high-speed operation is enabled without limitations from the on/off switching response speed of the thyristors.

As described in the second exemplary embodiment, control may be performed so that operation in the alignment direction (numerical order) and operation in the reversed direction (reversed numerical order) are alternately repeated.

Sixth Exemplary Embodiment

In the exemplary embodiments described thus far, the light-emitting element (laser diode LD) and the control thyristor S are stacked. With this structure, the light-emitting properties of the light-emitting elements of the light-emitting unit 101 and the transfer properties determined by the control thyristors S, the transfer thyristors T, and the like in the setting unit 102 are independently (individually) set.

Alternatively, in the light-emitting component C of the first exemplary embodiment, the control thyristor S may be configured as a laser thyristor L. For example, the p-anode layer 81 and the n-cathode layer 84 may be used as cladding layers to obtain laser oscillation. In this manner, there is no need to stack the tunnel junction layer 85, the p-(cladding) anode layer 86, the light-emitting layer 87, and the n-(cladding) cathode layer 88 in FIGS. 2 and 8A. Thus, the production process of the light-emitting component C is simplified.

Figure 21:
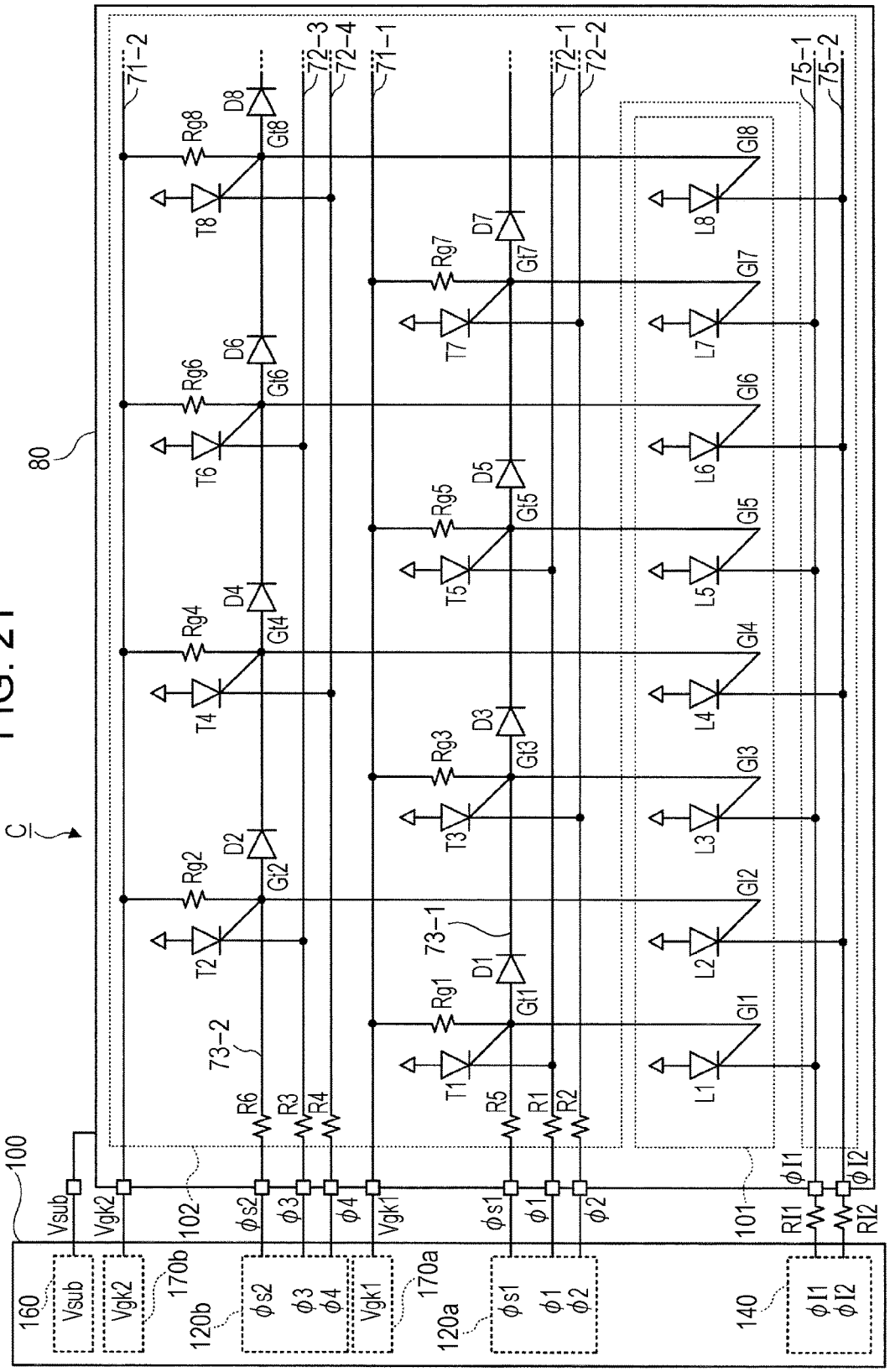
FIG. 21 is an equivalent circuit diagram illustrating a circuit configuration of a light-emitting component in which a self-scanning light-emitting element array (SLED) is mounted, and a signal generation circuit according to a sixth exemplary embodiment.

FIG. 21 is an equivalent circuit diagram illustrating the circuit configuration of the light-emitting component C in which a self-scanning light-emitting element array (SLED) is mounted, and a signal generation circuit 100 according to a sixth exemplary embodiment.

In FIG. 21, the laser diodes LD1, LD2, LD3, . . . illustrated in FIG. 1 are not provided, and the control thyristors S1, S2, S3, . . . are replaced by laser thyristors L1, L2, L3, . . . . The gates Gs1, Gs2, Gs3, . . . of the control thyristors S1, S2, S3, . . . are replaced by the gates G11, G12, G13, . . . of the laser thyristors L1, L2, L3, . . . .

The laser thyristors L are another example of the laser element.

Other structures are identical to those of the light-emitting component C according to the first exemplary embodiment, and descriptions therefor are omitted.

Seventh Exemplary Embodiment

A light-emitting component C according to a seventh exemplary embodiment is the same as the light-emitting component C according to the sixth exemplary embodiment but further includes a memory terminal φm.

Figure 22:
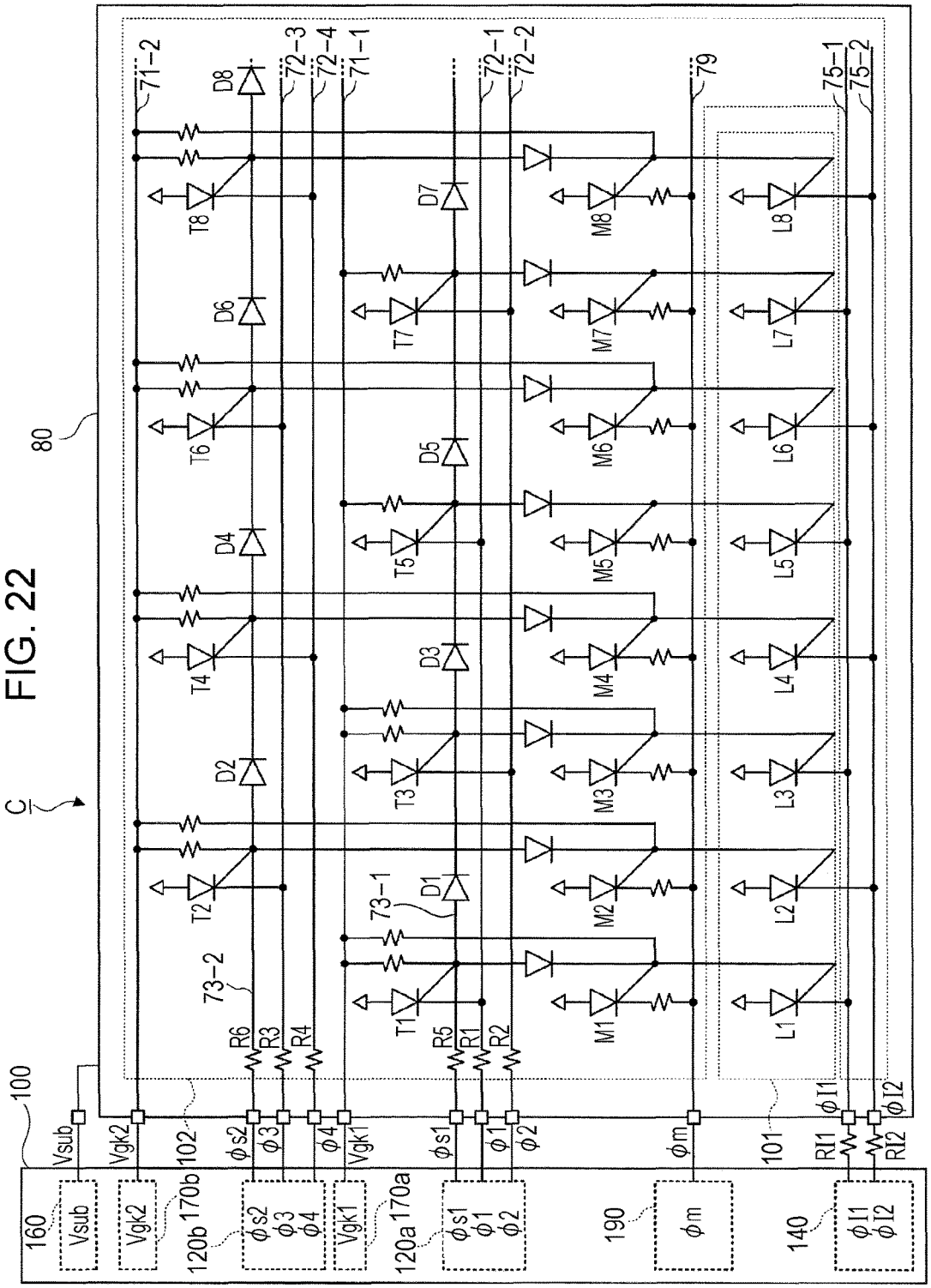
FIG. 22 is an equivalent circuit diagram illustrating a circuit configuration of a light-emitting component in which a self-scanning light-emitting element array (SLED) is mounted, and a signal generation circuit according to a seventh exemplary embodiment.

FIG. 22 is an equivalent circuit diagram illustrating the circuit configuration of the light-emitting component C in which a self-scanning light-emitting element array (SLED) is mounted, and a signal generation circuit 100 according to a seventh exemplary embodiment.

In the light-emitting component C, memory thyristors M1, M2, M3, . . . (when memory thyristors are not individually distinguished, they are referred to as memory thyristors M) that belong to the setting unit 102 are respectively inserted between the transfer thyristors T1, T2, T3, . . . and the laser thyristors L1, L2, L3, . . . . Reference symbols for diodes and the resistors are omitted.

The signal generation circuit 100 further includes a memory signal supplying unit 190 that supplies a memory signal φm.

The memory thyristors M are set to maintain an on state when they assume an on state by the memory signal φm supplied through a memory signal wire 79. After a predetermined number of the memory thyristors M are driven, the lighting signal transitions from "H" (0 V) to "L" (for example, −3.3 V) so as to simultaneously light the laser thyristors connected to the memory thyristors M in the on state.

This light-emitting component C also is rarely affected by oscillation delay and relaxation oscillation.

In the description above, a self-scanning light-emitting element array (SLED) that includes a light-emitting unit 101 including laser diodes LD and a setting unit 102 including thyristors (transfer thyristors T) is described. The SLED may include, in addition to the parts described above, other components such as thyristors for control, diodes, and resistors.

The transfer thyristors T are connected to each other with coupling diodes D; alternatively, components that can convey changes in potential, such as a resistor, may be used to connect the thyristors.

In the description above, the laser diodes LD, the vertical cavity surface emitting lasers (VCSEL), and the laser thyristors L are described as the light-emitting elements. Alternatively, other laser elements such as laser transistors may be used.

The structures of the transfer thyristors T the control thyristors S of each exemplary embodiment may have any structure instead of the pnpn four-layer structure as long as the functions of the transfer thyristor T and the control thyristor S are fulfilled. Examples of the structure include a pinin structure, a pipin structure, an npip structure, and a pnin structure that have thyristor properties. In such a case, one of the i layer, the n layer, and the i layer sandwiched between p and n in the pinin structure, or one of the n layer and i layer sandwiched between p and n in the pnin structure may serve as a gate layer, and the n-ohmic electrode on the gate layer may serve as the terminal of the gate Gt (gate Gs). Alternatively, one of the i layer, the p layer, and the i layer sandwiched between n and p in the nipip structure, or one of the p layer and the i layer sandwiched between n and p in the npip structure may serve as a gate layer, and the p-ohmic electrode disposed on the gate layer may serve as the terminal of the gate Gt (gate Gs).

The light-emitting component C in which a self-scanning light-emitting element array (SLED) is mounted according to each of the exemplary embodiments may be used in an image forming apparatus or the like as the light source for exposing a photoreceptor preliminarily charged to a predetermined potential.

In the descriptions above, a p-type GaAs substrate is used as the substrate 80. Examples of the semiconductor layers (semiconductor stack formed in the semiconductor stack forming step illustrated in FIG. 8A) in cases where other substrates are used are described below.

First, an example of the semiconductor stack when a GaN substrate is used is as follows.

The p-anode layer 81 is formed of p-type $A_{0.9}$GaN with an impurity concentration of $1\times10^{18}/cm^3$. The Al content may be changed within the range of 0 to 1.

The n-gate layer 82 is formed of n-type $A_{0.9}$GaN with an impurity concentration of $1\times10^{17}/cm^3$. The Al content may be changed within the range of 0 to 1.

The p-gate layer 83 is formed of p-type $A_{0.9}$GaN with an impurity concentration of $1\times10^{17}/cm^3$. The Al content may be changed within the range of 0 to 1.

The n-cathode layer 84 is formed of n-type $A_{0.9}$GaN with an impurity concentration of $1\times10^{18}/cm^3$. The Al content may be changed within the range of 0 to 1.

The tunnel junction layer 85 is formed of a junction between the $n^{++}$-layer 85a with a high n-type impurity concentration and the $p^{++}$-layer 85b with a high p-type impurity concentration (refer to FIG. 8B). The impurity concentrations of the $n^{++}$-layer 85a and the $p^{++}$-layer 85b are as high as $1\times10^{20}/cm^3$, for example. The impurity concentration of the junction is typically on the order of $10^{17}/cm^3$ to $10^{18}/cm^3$. Examples of the combination of the $n^{++}$-layer 85a and the $p^{++}$-layer 85b are as follows (the combination is noted as $n^{++}$-layer 85a/$p^{++}$-layer 85b): $n^{++}$GaN/$p^{++}$GaN, $n^{++}$GaInN/$p^{++}$GaInN, and $n^{++}$AlGaN/$p^{++}$AlGaN. The combination may be shuffled.

The p-(cladding) anode layer 86 is formed of the lower p-(cladding) anode layer 86a, the current confining layer 86b, and the upper p-(cladding) anode layer 86c that are stacked in that order (refer to FIG. 8C).

The lower p-(cladding) anode layer 86a and the upper p-(cladding) anode layer 86c are, for example, formed of p-type $A_{0.9}$GaN with an impurity concentration of $1\times10^{18}/cm^3$. The Al content may be changed within the range of 0 to 1.

Since it is difficult to use an oxidized confining layer as the current confining layer on the GaN substrate, a structure in which a tunnel junction layer or a metallic conducting group III-V compound layer is formed in the current pass portion α, a ridge structure, or an embedded-type n-(cladding) cathode layer 88 structure may be used. It is effective to conduct ion implantation as a method for confining the current.

The light-emitting layer 87 has a quantum well structure in which well layers and barrier layers are alternately stacked. The well layers are, for example, formed of GaN, InGaN, AlGaN, or the like. The barrier layers are, for example, formed of AlGaN, GaN, or the like. The light-emitting layer 87 may be a quantum beam (quantum wire) or a quantum box (quantum dot).

The n-(cladding) cathode layer 88 is formed of, for example, n-type $A_{0.9}$GaN with an impurity concentration of $1 \times 10^{18}/cm^3$. The Al content may be changed within the range of 0 to 1.

An example of the semiconductor stack when an InP substrate is used is as follows.

The p-anode layer 81 is formed of, for example, p-type InGaAsP with an impurity concentration of $1 \times 10^{18}/cm^3$. The Ga content and the Al content may be changed within the range of 0 to 1.

The n-gate layer 82 is formed of, for example, n-type InGaAsP with an impurity concentration of $1 \times 10^{17}/cm^3$. The Ga content and the Al content may be changed within the range of 0 to 1.

The p-gate layer 83 is formed of, for example, p-type InGaAsP with an impurity concentration of $1 \times 10^{17}/cm^3$. The Ga content and the Al content may be changed within the range of 0 to 1.

The n-cathode layer 84 is formed of, for example, n-type InGaAsP with an impurity concentration of $1 \times 10^{18}/cm^3$. The Ga content and the Al content may be changed within the range of 0 to 1.

The tunnel junction layer 85 is formed of a junction between the n++-layer 85a having a high n-type impurity concentration and the p++-layer 85b having a high p-type impurity concentration (refer to FIG. 8B). The n++-layer 85a and the p++-layer 85b each have an impurity concentration as high as $1 \times 10^{20}/cm^3$, for example. The impurity concentration of a typical junction is on the order of $10^{17}/cm^3$ to $10^{18}/cm^3$. Examples of the combination of the n++-layer 85a and the p++-layer 85b include (the combination is noted as n++-layer 85a/p++-layer 85b) n++InP/p++InP, n++InAsP/p++InAsP, n++InGaAsP/p++InGaAsP, and n++InGaAsPSb/p++InGaAsPSb. The combination may be shuffled.

The p-(cladding) anode layer 86 is obtained by stacking the lower p-(cladding) anode layer 86a, the current confining layer 86b, and the upper p-(cladding) anode layer 86c in that order (refer to FIG. 8C).

The lower p-(cladding) anode layer 86a and the upper p-(cladding) anode layer 86c are, for example, formed of p-type InGaAsP with an impurity concentration of $1 \times 10^{18}/cm^3$. The Ga content and the Al content may be changed within the range of 0 to 1.

Since it is difficult to use an oxidized confining layer as the current confining layer on the InP substrate, a structure in which a tunnel junction layer of a metallic conducting group III-V compound layer is formed in the current pass portion α, a ridge structure, or an embedded-type n-(cladding) cathode layer 88 structure may be used. It is effective to conduct ion implantation as a method for confining the current.

The light-emitting layer 87 has a quantum well structure in which well layers and barrier layers are alternately stacked. The well layers are, for example, formed of InAs, InGaAsP, AlGaInAs, GaInAsPSb, or the like. The barrier layers are, for example, formed of InP, InAsP, InGaAsP, AlGaInAsP, or the like. The light-emitting layer 87 may be a quantum beam (quantum wire) or a quantum box (quantum dot).

The n-(cladding) cathode layer 88 is formed of, for example, n-type InGaAsP with an impurity concentration of $1 \times 10^{18}/cm^3$. The Ga content and the Al content may be changed within the range of 0 to 1.

These semiconductor layers are, for example, deposited by a metal organic chemical vapor deposition (MOCVD), a molecular beam epitaxy (MBE), or the like, and as a result a semiconductor stack is formed.

The exemplary embodiments described above can be used in combination with other exemplary embodiments.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
   a plurality of laser elements, each laser element being set to be in an on state with a logical value "m (m represents an integer of 1 or more)", an on state considered as having a logical value "0", or an off state; and
   a setting unit that sets the laser element to be in a state ready to transition to an on state and sets the laser element in the state ready to transition to the on state to be in the on state considered as having a logical value "0" before a timing of setting the laser element to the on state with a logical value "m".

2. The light-emitting component according to claim 1, wherein:
   the plurality of laser elements are divided into a plurality of groups, and
   the setting unit includes a plurality of transfer pathways that transfer the state ready to transition to the on state for the respective groups so that while the laser elements of a particular group are in the on state with a logical value "m", the laser elements of another group are set to assume the on state with a logical value "0".

3. The light-emitting component according to claim 2, wherein the plurality of transfer pathways in the setting unit perform transfer by switching a direction of transfer between an alignment direction of the laser elements and a direction opposite to the alignment direction.

4. The light-emitting component according to claim 1, wherein the setting unit includes a wire that supplies a bias voltage that causes the plurality of laser elements to maintain the on state with a logical value "0".

5. The light-emitting component according to claim 1, wherein the setting unit includes a wire that includes a reverse flow preventing element and supplies a bias voltage that causes the plurality of laser elements to maintain the on state with a logical value "0".

6. The light-emitting component according to claim 4, wherein the setting unit includes a plurality of wires that supply lighting signals that cause the plurality of laser elements to assume the on state with a logical value "m".

7. The light-emitting component according to claim 5, wherein the setting unit includes a plurality of wires that supply lighting signals that cause the plurality of laser elements to assume the on state with a logical value "m".

8. The light-emitting component according to claim 1, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

9. The light-emitting component according to claim 2, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

10. The light-emitting component according to claim 3, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

11. The light-emitting component according to claim 4, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

12. The light-emitting component according to claim 5, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

13. The light-emitting component according to claim 6, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

14. The light-emitting component according to claim 7, wherein the setting unit includes a plurality of control thyristors respectively stacked on the plurality of laser elements with a tunnel junction layer or a metallic conducting group III-V compound layer therebetween, and the plurality of control thyristors control the laser elements to be in the state ready to transition to an on state when the control thyristors assume an on state.

15. A light-emitting device comprising:
a light-emitting component including
a plurality of laser elements, each laser element being set to be in an on state with a logical value "m (m represents an integer of 1 or more)", an on state considered as having a logical value "0", or an off state, and
a setting unit that sets the laser element to be in a state ready to transition to an on state and sets the laser element in the state ready to transition to the on state to be in the on state considered as having a logical value "0" before a timing of setting the laser element to the on state with a logical value "m"; and
a drive unit that supplies, to the setting unit of the light-emitting component, a transfer signal that causes the state ready to transition to an on state to sequentially transfer in the laser elements, and a lighting signal that sets the laser elements in the on state with a logical value "0" before a timing of setting the laser elements to assume the on state with a logical value "m".

\* \* \* \* \*